(12) United States Patent
Watanabe

(10) Patent No.: US 8,592,884 B2
(45) Date of Patent: *Nov. 26, 2013

(54) SEMICONDUCTOR DEVICE INCLUDING CAPACITOR

(75) Inventor: Kenichi Watanabe, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/426,014

(22) Filed: Mar. 21, 2012

(65) Prior Publication Data

US 2012/0175736 A1 Jul. 12, 2012

Related U.S. Application Data

(62) Division of application No. 12/461,136, filed on Aug. 3, 2009, now Pat. No. 8,227,848, which is a division of application No. 11/339,701, filed on Jan. 26, 2006, now Pat. No. 7,586,143.

(30) Foreign Application Priority Data

Sep. 29, 2005 (JP) ................................. 2005-285223

(51) Int. Cl.
*H01L 27/108* (2006.01)

(52) U.S. Cl.
USPC ........................... 257/303; 257/758; 257/751

(58) Field of Classification Search
USPC ....................................... 257/303, 751, 758
See application file for complete search history.

(56) References Cited

U.S. PATENT DOCUMENTS

| 5,879,985 | A | 3/1999 | Gambino et al. |
| 6,078,492 | A | 6/2000 | Huang et al. |
| 6,124,638 | A * | 9/2000 | Iwasa ............................ 257/751 |
| 6,146,941 | A | 11/2000 | Huang et al. |
| 6,171,970 | B1 * | 1/2001 | Xing et al. .................... 438/706 |

(Continued)

FOREIGN PATENT DOCUMENTS

| EP | 0991117 A2 | 4/2000 |
| EP | 1020905 A1 | 7/2000 |

(Continued)

OTHER PUBLICATIONS

Japanese Office Action (Reason for rejection) dated Dec. 8, 2009, issued in corresponding Japanese Patent Application No. 2005-285223.

(Continued)

*Primary Examiner* — Eugene Lee

(74) *Attorney, Agent, or Firm* — Westerman, Hattori, Daniels & Adrian, LLP

(57) ABSTRACT

A substrate is provided with a first wiring layer 111, an interlayer insulating film 132 on the first wiring layer 111, a hole 112A formed in the interlayer insulating film, a first metal layer 112 covering the hole 112A, a second metal layer 113 formed in the hole 112A, a dielectric insulating film 135 on the first metal layer 112, and second wiring layers 114-116 on the dielectric insulating film 135, wherein the first metal layer 112 constitutes at least part of the lower electrode, an area, facing the lower electrode, of the second wiring layers 114-116 constitutes the upper electrode, and a capacitor 160 is constructed of the lower electrode, the dielectric insulating film 135 and the upper electrode P1.

14 Claims, 67 Drawing Sheets

(56) References Cited

U.S. PATENT DOCUMENTS

| | | | |
|---|---|---|---|
| 6,194,758 B1* | 2/2001 | Tanaka et al. | 257/309 |
| 6,271,084 B1 | 8/2001 | Tu et al. | |
| 6,320,244 B1 | 11/2001 | Alers et al. | |
| 6,436,787 B1 | 8/2002 | Shih et al. | |
| 6,437,387 B2 | 8/2002 | Gutsche | |
| 6,485,988 B2* | 11/2002 | Ma et al. | 438/3 |
| 6,511,912 B1 | 1/2003 | Chopra et al. | |
| 6,531,777 B1 | 3/2003 | Woo et al. | |
| 6,570,203 B2* | 5/2003 | Hikosaka et al. | 257/295 |
| 6,642,564 B2* | 11/2003 | Ogawa et al. | 257/296 |
| 6,673,672 B2* | 1/2004 | Sashida | 438/253 |
| 6,825,129 B2* | 11/2004 | Hong | 438/763 |
| 6,853,051 B2 | 2/2005 | Shioga et al. | |
| 6,903,398 B2 | 6/2005 | Yamamoto | |
| 6,909,134 B2* | 6/2005 | Song et al. | 257/296 |
| 6,919,233 B2 | 7/2005 | Papa Rao et al. | |
| 6,936,878 B2 | 8/2005 | Nakashima et al. | |
| 6,979,881 B2* | 12/2005 | Joo et al. | 257/532 |
| 6,992,347 B2* | 1/2006 | Ema et al. | 257/308 |
| 7,045,071 B2* | 5/2006 | Kweon et al. | 216/13 |
| 7,132,709 B2 | 11/2006 | Nagano et al. | |
| 7,135,732 B2 | 11/2006 | Iwasaki et al. | |
| 7,170,176 B2 | 1/2007 | Ishikawa et al. | |
| 7,198,960 B2 | 4/2007 | Okita | |
| 7,521,357 B2* | 4/2009 | Lee et al. | 438/634 |
| 2002/0053739 A1* | 5/2002 | Honma et al. | 257/758 |
| 2002/0185671 A1 | 12/2002 | Kim | |
| 2003/0062564 A1 | 4/2003 | Kobayashi et al. | |
| 2003/0104704 A1 | 6/2003 | Lee et al. | |
| 2003/0170962 A1 | 9/2003 | Yasuda | |
| 2003/0183862 A1 | 10/2003 | Jin et al. | |
| 2004/0012911 A1 | 1/2004 | Lee et al. | |
| 2004/0075131 A1 | 4/2004 | Ahn et al. | |
| 2004/0102014 A1 | 5/2004 | Ning et al. | |
| 2004/0175883 A1 | 9/2004 | Kim | |
| 2005/0087879 A1 | 4/2005 | Won et al. | |
| 2005/0095842 A1 | 5/2005 | Ishikawa et al. | |
| 2005/0112836 A1 | 5/2005 | Kim et al. | |
| 2005/0145986 A1 | 7/2005 | Akiyama | |
| 2007/0072319 A1 | 3/2007 | Ahn et al. | |

FOREIGN PATENT DOCUMENTS

| | | |
|---|---|---|
| JP | 2001-237375 A | 8/2001 |
| JP | 2001-298154 A | 10/2001 |
| JP | 2002-289809 A | 10/2002 |
| JP | 2003-115544 A | 4/2003 |
| JP | 2003-264235 A | 9/2003 |
| JP | 2004-056139 A | 2/2004 |
| JP | 2004-063990 A | 2/2004 |
| JP | 2004-335993 A | 11/2004 |
| JP | 2005-142252 A | 6/2005 |
| JP | 2005-150237 A | 6/2005 |
| TW | 383494 B | 3/2000 |
| WO | 2006-049780 A2 | 5/2006 |

OTHER PUBLICATIONS

European Patent Convention dated Mar. 4, 2010, issued in corresponding European Patent Application No. 06001359.6.

Final Decision of Rejection dated May 18, 2010, issued in corresponding Japanese Patent Application No. 2005-285223.

European Search Report dated Mar. 3, 2011, issued in corresponding European Patent Application No. 11150568.1.

Partial European Search Report dated Nov. 16, 2007, issued in corresponding Application No. 06001359.6.

Taiwan Office Action dated Jul. 10, 2008, issued in corresponding Application No. 095102823.

US Office Action dated Apr. 10, 2013, issued in corresponding U.S. Appl. No. 13/716,588.

* cited by examiner

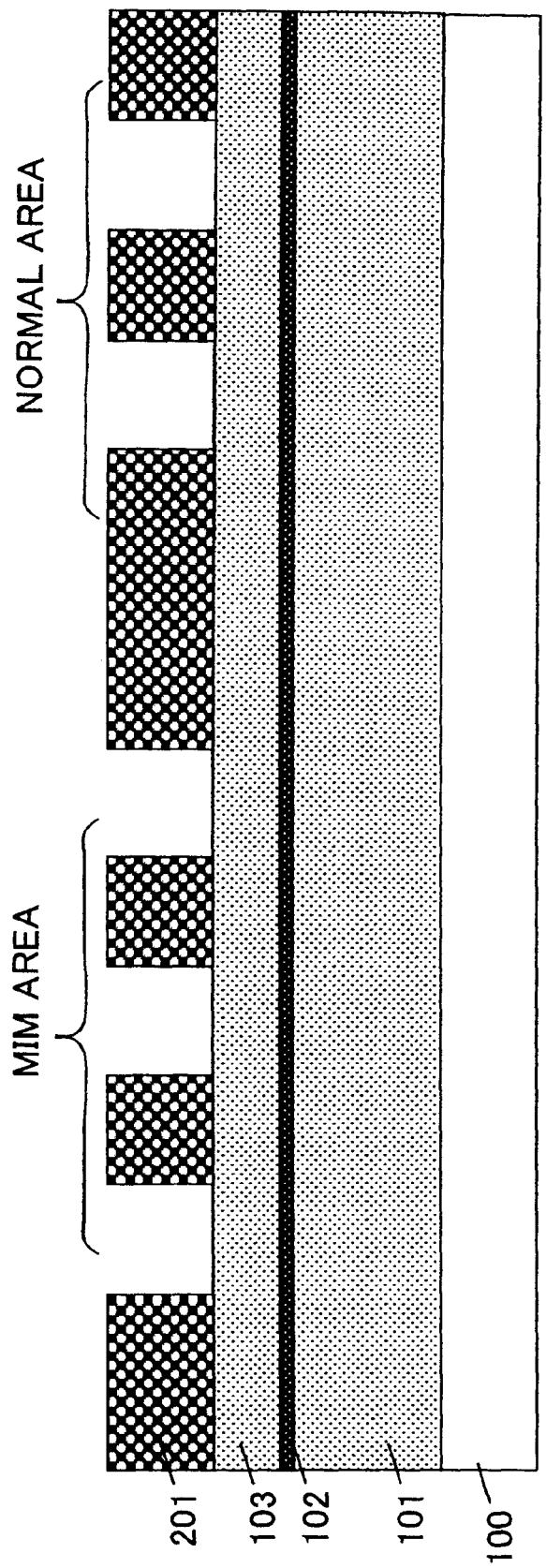

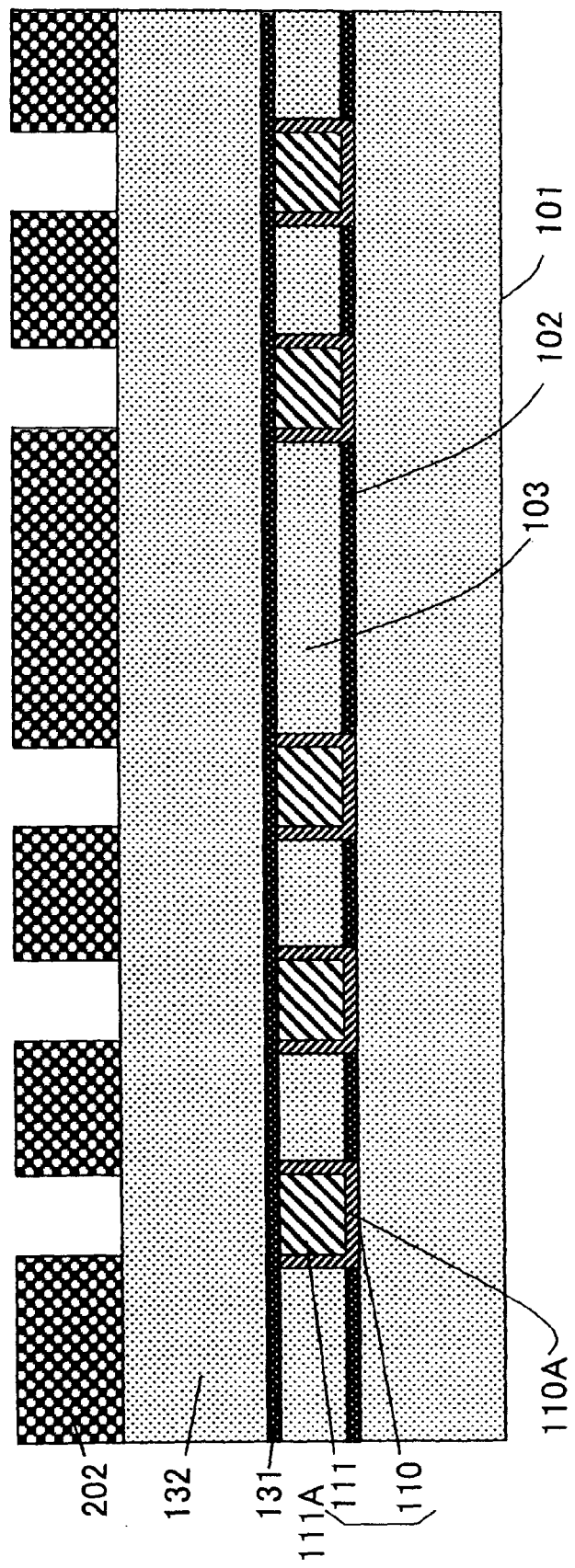

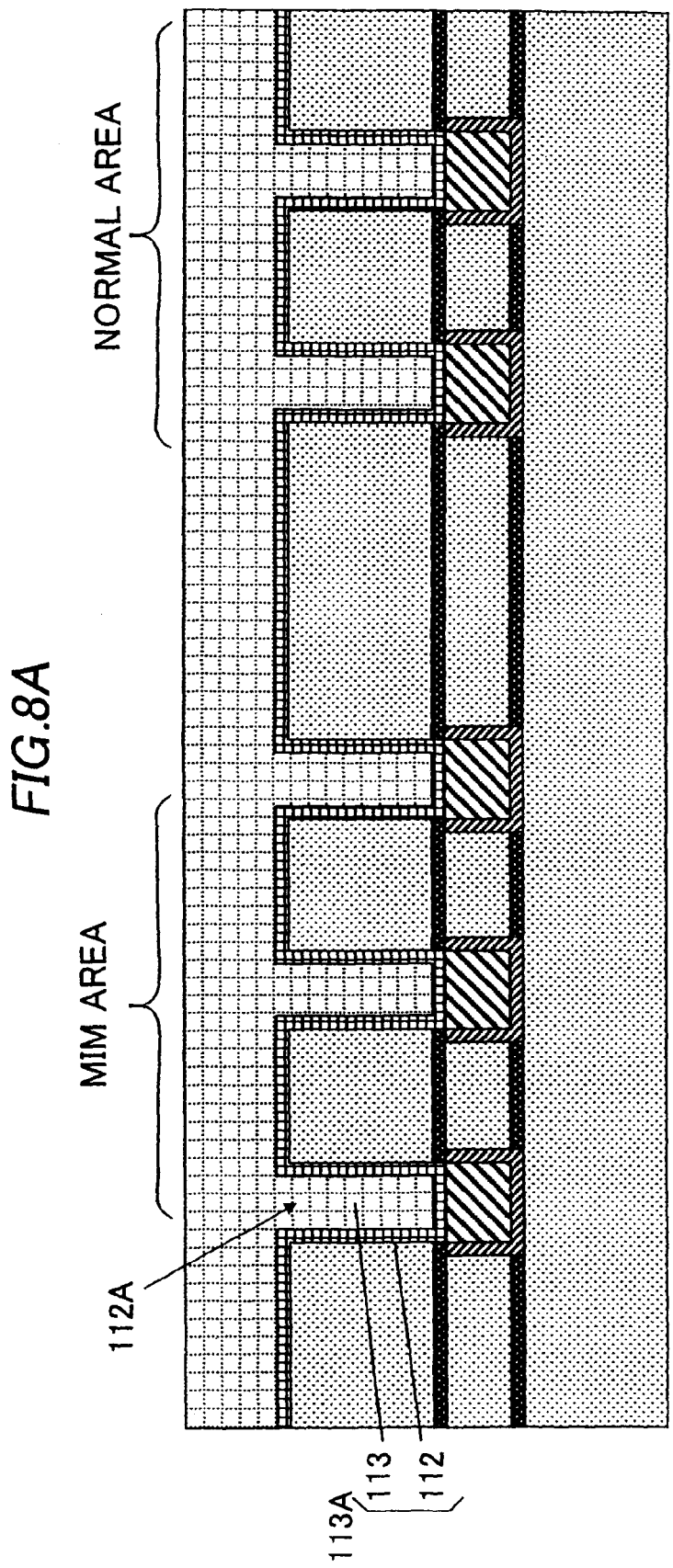

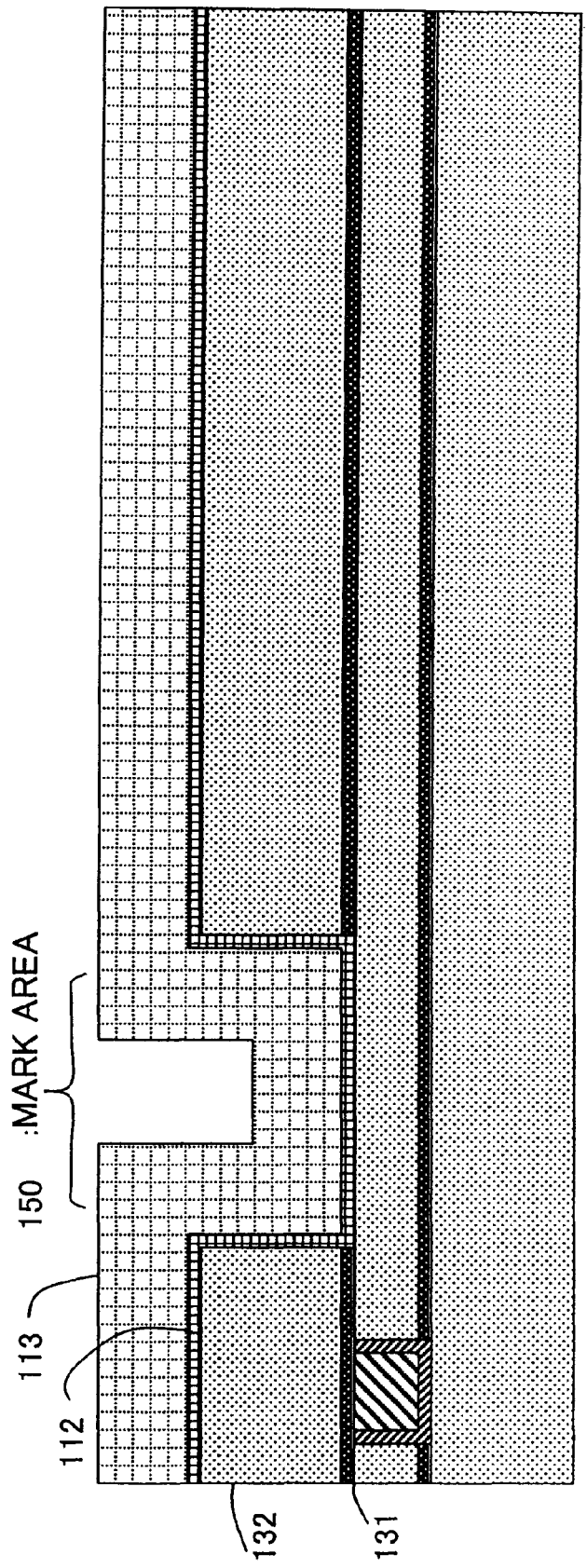

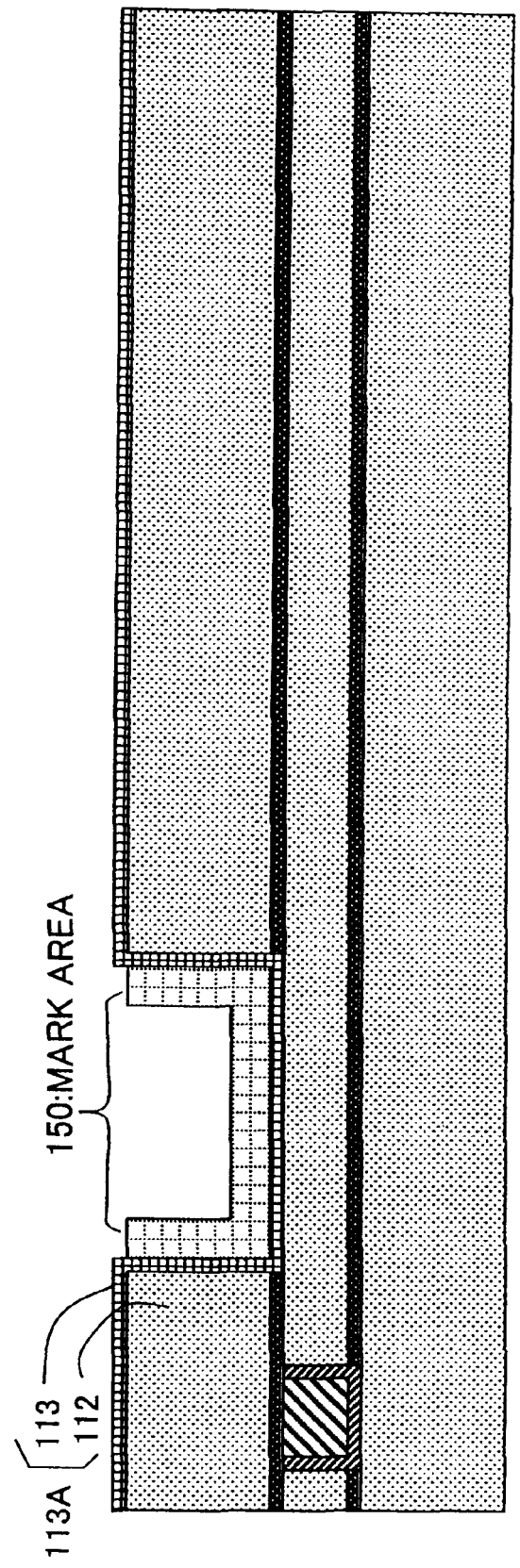

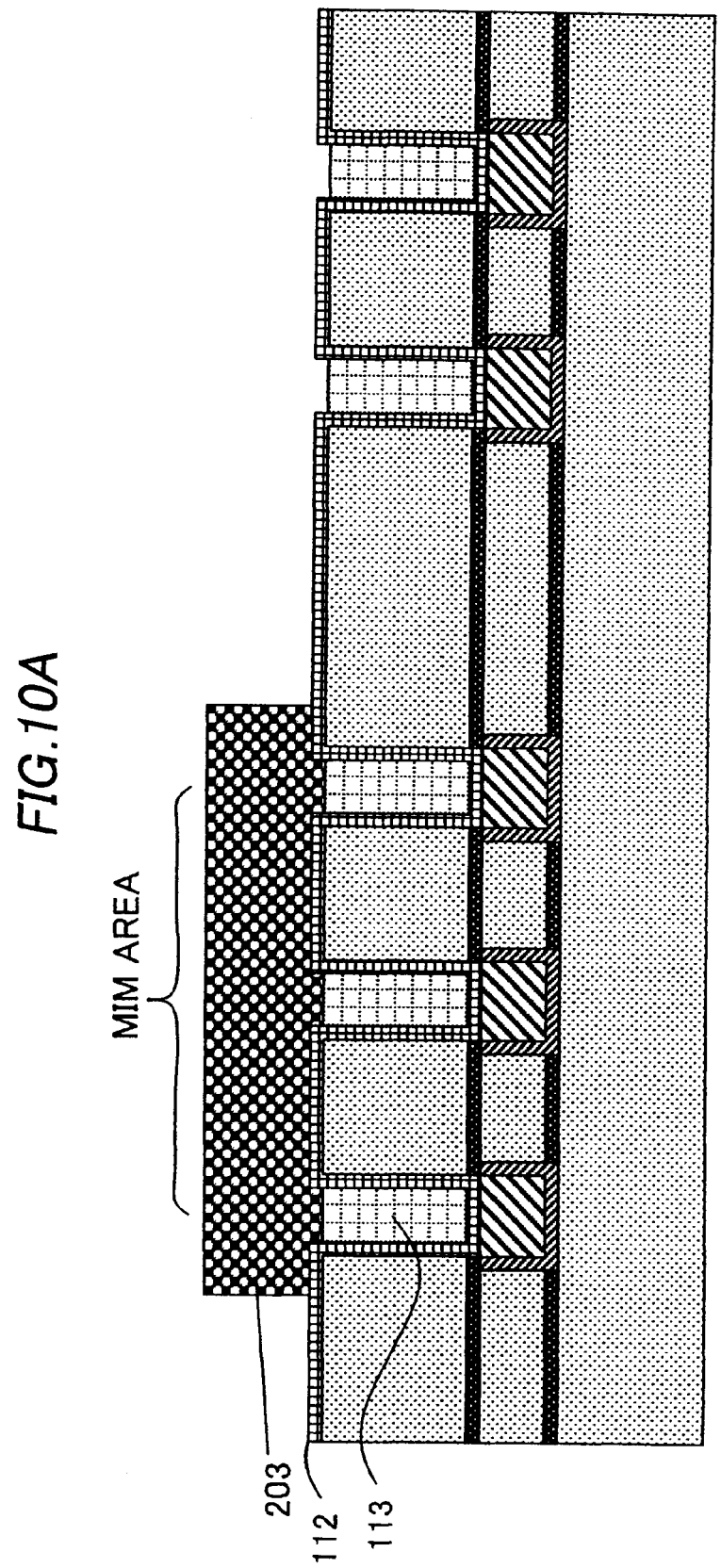

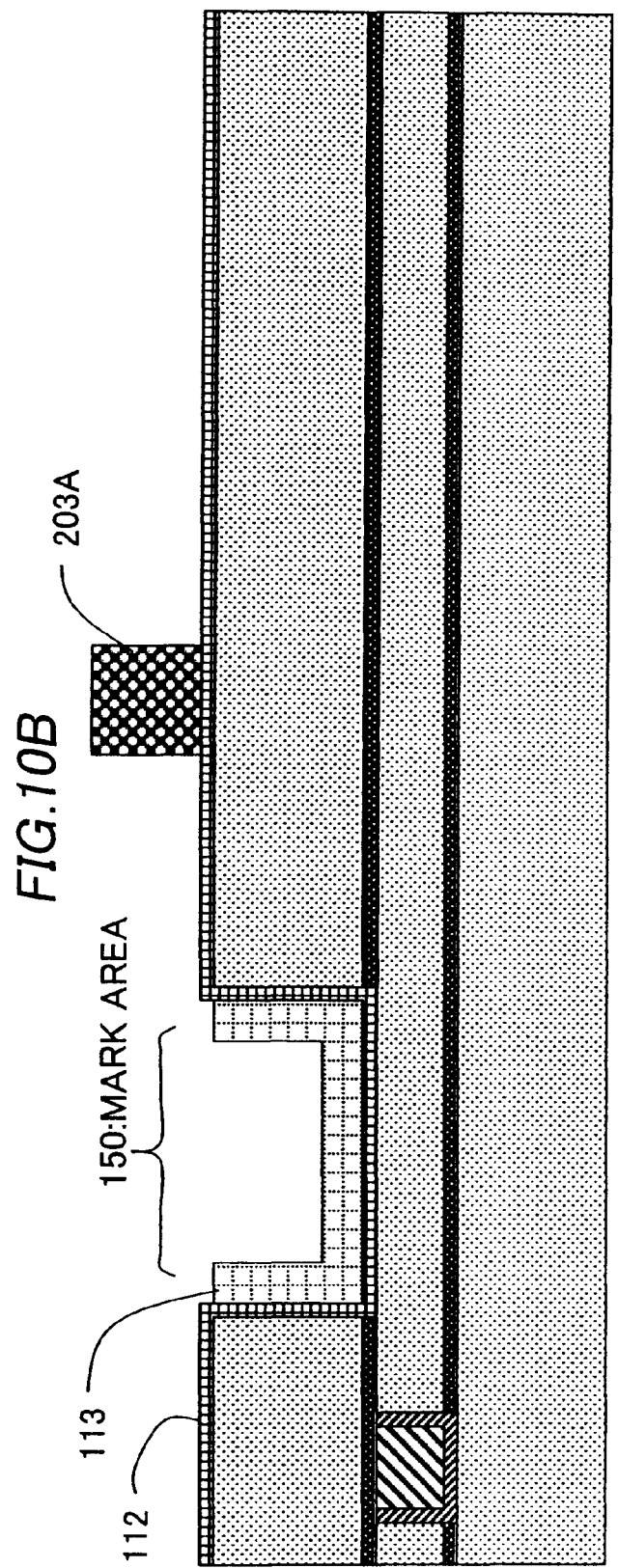

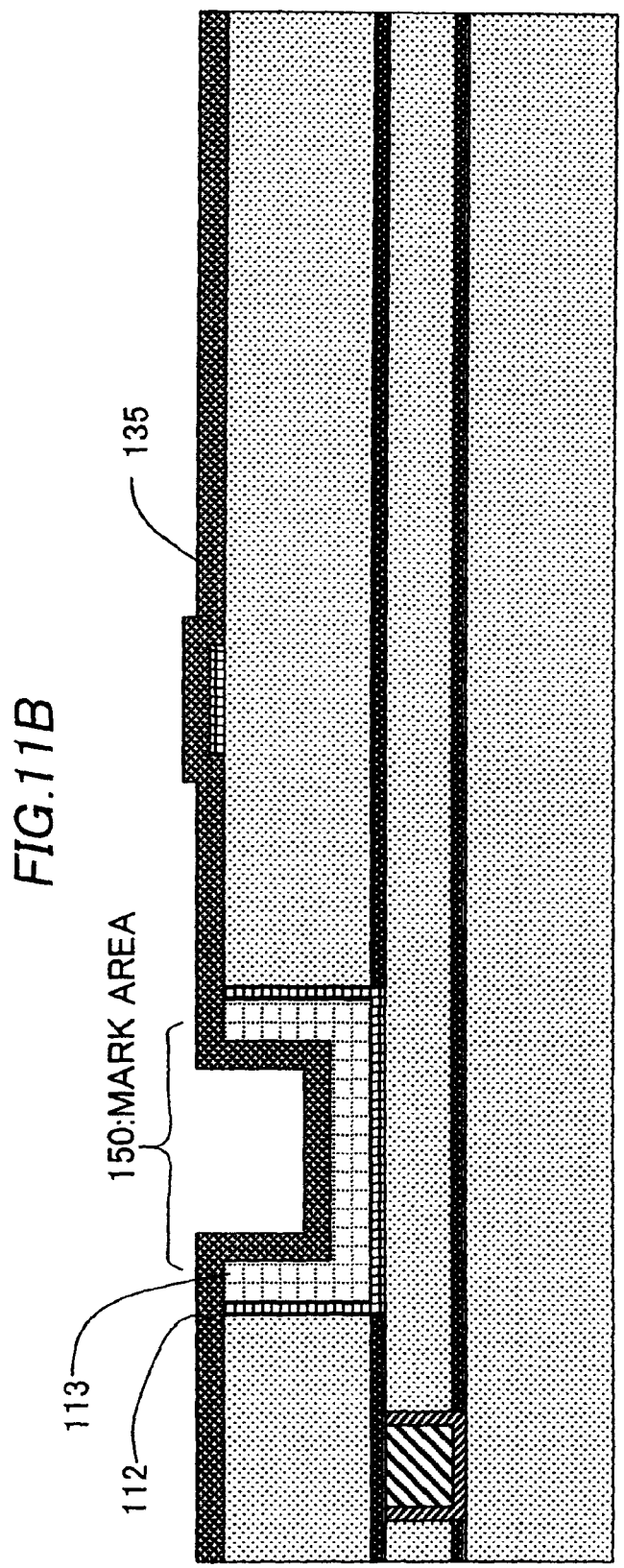

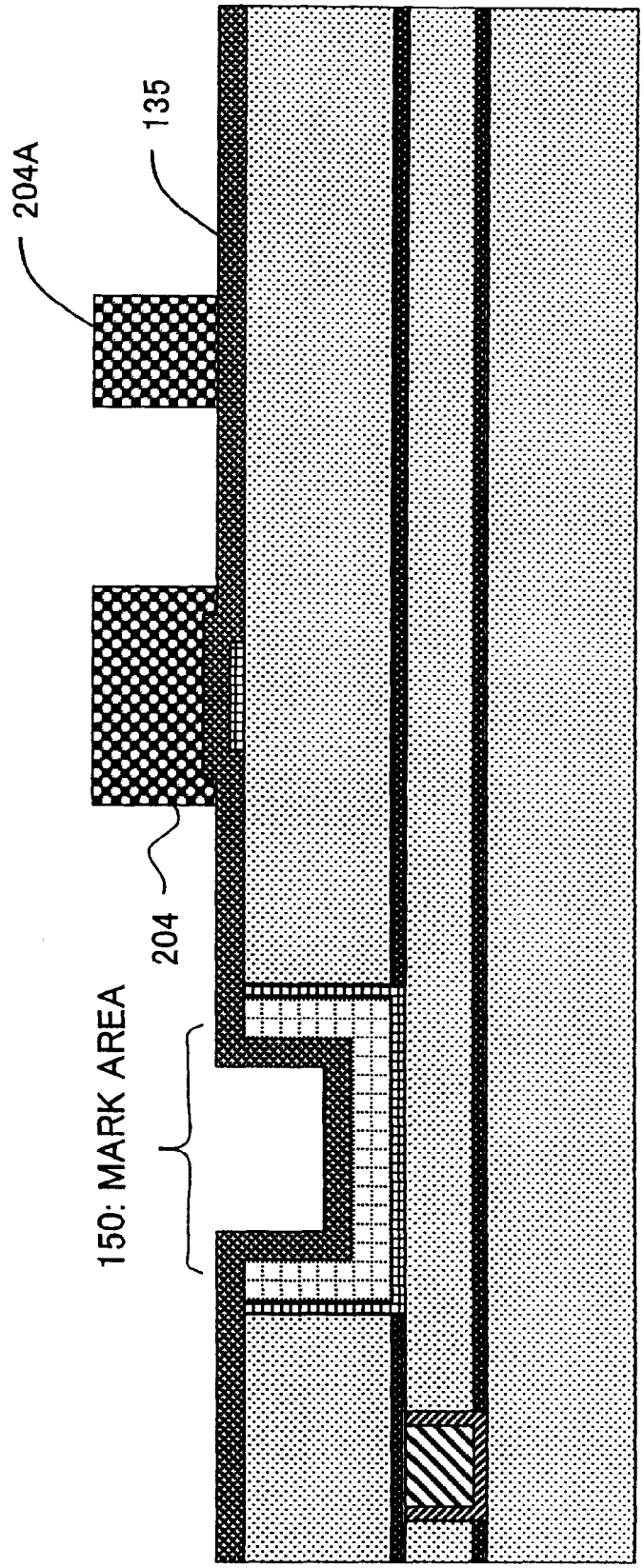

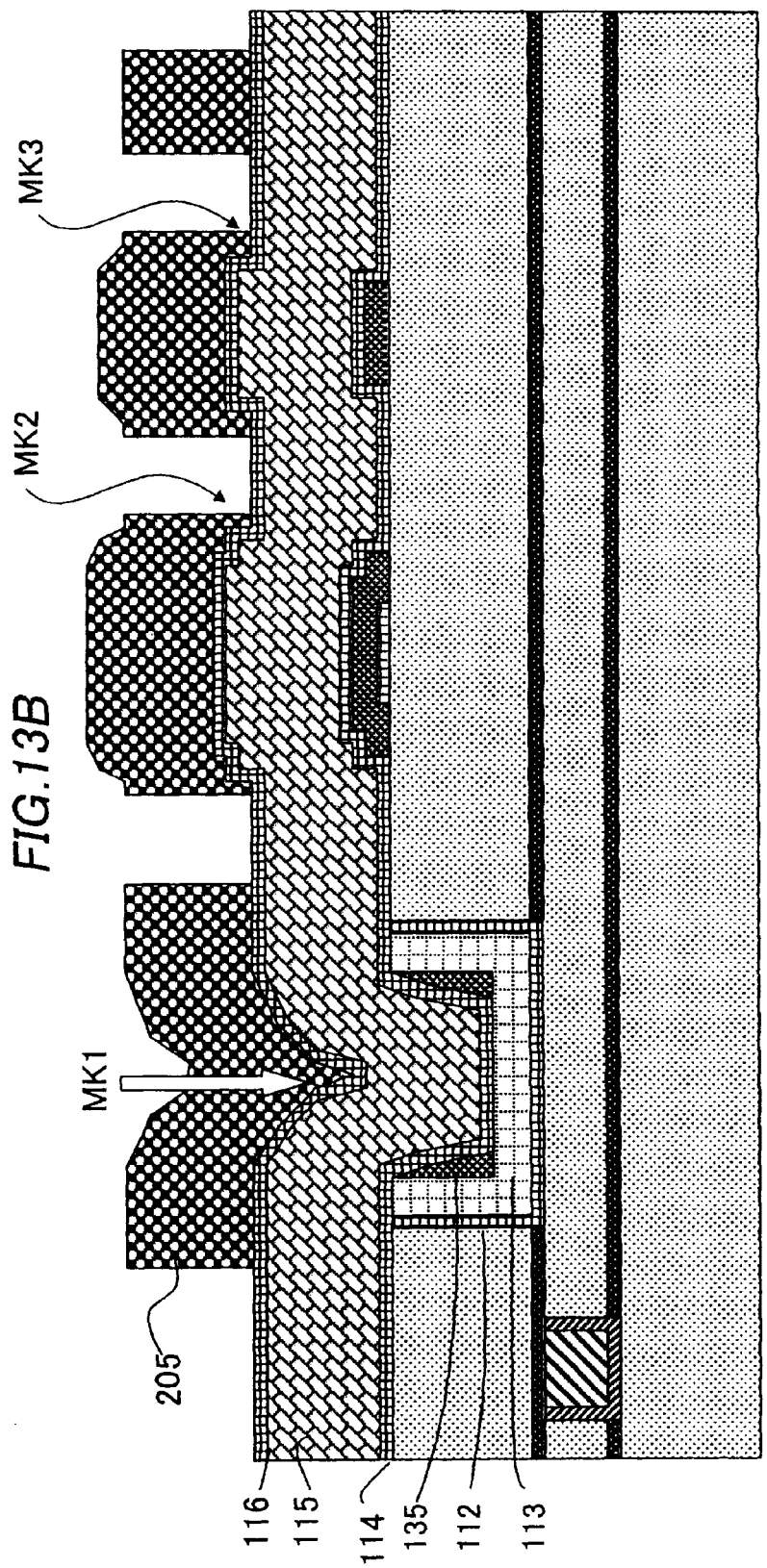

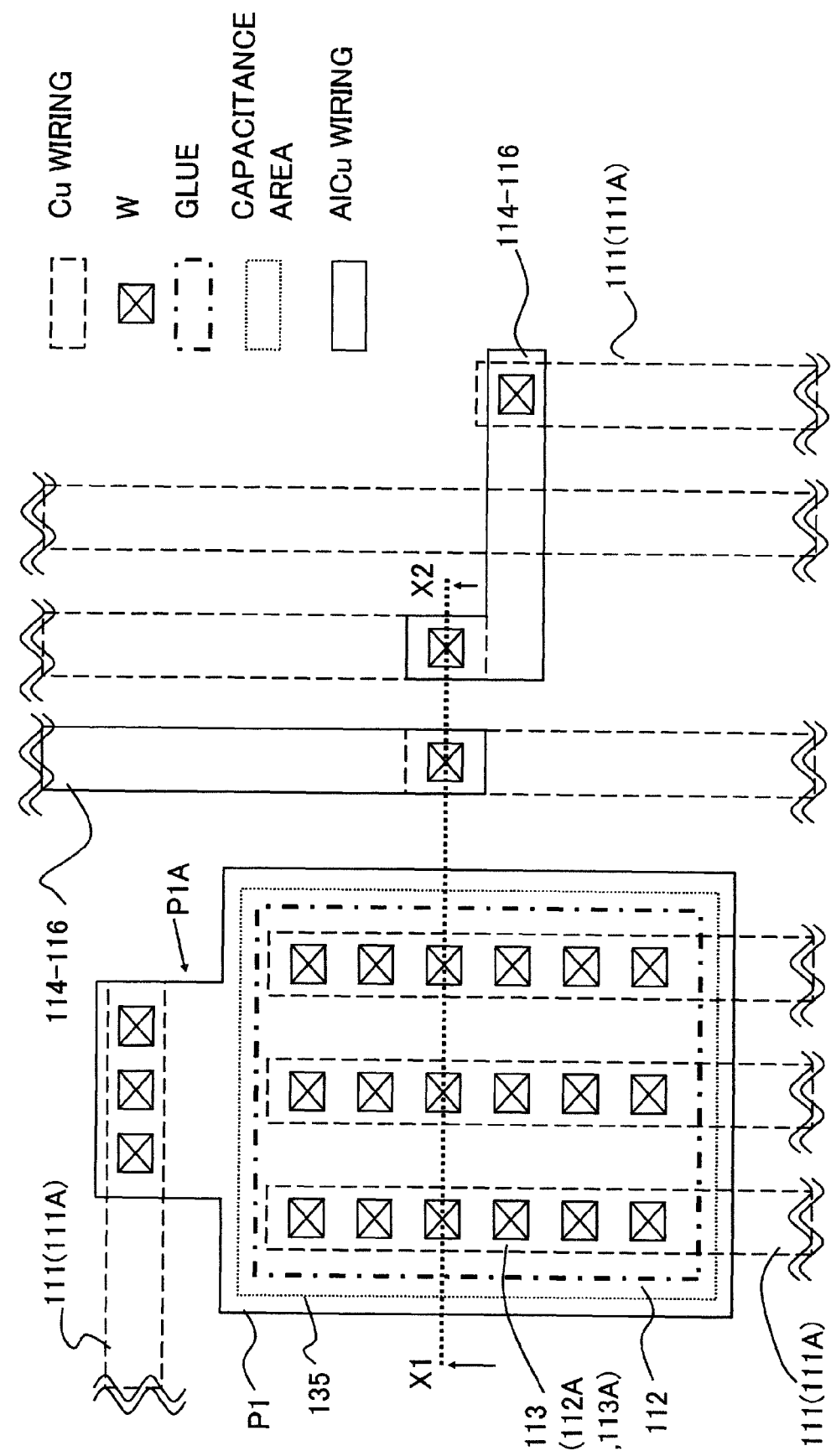

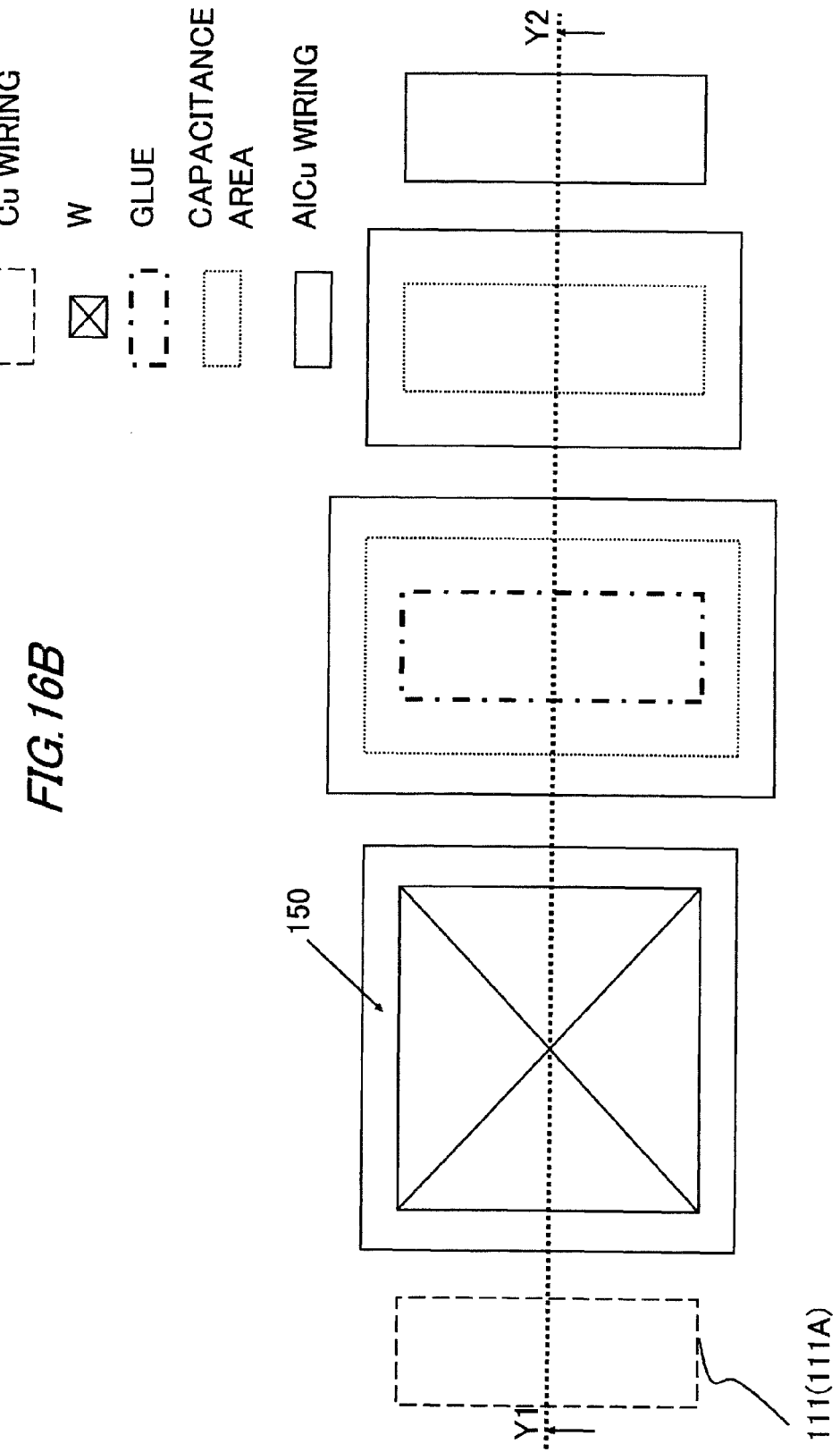

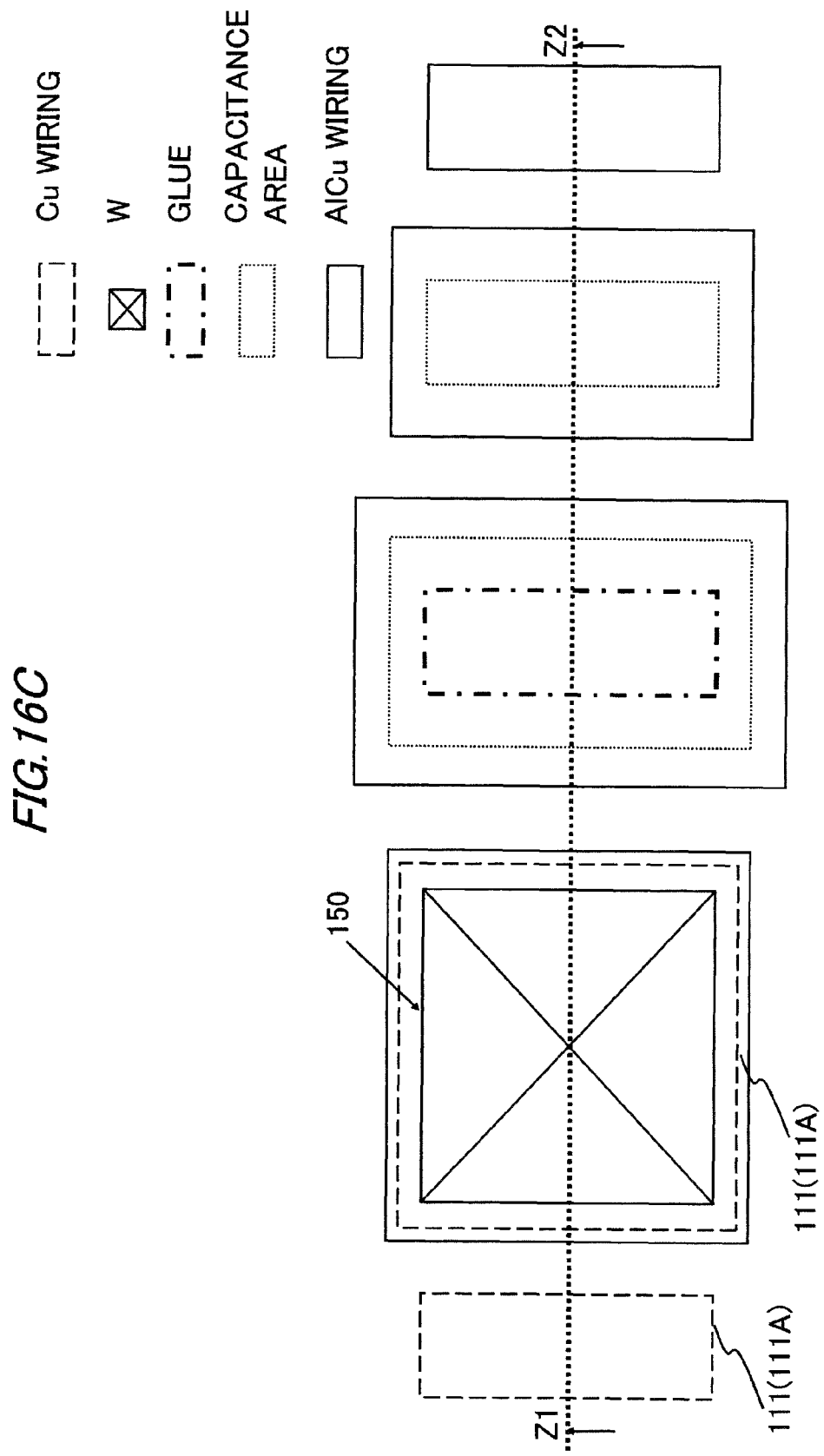

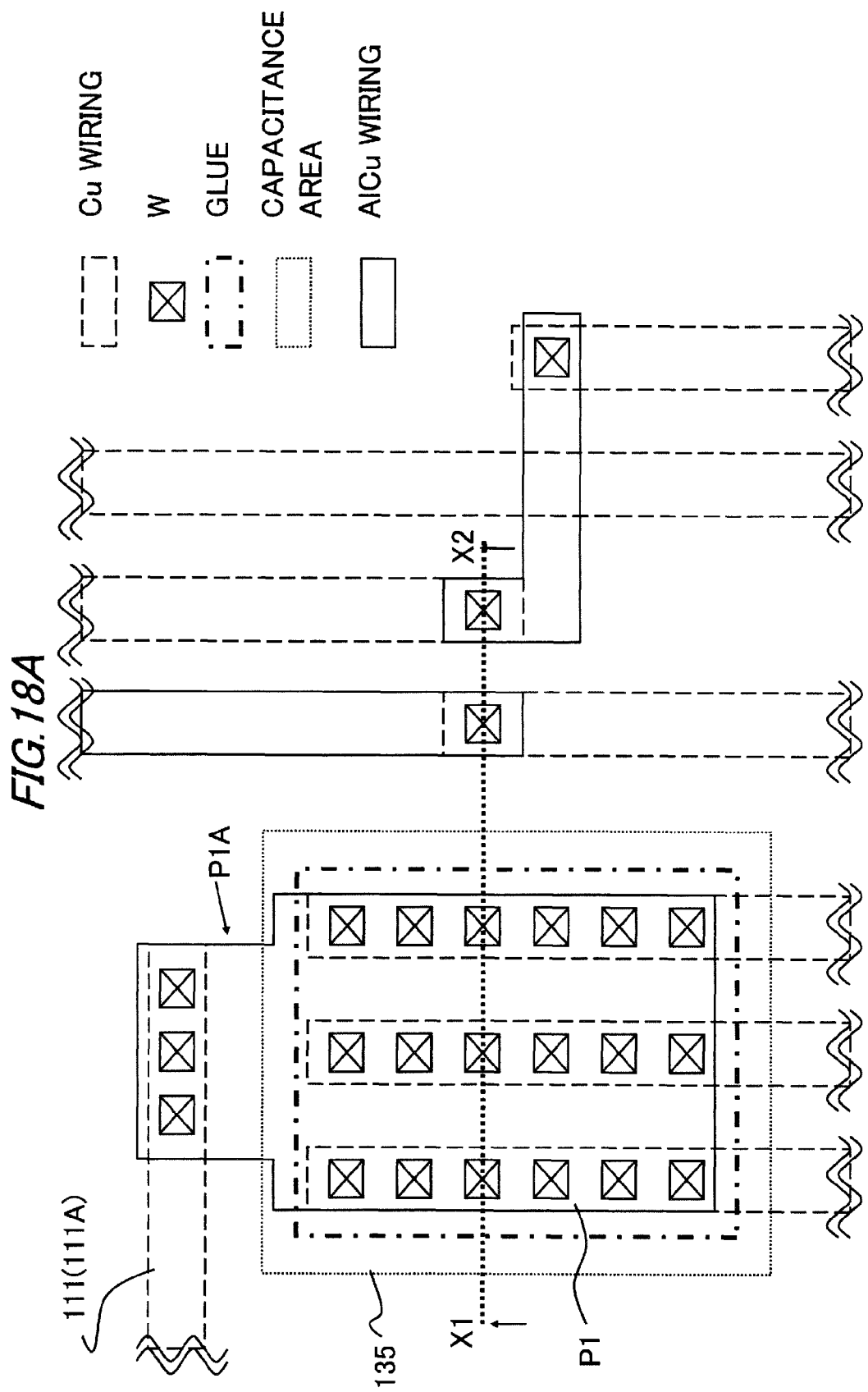

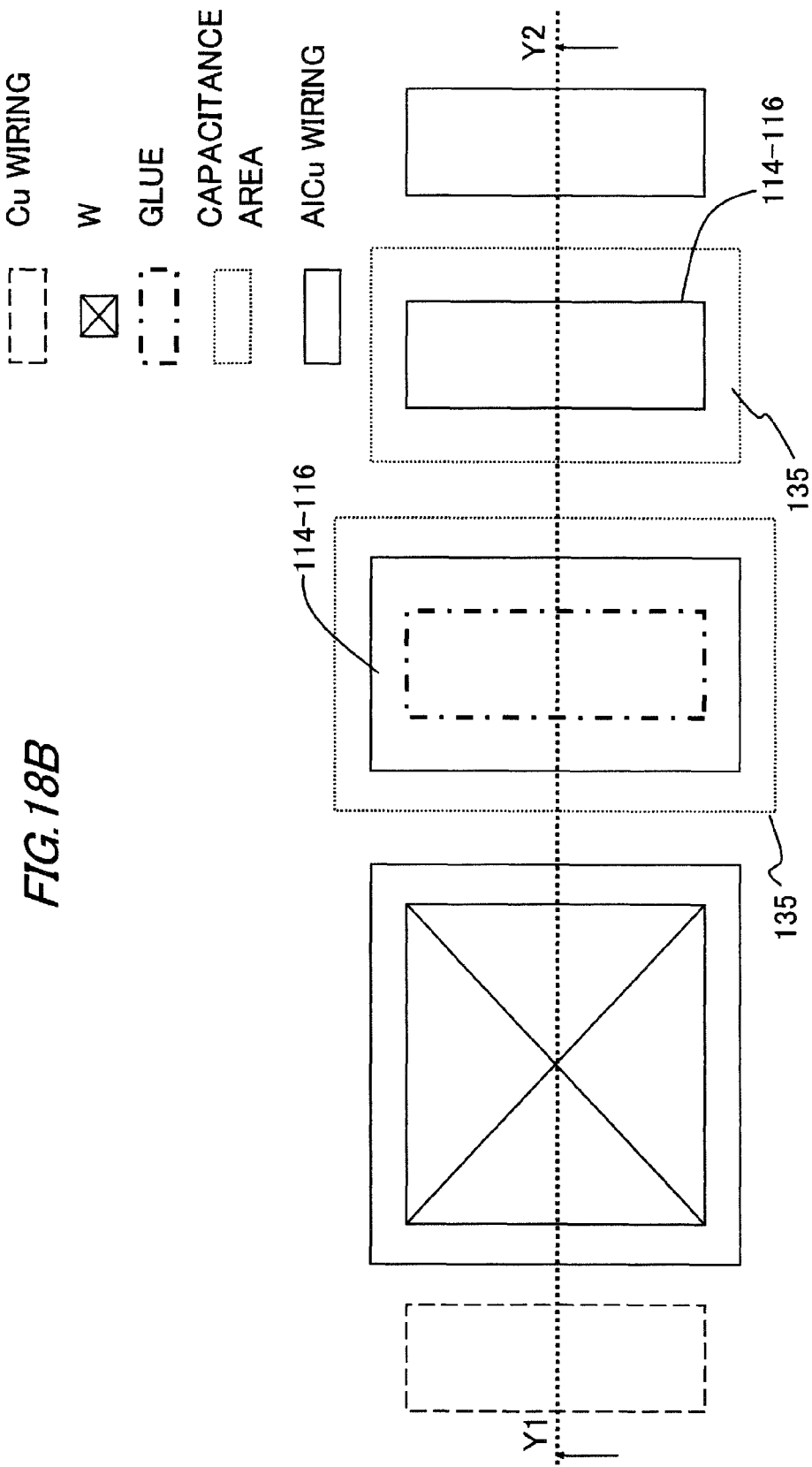

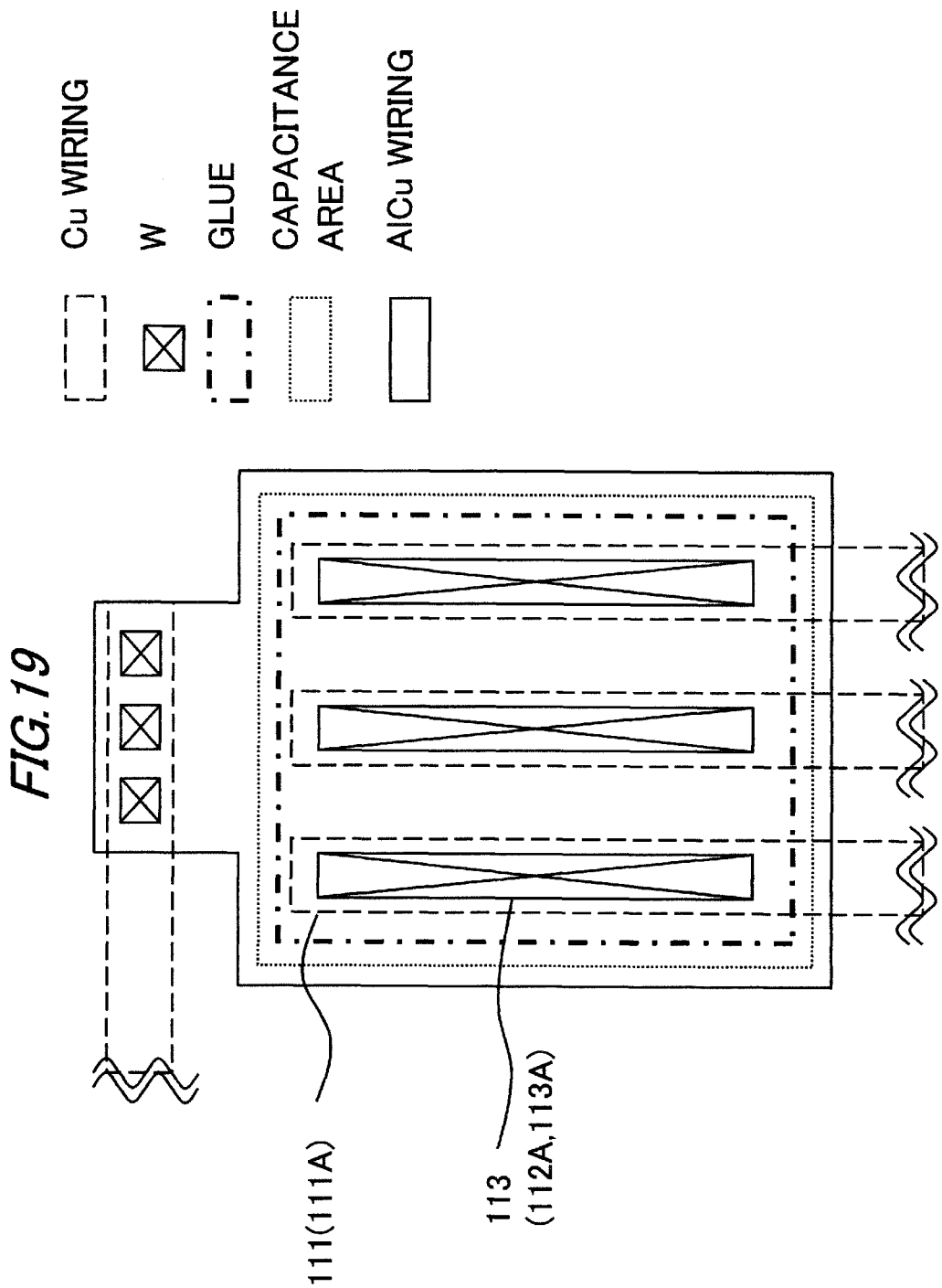

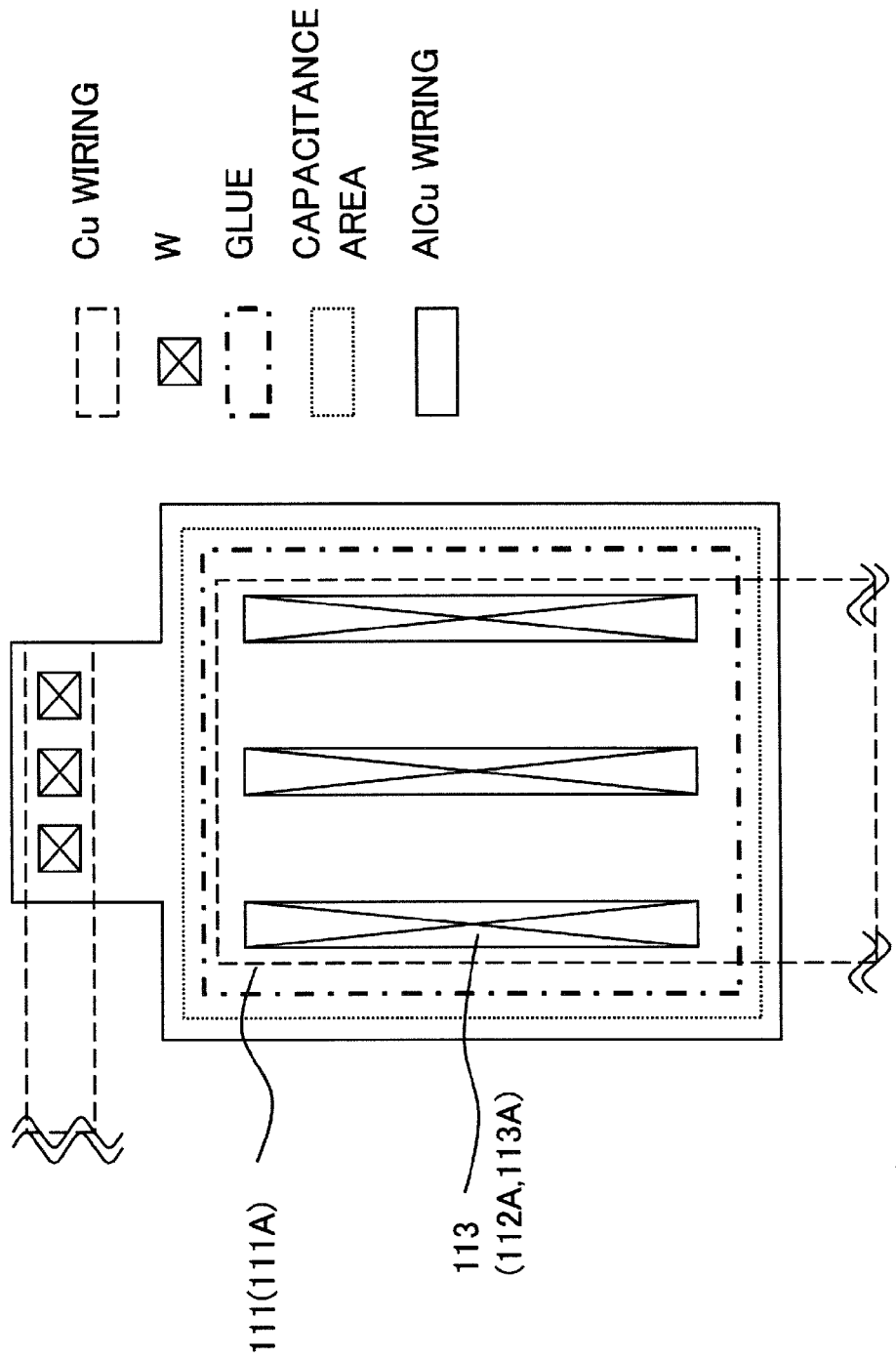

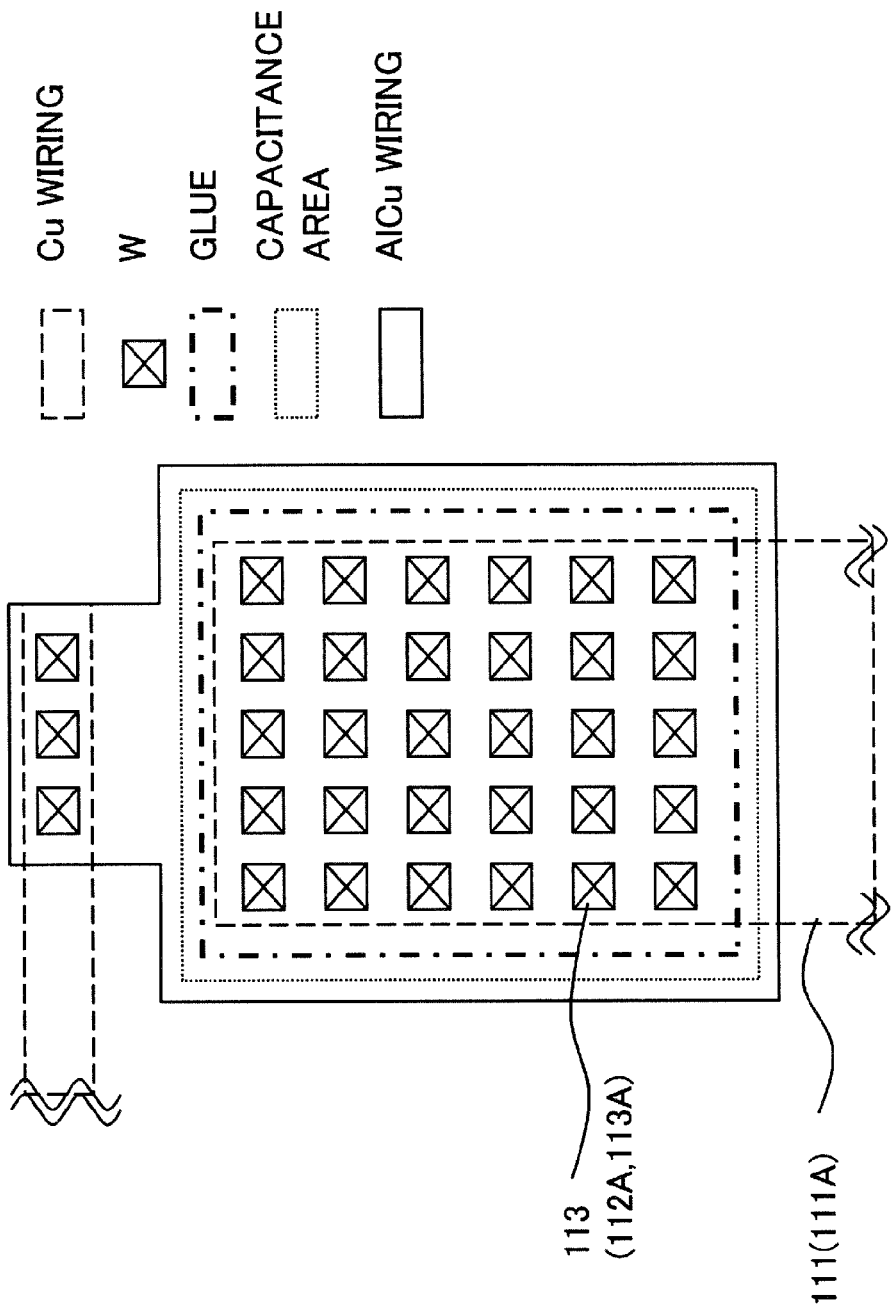

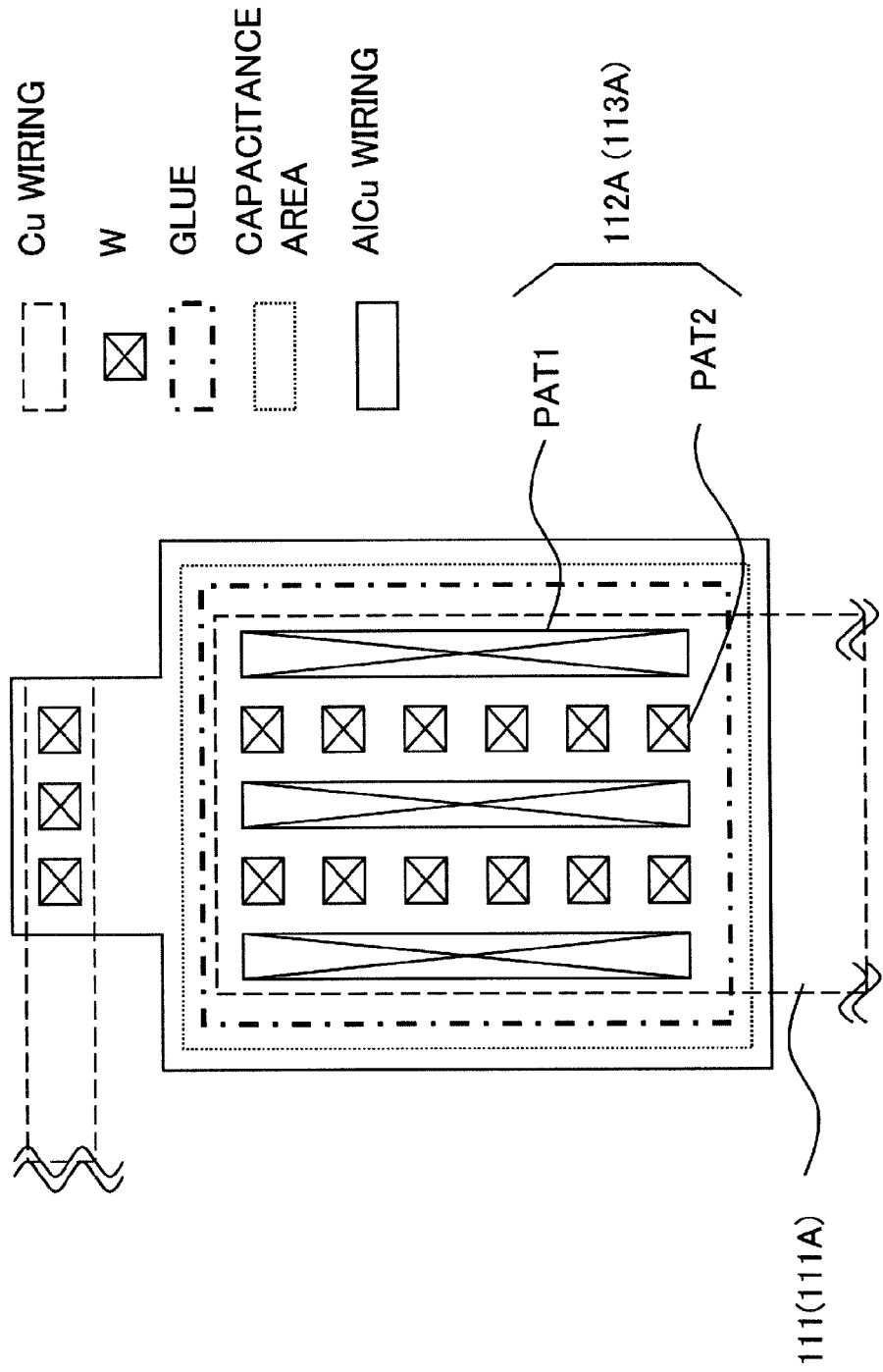

SEMICONDUCTOR DEVICE INCLUDING CAPACITOR

CROSS-REFERENCE TO RELATED APPLICATION

This is a divisional of application Ser. No. 12/461,136, filed Aug. 3, 2009, which is a divisional application of Ser. No. 11/339,701, filed Jan. 26, 2006, now U.S. Pat. No. 7,586,143 issued Sep. 8, 2009, which is based upon and claims the benefit of priority from the prior Japanese Patent Application No. 2005-285223, filed Sep. 29, 2005, the entire contents of which are hereby incorporated by reference.

BACKGROUND OF THE INVENTION

The invention relates to a semiconductor device having a MIM (Metal-Insulator-Metal) structure.

In a high-frequency analog integrated circuit used in the field of mobile communications etc, in addition to active elements (transistor elements (devices) etc) operating at a high speed, passive elements such as resistance (resistor), capacitance (capacitor) and an inductor are required. Then, these circuits are required to reduce parasitic resistance and parasitic capacitance in order to improve the operating speed and to decrease power consumption. In these elements, the capacitance element involves using a MIM (Metal-Insulator-Metal) element capable of reducing greater quantities of the parasitic resistance and of the parasitic capacitance than by a conventional MOS type capacitance element (e.g., Patent document 1 given below).

Further, in terms of reducing the parasitic capacitance and attaining the high-speed operation of the element (device), it is examined that a metal wiring of copper (Cu) etc is applied to the integrated circuit (refer to Patent document 2 given below).

[Patent document 1] Japanese Patent Application Laid-Open Publication No. 2001-237375
[Patent document 2] Japanese Patent Application Laid-Open Publication No. 2003-264235
[Patent document 3] Japanese Patent Application Laid-Open Publication No. 2004-63990

SUMMARY OF THE INVENTION

The technologies described above made a variety of proposals for assembling the MIM structure and the Cu wiring into the semiconductor device. There was not necessarily, however, made sufficient consideration for reducing the parasitic resistance and the parasitic capacitance in a structural aspect. It is an object of the invention to provide a technology capable of further reducing the parasitic resistance and the parasitic capacitance than by the prior arts and improving a high-frequency characteristic.

The invention adopts the following means in order to solve the problems. Namely, the invention is a semiconductor device comprising a first wiring layer formed on a substrate, an interlayer insulating film formed on the first wiring layer, a hole having an opening in an upper surface of the interlayer insulating film and formed in the interlayer insulating film, a first metal layer covering an internal surface of the hole, a second metal layer embedded into the hole covered with the first metal layer, a dielectric insulating film formed on the first metal layer, and a second wiring layer formed on the dielectric insulating film, wherein the first metal layer covering the internal wall surface of the hole forms at least part of the lower electrode of the lower layer of the dielectric insulating film, an area facing the lower electrode of the second wiring layer forms the upper electrode of the upper layer of the dielectric insulating film, and a capacitor including the lower electrode, the dielectric insulating film and the upper electrode is embedded.

Further, the invention may also be such that a third metal layer formed on the interlayer insulating film and connected to the first metal layer and the second metal layer, is provided as a substitute for the first metal layer, and the third metal layer constitutes the lower electrode of the lower layer of the dielectric insulating film.

According to the invention, the high-frequency characteristic of the semiconductor device can be more improved than by the prior arts.

BRIEF DESCRIPTION OF THE DRAWINGS

FIG. 4A is a view (of a MIM area and a normal area) showing a process of forming an interlayer film and a stopper film and effecting patterning in order to form the Damascene wiring of metal (Cu).

FIG. 6A is a view (of the MIM area and the normal area) showing a process of forming the hole on the Damascene wiring;

FIG. 8A is a view (of the MIM area and the normal area) showing a process of forming a metal layer.

FIG. 8B is a view (of the mark area) showing the process of forming the metal layer;

FIG. 9B is a view (of the mark area) showing the CMP process of the metal layer;

FIG. 10A is a view (of the MIM area and the normal area) showing a process of forming a pattern serving as a lower electrode of the MIM area;

FIG. 10B is a view a configuration of the mark area in the process of forming the pattern serving as the lower electrode of the MIM area;

FIG. 11B is a view showing a configuration of the mark area in the process of forming the dielectric insulating film 135 in the capacitance area of the MIM area;

FIG. 12B is a view showing a configuration of the mark area in the process where the photoresist 204 for patterning the capacitance area of the MIM area is subjected to coating, exposing and developing;

FIG. 13B is a view showing the configuration of the mark area in the process of the pattern formation of the upper electrode;

FIG. 16A is a plan view (of the MIM area and the normal area) with respect to a sectional structure built up in the processes explained in a first embodiment of the invention;

FIG. 16B is a plan view (of the mark area) with respect to the sectional structure built up in the processes explained in the first embodiment of the invention;

FIG. 16C is a plan view (a modified example) with respect to the sectional structure built up in the processes explained in the first embodiment of the invention;

FIG. 18A is a plan view of the MIM area and the normal area of the semiconductor device according to the second embodiment of the invention;

FIG. 18B is a plan view of the mark area of the semiconductor device according to the second embodiment of the invention;

FIG. 19 is a view showing a modified example in which a sectional shape of the hole is a rectangular shape of which a length differs in a vertical direction and in a lateral direction;

FIG. 20 is a view showing a modified example in which a width of the Damascene wiring area is expanded;

FIG. 21 is a view showing a modified example of increasing the number of holes;

FIG. 22 is a view showing a modified example of combining a grooved hole different in its length in the vertical direction and in the lateral direction of the sectional shape with a rectangular hole similar to substantially a normal square;

DETAILED DESCRIPTION OF THE INVENTION

A semiconductor device according to a best mode (which will hereinafter be termed an embodiment) for carrying out the invention will hereinafter be described with reference to the drawings. A configuration of the following embodiment is an exemplification, and the invention is not limited to the configuration of the embodiment.

Substance of the Invention

Figure 1:
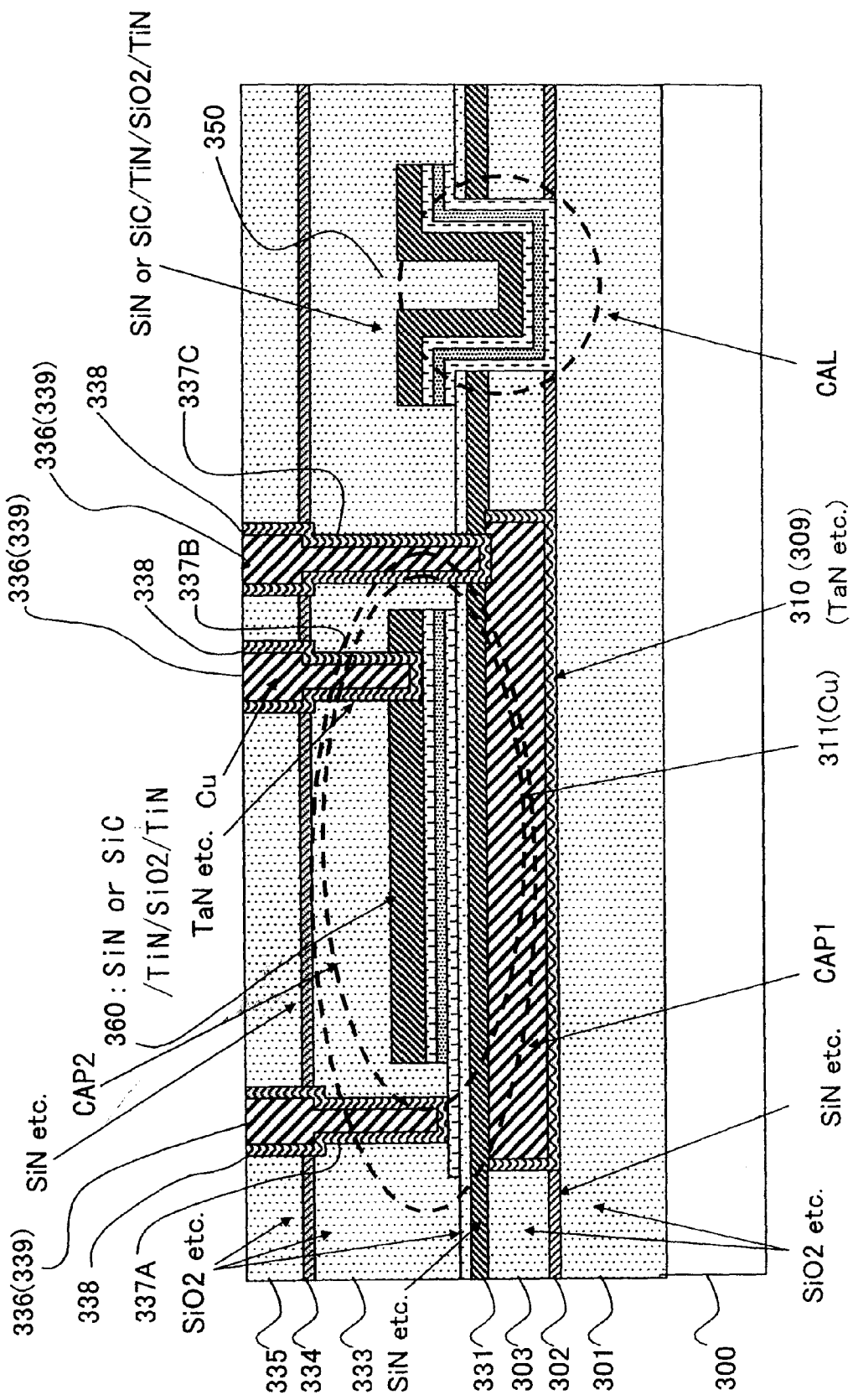
FIG. 1 is a view showing an example of a basic structure of a semiconductor device.

FIG. 1 shows an example of a basic structure of the semiconductor device. FIG. 1 is a sectional view of the semiconductor device including a MIM structure. As shown in FIG. 1, this semiconductor device includes a semiconductor substrate 300, a silicon oxide film ($SiO_2$) 301 formed on the semiconductor substrate 300, a silicon nitride film (SiN) 302 formed on the silicon oxide film 301, a silicon oxide film 303 formed on the silicon nitride film 302, a trench 309 formed in the silicon oxide film 303, a barrier metal film 310 covering a bottom surface and a side surface of the trench 309, a metal wiring 311 (Cu) filling a trenched portion within the barrier metal film 310, a silicon nitride film 331 formed on the metal wiring 311 (and the silicon oxide film 303), a MIM structure 360 formed on the silicon nitride film 331, a silicon oxide film 333 formed on the MIM structure 360 (and the silicon nitride film 331), a silicon nitride film 334 formed on the silicon oxide film 333, a silicon oxide film 335 formed on the silicon nitride film 334, a trench 339 formed in the silicon oxide film 335, a metal wiring 336 embedded in the trench 339, holes 337A, 337B connecting to the MIM structure the metal wiring 336 filled with the same type of metal (Cu) as the metal wiring 336, a hole 337C similarly connecting the metal wiring 336 to the metal wiring 311, and a barrier metal film 338 covering an internal surface of a structure including the trench 339 filled with the same type of metal (Cu) as the metal wiring 336 and the holes 337-337C.

Herein, a Damascene structure is built up by a structure including the trench 309, the barrier metal film 310 covering the bottom surface and the side surface of the trench 339 and the metal wiring 311 filling the trenched portion within the barrier metal film 310. Further, a structure called a dual Damascene structure includes the trench 309 embedded with the metal wiring 336, and the holes 337A, 337B, 337C embedded with the same type of metal (Cu) as the metal wiring 336. The dual Damascene structure connotes the Damascene structure including both of the trench and the hole.

As shown in FIG. 1, the MIM structure 360 is constructed of a 3-layered structure such as, from the upper layer, titan nitride (TiN)/silicon oxide film ($SiO_2$)/titan nitride (TiN), and a layer of silicon nitride (SiN) or silicon carbide (SiC) is further formed over the upper layer thereof.

The barrier metal film 338 covering the metal (Cu) filling the hole 337A and an internal wall of the hole 337A connects the metal wiring 336 down to a lower electrode (TiN) of the MIM structure. Further, the metal (Cu) filling the hole 337B and the barrier metal film 338 covering an internal wall of the hole 337B connect the metal wiring 336 down to an upper electrode (TiN) of the MIM structure 360. Moreover, the metal (Cu) filling the hole 337C and the barrier metal film 338 covering an internal wall of the hole 337C connect the metal wiring 336 down to the metal wiring 311. It is to be noted that a layer including the holes 337-338C, the barrier metal film 338 and the wiring 336 is also called a via layer, a hole layer, a plug layer or simply an interlayer insulating film layer.

Thus, in FIG. 1, the MIM elements are so formed as to be embedded in the via layer (the interlayer insulating film layer) having the dual Damascene structure.

Further, in the semiconductor device, an alignment mark 350 for superposing interlayer patterns is formed in a right-side area in FIG. 1. In the Damascene structure (which is a structure planarized by embedding the barrier metal film 310 or the metal wiring 311 into the trench 309), the surface after polishing the metal (Cu) is planarized. Therefore, if the metal film (e.g., a TiN film as the MIM element) is further formed on this surface, a stepped portion is not left on the metal film surface, and the pre-layer, e.g., the metal wiring 311 etc becomes unrecognizable of its position. Such being the case, before forming the layer of TiN serving as the lower electrode of the MIM element, the alignment mark 350 is formed and employed for alignment after forming the TiN layer.

Generally, the interlayer alignment involves utilizing the stepped portion or utilizing a different in reflectance by use of the light penetrating the insulating film. In the case of forming the metal layer for the purpose of forming the MIM elements over the upper layer of the Damascene structure as in FIG. 1, however, it is required that the stepped portion be utilized for detecting a position of the pre-layer.

For previously forming the stepped portion after building up the Damascene structure, after forming the silicon nitride film 331 over the upper layer of the metal wiring 311 or forming the silicon oxide film, a pattern of the alignment mark 350 is formed by patterning with a photoresist, and the stepped portion is required to be formed by etching. Accordingly, a single mask pattern is needed for forming the alignment mark 350. Note that even when the alignment mark 350 is formed at a layer under the metal wiring 311 of the Damascene structure, the stepped portion disappears due to the embedding of the metal wiring 311 and CMP (Chemical Mechanical Planarization).

A process of manufacturing the semiconductor device in FIG. 1 will be explained. To begin with, there are conducted formation of an insulating film ($SiO_2 \rightarrow SiN \rightarrow SiO_2$), patterning of the photoresist, etching-formation of the trench 309 and exfoliation of the resist (at which time the mask used for the patterning is called, e.g., MxL). Moreover, a layer consisting of the barrier metal film 310 and the metal wiring 311 is formed by embedding, wherein an extra layer of the barrier metal film 310 and the metal wiring 311 is removed by CMP (Chemical Mechanical Planarization), and a first-layer Damascene structure is formed in a lower area in FIG. 1. Thus, the Damascene structure connotes the structure planarized by embedding the barrier metal film 310 and the metal wiring 311 into the trench 309. Herein, the barrier metal film 310 is, e.g., tantalum nitride (TaN). Further, the metal wiring 311 is, e.g., copper (Cu).

Formed subsequently are a diffusion preventive film of the metal (Cu) included in the metal wiring 311 and a silicon nitride film (SiN) 331 serving as a stopper film when etching a next layer. Subsequently, a thin layer of $SiO_2$ is formed. This $SiO_2$ layer may not exist. Next, for the purpose of forming the alignment mark 350, the patterning and the etching are performed (the mask used for this patterning will hereinafter be called CAL in the embodiment). The alignment with the base layer is carried out by using the alignment mark 350 formed at this time on the occasion of forming the pattern after forming the metal layer (the lower electrode) configuring a subsequent MIM structure.

Subsequently, a TiN film (the lower electrode) and a $SiO_2$ film (a dielectric insulating layer), a TiN film (an upper electrode) and a SiN film, which become the MIM elements, are formed by sputtering, a plasma CVD (Chemical Vapor Deposition) method and so on.

Next, the mask pattern corresponding to the MIM lower electrode is formed by the photoresist in a way that uses the alignment mark 350 formed beforehand, the MIM element portion composed of $SiN/TiN/SiO_2/TiN$ is etched, and the resist is peeled off (the mask used for this pattern formation will hereinafter be referred to as CAP1 in the embodiment).

Moreover, the mask pattern corresponding to the upper electrode is formed by the photoresist, a portion composed of $SiN/TiN/SiO_2$ is etched, and the resist is peeled off (the mask used for this pattern formation will hereinafter be referred to as CAP2 in the embodiment). The alignment mark at this time may be preset in layout (unillustrated) in a different location when forming the mask pattern corresponding to the lower electrode. The precise alignment can be made when forming the upper electrode by employing the mark used when forming the lower electrode.

Subsequently, an insulating film layer ($SiO_2$) 333 corresponding to a via layer of the dual Damascene structure built up later on, is formed thicker than a final target film thickness. The reason why so lies in obviating an interlayer stepped portion by the CMP so that the stepped portion produced by the MIM elements will not cause any problem such as a Cu residue in the wiring within a dual Damascene layer that will be formed later on. Then, the thus-formed interlayer insulating film 333 is polished including the planarization by the CMP. Through such a process, the via layer (the interlayer insulating film 333) matching with the planar target film thickness is formed.

Formed subsequently is a silicon nitride film 334 serving as an etching stopper film for building up the dual Damascene structure. Furthermore, a silicon oxide film 335 serving as an insulating film for the metal wiring 336 is formed.

From this onward, the processing is based on a general type of dual Damascene structure configuring method. Some methods are proposed as the structure configuring method. The discussion on the embodiment proceeds along with the method called a pre-via method.

The holes 337A, 337B, 337C are formed by the photoresist on the silicon oxide film 335 serving as the insulating layer for the wiring. On this occasion, the metal of the Damascene wiring formed earlier is detected from the difference in the reflectance of the light penetrating a stacked interlayer film, and the alignment is conducted (the mask employed for this pattern formation will hereinafter be called such as Mx+1C in the embodiment. Herein, Mx+1C represents a contact layer disposed higher by one layer than the mask MxL for the formation of the Damascene wiring).

Moreover, the silicon oxide film 335/the silicon nitride film 334/the interlayer insulating film 333 are etched till the silicon nitride film 331 on the metal wiring 311 is exposed, and the resist is peeled off. Hereat, the hole 337B at the upper portion of the upper electrode stops in a way that bears etching-over by SiN on the TiN film corresponding to the upper electrode (the SiN film is previously formed properly relatively thick). The hole 337A at the upper portion of the lower electrode stops due to a selection ratio depending on a difference in material on the lower electrode (TiN).

Subsequently, a resin (a material that does not cause mixing with the subsequence resist) is coated over inside the holes 337A-337C, the resin remains only within the holes 337A-337C by dissolution, and a mask pattern corresponding to a wiring layer 336 (the trench 339) is formed by the photoresist (the mask employed for this pattern formation will hereinafter be called, for example, Mx+1L in the embodiment). On this occasion, a mark pattern, which will become an alignment mark on the layout within the pre-formed hole pattern, is formed beforehand. When forming the wiring pattern, the alignment is conducted by utilizing the stepped portion of the mark pattern, whereby the hole pattern (the layer including the holes 337A-337C) can be precisely aligned with the wiring pattern.

Furthermore, the insulating film 35 for the wiring is etched till the silicon nitride film 334 just thereunder gets exposed, wherein the photoresist including the wiring pattern (the pattern of the metal wiring 336) is used as a mask. Subsequently, the resist is peeled off. Hereat, the resin embedded inside the hole is simultaneously removed.

Subsequently, the silicon nitride film 334 as the lower layer of the trench 339 and the silicon nitride film 331 as the lower layer of the holes 337C are simultaneously removed by etching in a way that uses, as a mask, the trench 339 of $SiO_2$ formed in the wiring pattern and the holes 337A-337C of $SiO_2$ formed in the hole pattern, thereby forming the contact area (the hole 337C) with the Damascene wiring. Hereat, simultaneously, SiN on the MIM structure is removed, and a contact area (the hole 337B) with the upper electrode is also formed.

In this state, the Damascene wiring (Cu), the MIM upper electrode (TiN) and the MIM lower electrode (TiN) are exposed from the surface, wherein the MIM structure and the wiring structure can be configured. Finally, the barrier metal film 338 and the metal wiring 336 (Cu) are formed so as to simultaneously embed the trench 339 and the holes 337A-337C, and the extra portions of the barrier metal film 338 and of the metal wiring 336 are removed by the CMP. Through the processes made so far, the formations of the MIM structure and the dual Damascene structure are completed. The processes conducted so far enable the MIM structure to be embedded into the dual Damascene structure (within the silicon oxide film 333 as the interlayer insulating film).

Figure 2:
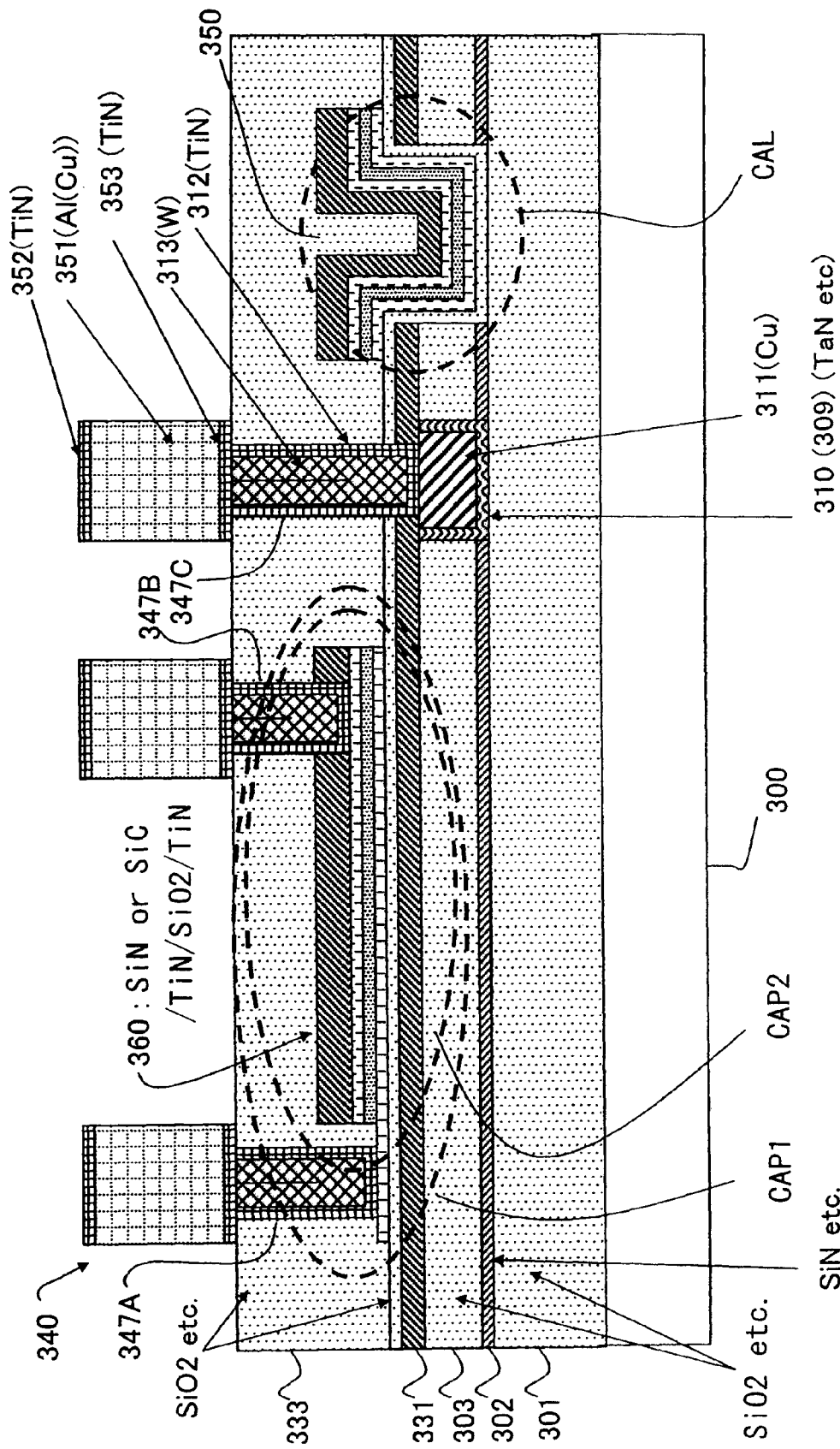
FIG. 2 is a view showing a second example of the semiconductor device so formed as to be embedded into a Damascene structure.

FIG. 2 shows a second example of the semiconductor device in which the MIM structure is so formed as to be embedded into the Damascene structure. In the second example, the barrier metal film 310 and the metal wiring 311, which configure the Damascene layer, are formed outside the area just under the MIM structure.

The second example is different from the case in FIG. 1 in terms of such a point that the metal wiring 311 is not formed as a lower layer pf the MIM structure 360. Further, in FIG. 1, the dual Damascene structure is built up by the metal wiring 336 embedded in the trench 339 and by the holes 337A, 337B and 337C that connect the metal wiring 336 to the MIM structure and to the Damascene wiring, and, by contrast, the example in FIG. 2 is different from the case in FIG. 1 in terms of such a point that an aluminum wiring 340 based on RIE (Reactive Ion Etching) is formed on the upper layer of the holes 337A, 337B and 337C.

Manufacturing of the semiconductor device in FIG. 2 up to the formations of the MIM structure 360 and of the interlayer insulating film 333 is the same as in the case of FIG. 1. In the same way as in FIG. 1, the interlayer insulating film 333 corresponding to the via layer is formed thick enough for the planarization effected later on.

Thereafter, the resist pattern for forming the holes 337A-337C is subjected to coating and developing (the mask used for this pattern formation is also called, e.g., Mx+1C). Furthermore, the hole 337A is opened down to TiN forming the lower electrode by etching, and the etching stops at the TiN surface. Moreover, the hole 337B is opened down to SiN of the upper layer of MIM area 360 by etching, and the etching stops at the SiN surface. Still further, the hole 337C is opened down to the silicon nitride film 331 of the upper layer of the metal wiring 311 by etching, and the etching stops at the surface of the silicon nitride film 331.

Next, the resist pattern is peeled off by plasma asking that contains an oxygen gas. Further, with the interlayer insulating film 333 serving as a mask, SiN of the upper layer of the MIM area 360 and the silicon nitride film 331 are etched. As a result, the hole 347B is opened down to the surface of the upper electrode (TiN) of the MIM structure and down to the surface of the metal wiring 311.

Thereafter, a glue layer (TiN) 312 and a metal (tungsten) 313 are formed. Further, the glue layer (TiN) 312 and the metal (tungsten) 313 are planarized by the CMP.

Moreover, a diffusion preventive film 353, a metal layer 351 (Al (Cu)) and a diffusion preventive film 352 are sequentially formed. Then, the resist for forming the aluminum wiring 340 is subjected to coating, exposing and developing. Hereat, a stepped portion (a step pattern preset in the mask Mx+1C) formed along with the formations of the holes 347A-347C is employed as an alignment mark for the alignment with the base. Thereafter, the aluminum wiring 340 is formed by the RIE.

Figure 3:
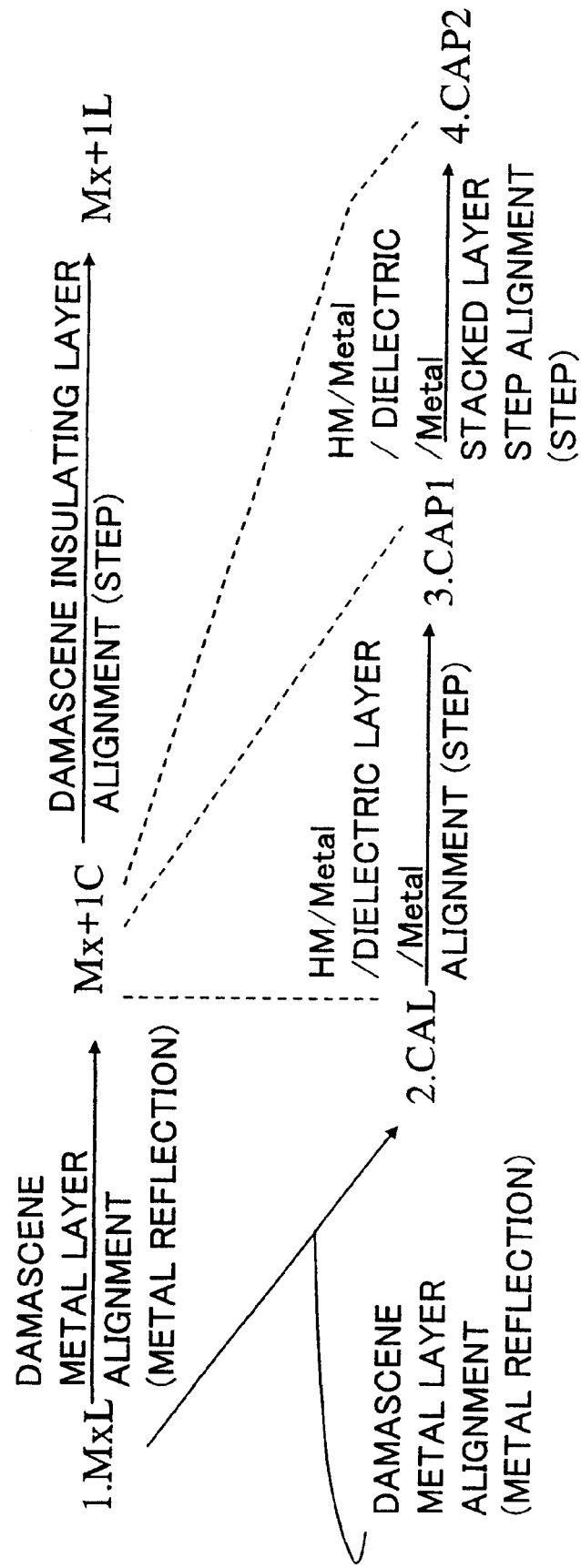
FIG. 3 is a view showing a basic alignment system.

FIG. 3 shows a basic alignment system. In FIG. 3, a left side (a rear area of an arrow) of a solid arrow line represents a mask for forming the base, and a right side (a tip of the arrow) of the solid arrow line represents a mask for forming an upper layer over the base. For example, MxL connotes a line of a x-th layer of the metal. MxL represents a mask for the pattern formation of the trench 309 of the Damascene wiring in FIG. 1.

Moreover, a dotted line represents a relationship between the masks for indirect alignment. For instance, the relationship between Mx+1C and CAL implies the indirect alignment made by using a metal reflection mark of the pattern formed by the mask MxL.

Further, Mx+1C represents a contact of an (x+1)th layer (a layer higher by one than the x-layer) of the metal. Mx+1C is a mask for forming, e.g., the holes 337A-337C in FIG. 1. Furthermore, CAL designates a capacitor alignment mark and is called a digging layer in the embodiment. Moreover, CAP denotes a capacitor layer and corresponds to the MIM structure. CAP1 represents a mask used for the pattern formation of the lower electrode. Further, CAP2 represents a mask used for the pattern formation of the upper electrode.

Moreover, in FIG. 3, alignment object detecting methods are written under and above the solid arrow line. For instance, for aligning the contact layer designated by Mx+1C with the metal wiring layer designated by MxL, the position is detected from a difference between the light reflection from the metal on the Damascene metal layer and the reflection from the interlayer insulating film.

Further, the alignment between the metal wiring layer by Mx+1L and the contact layer designated by Mx+1C, involves making use of a stepped portion formed in the interlayer insulating film on the Damascene wiring. This stepped portion is formed when forming the contact layer designated by Mx+1C.

Moreover, when forming the digging layer designated by CAL, likewise, the position is detected from the difference between the light reflection from the metal on the Damascene metal layer and the reflection from the interlayer insulating film. Next, the CAP1-mask pattern is aligned by use of the stepped portion formed in the digging layer designated by CAL, and the lower electrode of the MIM structure is formed. In FIG. 3, this stepped portion is described as a stepped portion within HM/Metal/dielectric insulating layer/metal interlayer insulating film. Herein, the HM (hard mask) indicates a nitride film or a carbide film (SiN or Sic) at the uppermost area of the MIM structure 360 in FIG. 1. Further, the stepped portion in the interlayer insulating film implies the mark 350 formed at the interlayer insulating film 303 in the right side area in FIG. 1.

The CAP2-mask pattern is aligned by use of the step embedded in the mask CAP1, and the upper electrode of the MIM structure is formed. In FIG. 3, this stepped portion is described as a HM/Metal/dielectric insulating layer/Metal stepped portion.

In the process described above, however, another mask pattern is needed for forming the alignment mark in addition to the mask pattern for forming the MIM elements, and the number of processes increases due to the pattern formation, etching, etc. Moreover, for the formations of the MIM elements, as to the formations of the metal layers (e.g., the lower and upper electrodes of TiN), processes are required separately from the normal element forming processes or the wiring processes, and, an increase in the number of processes occurs for building up the normal structure.

By the way, the MIM structure is formed just above the Damascene wiring structure (the metal wiring 311), and the lower electrode of the MIM structure is backed by the Damascene wiring, thereby reducing parasitic resistance and enabling a Q-value in a high frequency circuit to be improved (refer to, e.g., Japanese Patent Application Laid-Open Publication No. 2003-264235).

Even in the processes shown by this technology, however, similarly to those shown in FIG. 1, there are the processes for forming the lower electrode, the dielectric insulating layer and the upper electrode, respectively, resulting in an increase in the number of film forming processes.

Moreover, the improvement of characteristics of the MIM structure 360 also needs to reduce the parasitic capacitance by disposing the elements as far from the substrate as possible.

Still further, in the case of backing the lower electrode of the MIM structure by the Damascene wiring, a requirement for not exposing the metal (Cu) configuring the Damascene wiring to the etching gas, is to cover the Damascene wiring with the diffusion preventive film. Alternatively, it is required that the Damascene wiring be embraced in a planar area of the electrode of the MIM structure, and a degrees of freedom of the wiring layout pattern declines. Namely, the wiring can not be laid out over a border line of the planar area of the electrode of the MIM structure, and therefore needs leading out to the lower layer wiring. Accordingly, it follows that a lead wiring of the electrode exists in the layer vicinal to the substrate. An option of disposing the capacitance element as far from the substrate as possible, leads to a reduction in the parasitic capacitance, and hence, with this construction, though effective in reducing the parasitic resistance, a problems arises in terms of the parasitic capacitance.

Note that it is also considered to make the alignment for the pattern formation of the MIM structure by detecting the stepped portion in the diffusion preventive film for covering the Damascene wiring employed for this technology. This stepped portion is, however, as low as approximately 70 nm and has a difficulty of its being detected.

Such being the case, in the following embodiment, the number of the processes due to the addition of the mask pattern and the number of the processes required for forming the electrodes, are restrained down to the minimum, and further effective reductions in the parasitic resistance and the parasitic capacitance are schemed.

To be specific, in the embodiment, the increase in the number of mask patterns is restrained by embedding the MIM structure into the wiring layer, and the increase in the number of the processes is restrained by partially sharing the normal processes. Furthermore, the reduction in the parasitic capacitance to the substrate and the reduction in the electrode resistance on this occasion are schemed by migrating the MIM structure to a much higher layer of the wiring layer.

Therefore, in the following embodiment, the MIM structure is disposed not inside the metal wiring (e.g., the silicon oxide film 333 defined as the interlayer insulating film in FIG. 1) but in an upper area of a plug layer (tungsten layer) connected to a much higher layer of the dual Damascene structure (the interlayer insulating film 335) and in posteriority to the aluminum wiring layer. Moreover, the glue layer covering tungsten forming the plug layer is utilized as a lower electrode of the MIM structure. On the other hand, the aluminum wiring layer of the upper layer of the plug layer is utilized as an upper electrode. Still further, on this occasion, the mark pattern of the plug layer is utilized for the mask pattern alignment between the electrode and the dielectric insulating film.

With this construction, (1) the process of forming the electrode of the MIM structure and the process of the pattern formation of the aluminum wiring layer are shared, (2) the mask (CAL) for forming the digging layer is not employed, and the step pattern is embedded into the plug layer. As a result, as shown in FIGS. 1 through 3, it is possible to reduce the number of the processes for the MIM structure embedded into the Damascene layer, the number of the mask patterns, the parasitic capacitance to the substrate and the electrode resistance.

First Embodiment

The semiconductor device according to a first embodiment of the invention will hereinafter be described with reference to the drawings in FIGS. 4A through 16A. In the semiconductor device, the metal (Al) wiring and the plug layer of tungsten are formed on the upper layer of the Damascene structure, and the MIM elements are formed in a way that decreases the addition of the number of the processes to the greatest possible degree. The processes of manufacturing the semiconductor device will be explained.

Figure 4B:
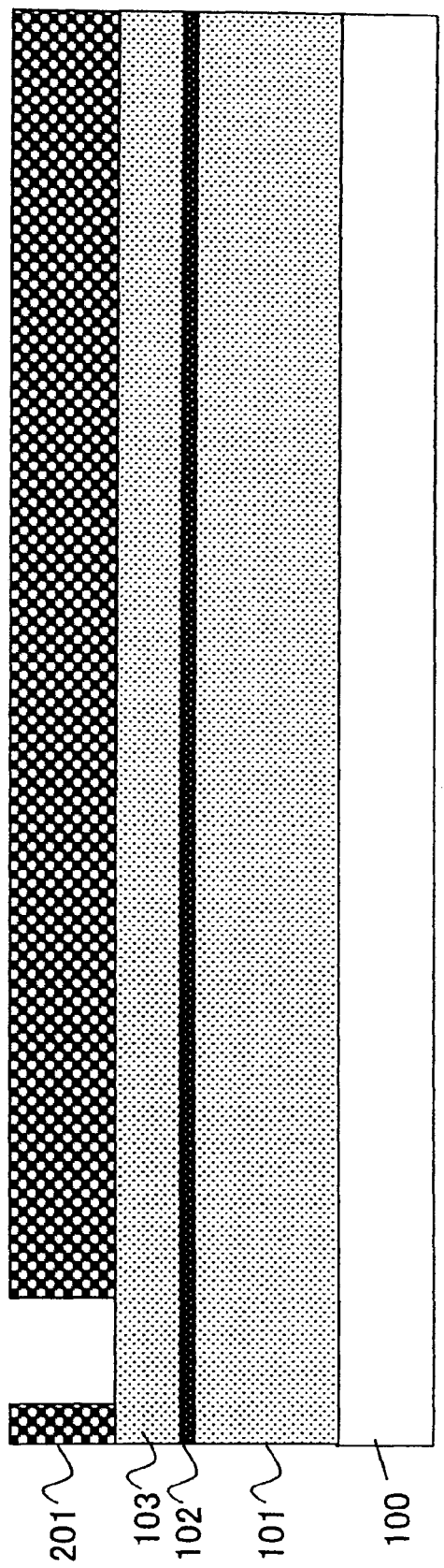
FIG. 4B is a view (of a mark area) showing a process of forming the interlayer film and the stopper film and effecting the patterning in order to form the Damascene wiring of metal (Cu)

Herein, FIGS. 4A-15B include pairs of drawings as FIGS. 4A and 4B are paired. Throughout the drawings, FIGS. nA (n=4 through 15) show the structures of the MIM area and of the normal area on one sheet of semiconductor substrate. Further, FIGS. nB (n=4 through 15) show the structures of the mark areas formed in other areas on the same semiconductor substrate. Herein, the MIM area represents an area where the MIM structure is built up, the normal area represents an area where the substantial elements or wirings of the semiconductor device are formed, and the mark area represents an area where the alignment mark for the alignment is formed. FIGS. nB, however, illustrate basically the same processes as the processes shown in the drawings in FIGS. nA.

FIG. 4A shows the process of forming the interlayer insulating film and the stopper film and effecting the patterning thereon in order to form the Damascene wiring of the metal (Cu). Further, FIG. 4B shows the same process as the process in the mark area.

As shown in FIG. 4A (and FIG. 4B), to start with, an interlayer insulating film (e.g., $SiO_2$) 101 is formed on a semiconductor substrate 100. It should be noted that the substrate 100 described in the specification of the application includes not only the semiconductor substrate itself but also a semiconductor substrate formed with a semiconductor device such as a transistor. The semiconductor substrate may also be a semiconductor substrate that is allowed to be formed further with one or more wiring layers.

Subsequently, a silicon nitride film 102 (SiN 50 nm) functioning as a stopper film when etching the wiring, is formed. This type of silicon nitride film is also referred to as the stopper film. Subsequently, an interlayer insulating film 103 (e.g., $SiO_2$ 400 nm) for insulating the wiring is formed. Next, a photoresist 201 serving as a wiring pattern mask is subjected coating, exposing and developing, thereby forming the wiring pattern. Thus, the desired patterns are formed in the MIM area and the normal area (FIG. 4A). Further, the patterns similar to those in the MIM area and the normal area are formed also in the mark area (FIG. 4B).

Moreover, the interlayer insulating film 103 is, the photoresist 201 being used as a mask, etched by a plasma etching method employing, e.g., a fluorocarbon-series (CF) etching gas (hereinafter, the fluorocarbon-series gasses are expressed by chemical formulae such as CF, CHF, $CF_4$, $C_4F_8$ and $C_4F_6$). In a state where the silicon nitride film 102 functioning as the etching stopper film is exposed, and then the etching stops. With this process, a trench 110A in the Damascene wiring (see FIG. 5A) is opened down to the silicon nitride film 102.

Subsequently, a photoresist 201 is removed by the plasma asking that uses the oxygen ($O_2$) gas etc. Subsequently, in a way that employs a trench pattern of the interlayer insulating film 102 formed earlier as a window of the mask, the etching stopper film 102 is removed by the etching that uses a mixture gas of CF or CHF etc. The trench 110A in the Damascene wiring is opened down to the interlayer insulating film 101.

Figure 5A:
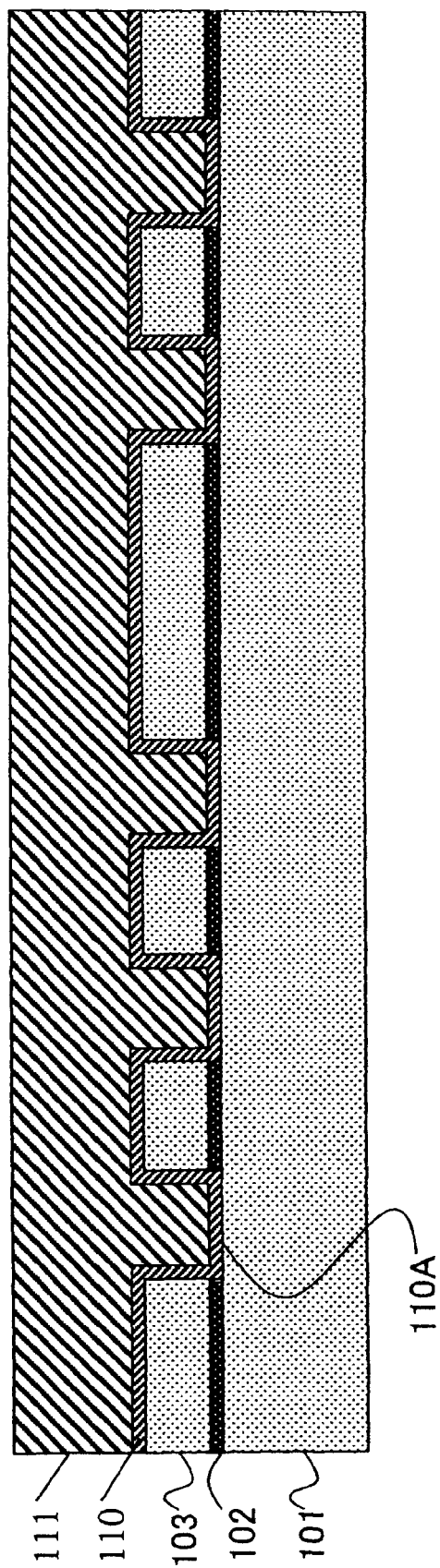
FIG. 5A is a view (of the MIM area and the normal area) showing a process of forming a metal layer (Cu) and a barrier metal film (Ta) by sputtering and plating within a trench.
Figure 5B:
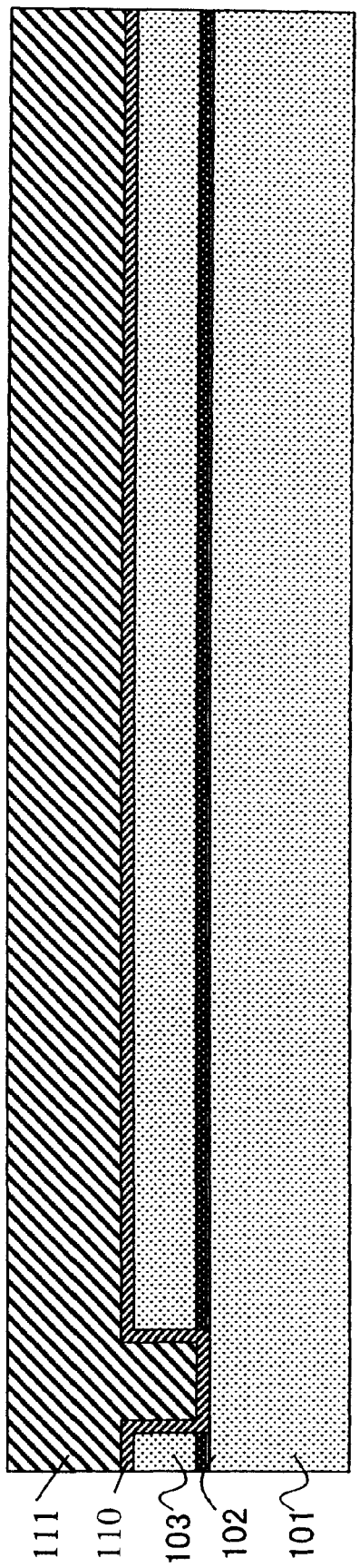
FIG. 5B is a view (of the mark area) showing a process of forming the metal layer (Cu) and the barrier metal film (Ta) by the sputtering and the plating within the trench.

FIG. 5A (and FIG. 5B) is a view showing the process of forming a metal layer 111 (Cu) and a barrier metal film 110 (Ta) by sputtering and by plating within the trench (incidentally, in FIG. 5A, the semiconductor substrate 100 is omitted (which will hereinafter be the same)). Namely, for instance, the barrier metal film 110 is formed by employing the sputtering method, and subsequently the metal layer 111 (corresponding to a first wiring layer according to the invention, which is, e.g., a Cu film having a thickness of 1000 nm) by the plating method. Hereat, subsequently to the formation of the barrier metal film 110, a seed film (unillustrated) is formed, by the same sputtering method, from the same material as the metal layer 111 to a thickness on the order of 100 nm, and the metal layer 111 can be formed so as to reach a desired thickness by the plating method, wherein the seed film serves as an electrode layer.

Figure 6B:
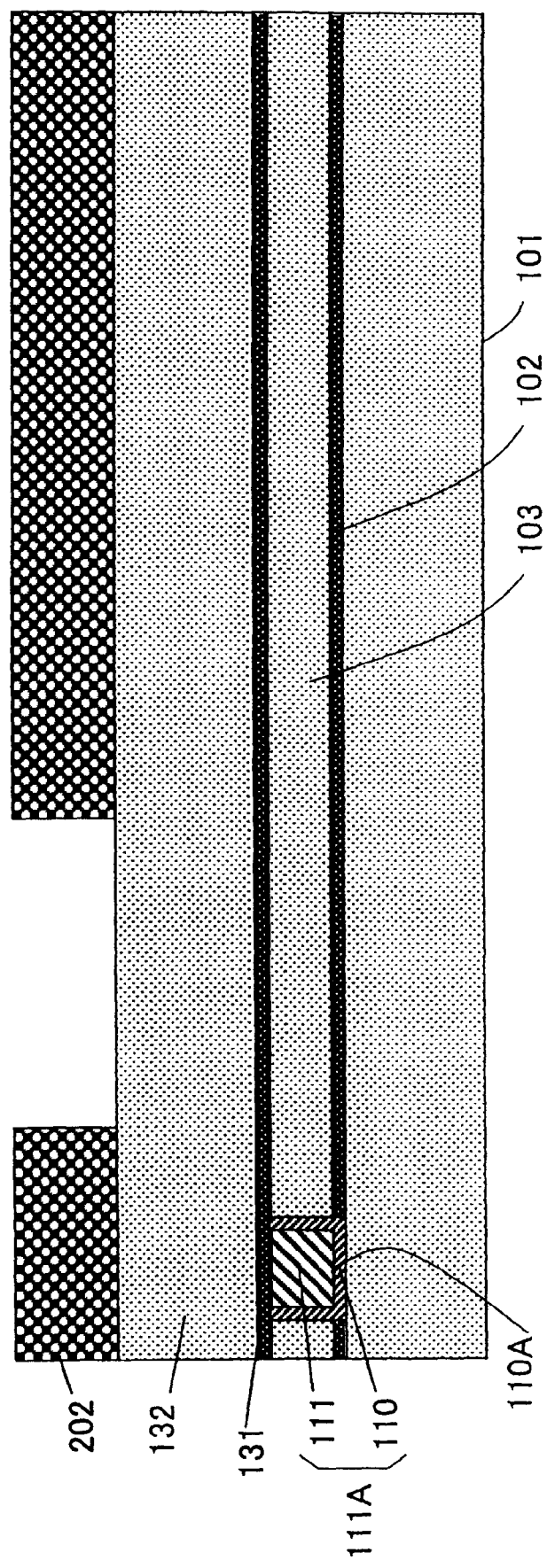
FIG. 6B is a view (of the mark area) showing a process of forming the hole on the Damascene wiring.

FIG. 6A (and FIG. 6B) is a view showing the process of forming a hole in the Damascene wiring. At first, extra films on the metal layer 111 and the barrier metal film 110 on the interlayer insulating film 103 are removed by a chemical mechanical polishing (CMP) method. As a result, the metal layer 111 and the barrier metal film 110 are planarized so that the layer 111 and the film 110 are left within only the trench 110A formed in the interlayer insulating film 103 and the etching stopper film 102. A Damascene wiring 111A including the metal layer 111 and the barrier metal film 110 is formed in the MIM area, the normal area (FIG. 5A) and the mark area (FIG. 5B), respectively (see FIG. 6A).

Subsequently, a diffusion preventive film 131 is formed on the Damascene wiring layer in which the metal layer 111 and the barrier metal film 110 are embedded in the interlayer insulating film 103. The diffusion preventive film 131 has a function as the etching stopper film in the etching process effected later on and a metal diffusion preventive function from the metal layer 111. The diffusion preventive film 131 is composed of, e.g., nitride silicon (SiN) and is formed up to 70 nm by the plasma CVD method. Subsequently, an interlayer insulating film (e.g., $SiO_2$ 600 nm) 132 (see FIG. 6A) is formed.

Subsequently, as shown in FIG. 6A, a photoresist 202 is subjected to coating, exposing and developing, thereby forming a hole pattern (e.g., an opening dimension is 500 nm). As illustrated in FIG. 6B, in the embodiment, when forming this hole pattern, in the mark area, a trench or a hole having a comparatively wide breadth is formed. The trench or the hole in this mark area is used as an alignment mark 150 for the alignment on a higher layer. The alignment mark 150 will hereinafter be also termed the mark 150.

Herein, the alignment of the hole pattern with the pre-layer involves utilizing a pattern of the Damascene wiring 111A of the lower layer. On this occasion, a position of a predetermined pattern within the Damascene wiring 111A of the base is detected by making use of a difference in reflectance of the light between the metal layer 111 and the interlayer insulating film 103 that are viewed via an interlayer insulating film 132, whereby the hole pattern may be aligned.

Figure 7A:
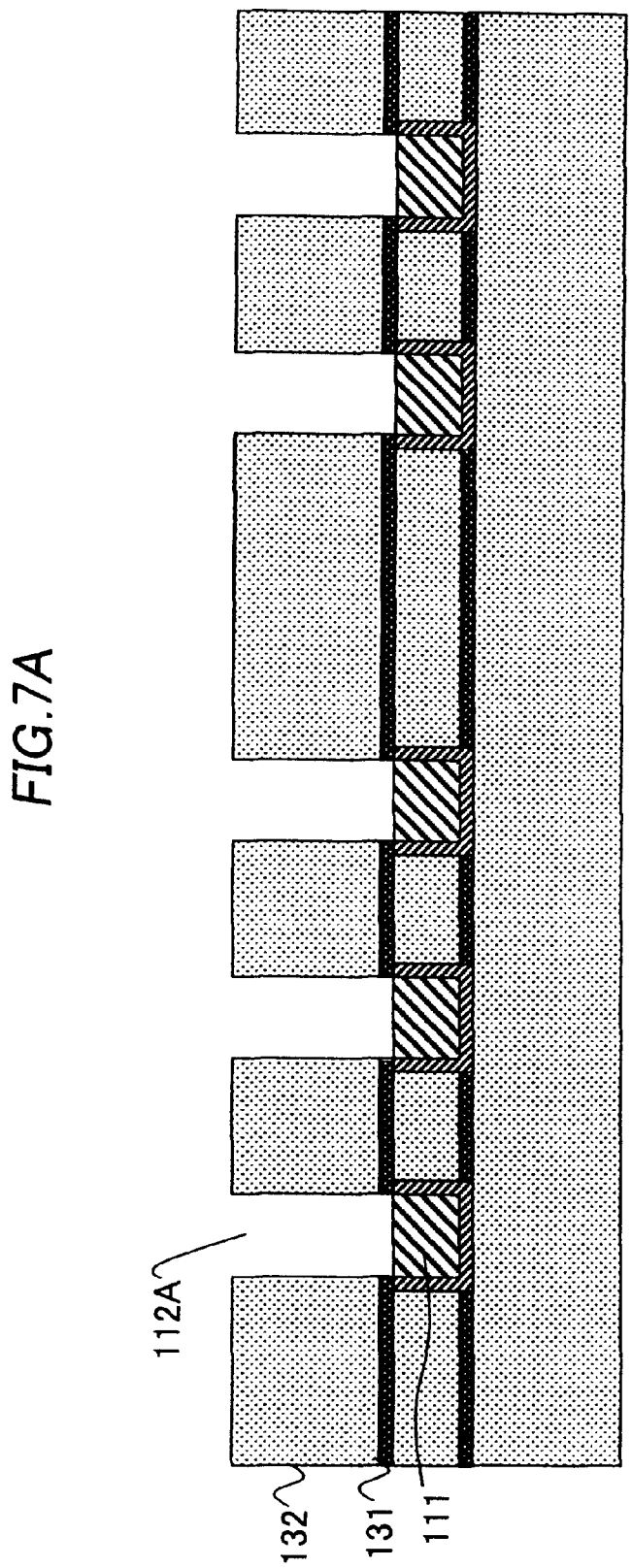
FIG. 7A is a view (of the MIM area and the normal area) showing a process of forming a pattern of an interlayer insulating film 132 and a process of removing a diffusion preventive film 131.

FIG. 7A (FIG. 7B) is a view showing a pattern formation process of the interlayer insulating film 132 and a removal process of removing the diffusion preventive film 131. At first, as shown in FIG. 6A, the photoresist 202 is used as a mask, and the interlayer insulating film 132 is plasma-etched by use of, e.g., the CF-series etching gas. This etching stops at on the diffusion preventive film 131 functioning as the stopper film. A hole 112A is thereby formed in the interlayer insulating film 132.

Figure 7B:
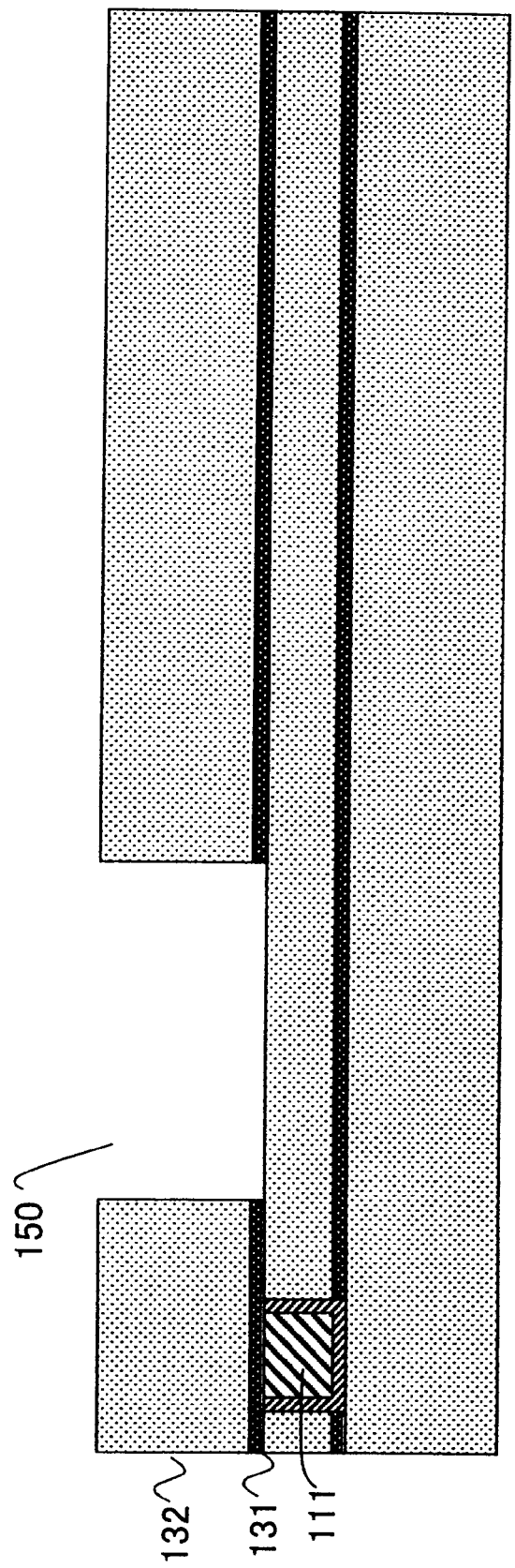
FIG. 7B is a view (of the mark area) showing the process of forming the pattern of the interlayer insulating film 132 and the process of removing the diffusion preventive film 131.

Subsequently, the photoresist 202 is removed by the plasma asking that uses the oxygen ($O_2$) gas. Next, with the interlayer insulating film 132 used as a mask, the diffusion preventive film 131 is removed by the plasma etching that employs, e.g., the CF-series or CHF-series mixture gas. The Damascene wiring (the metal layer 111) is thereby exposed. Namely, the hole 112A is opened down to the metal layer 111. Note that at this time, as shown in FIG. 7B, a step pattern (which will hereinafter be called a mark 150) of a wide groove or hole etc is simultaneously formed in the mark area.

FIG. 8A (FIG. 8B) is a view showing a metal layer forming process. To start with, a glue layer 112 (corresponding to a first metal layer according to the invention. For example, the layer 112 is formed out of TiN up to 150 nm) by the sputtering method. Subsequently, a metal layer 113 (which is formed out of, e.g., tungsten (W) up to 300 nm, and corresponds to a second metal layer according to the invention) by the CVD method. As shown in FIG. 8A, a configuration is such that a pattern of a hole 112A having a width of approximately 500 nm is formed in the MIM area and the normal area, and, after forming the glue layer 112, the metal (tungsten) is embedded by the CVD method.

As illustrated in FIG. 8B, the pattern of the comparatively wide mark 150 for the alignment is formed (with an opening dimension of approximately 2 microns through 5 microns) in the mark area. This opening dimension is set to such a dimension that even when the upper layer pattern is formed uniformly in an isotropic aspect, the opening is not embedded thoroughly. Accordingly, for instance, if the metal layer 113 is formed up to 300 nm while the glue layer 112 is formed up to 150 nm, though there is a possibility that the width might be narrowed by 450 nanometers (nm) on one side and by 900 nanometers (nm) on both sides of the opening, the mark area is not thoroughly embedded on condition that the opening dimension on the order of 2 microns through 5 microns is ensured. Further, the interlayer insulating film 132 is formed in thickness of 600 nm while the diffusion preventive film 131 is formed up to 70 nm, and hence the stepped portion in the mark area is not completely embedded but remains. This stepped portion is utilized for the alignment with the base pattern after the metal layer is formed over the entire surface of the substrate in a subsequent process and if unable to make the alignment making use of the reflection from the metal layer. Namely, the alignment is conducted by making use of a change in the optical reflection due to the stepped portion in the mark 150.

Figure 9A:
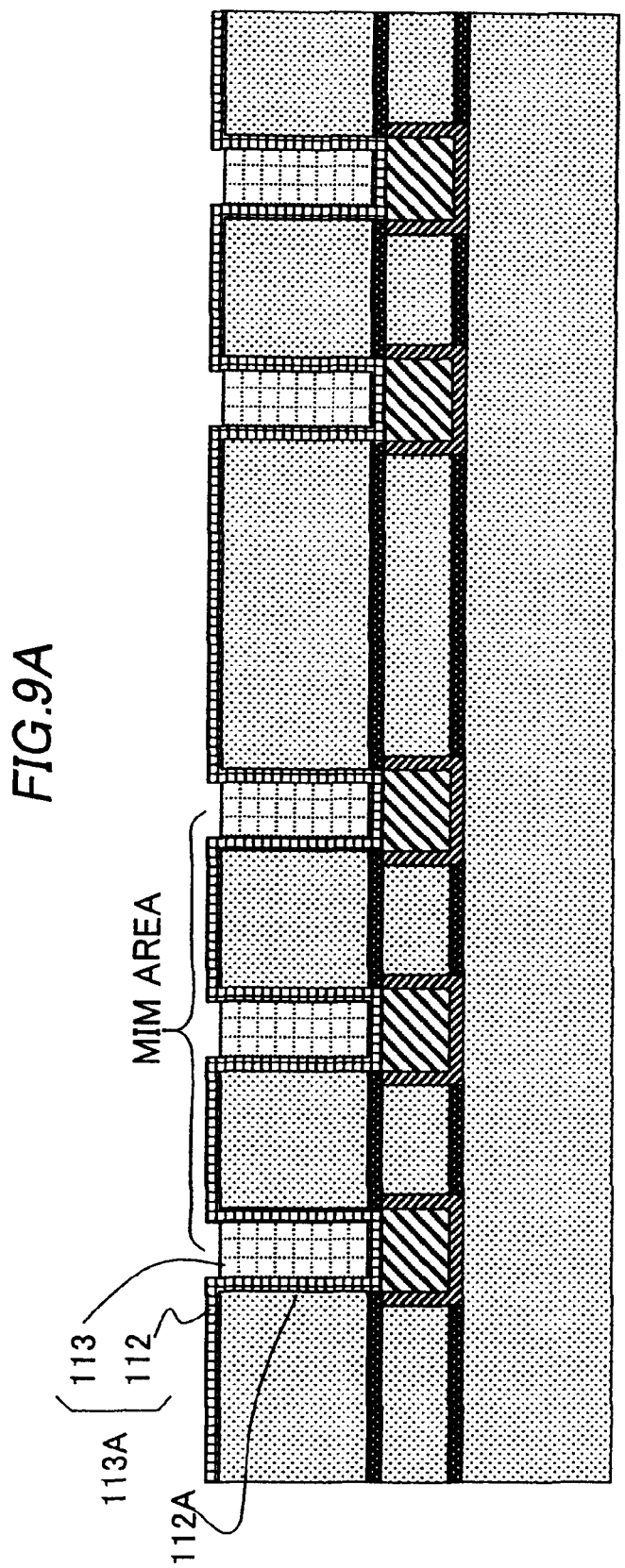
FIG. 9A is a view (of the MIM area and the normal area) showing a CMP process of the metal layer.

FIG. 9A (FIG. 9B) is a view showing a CMP process for the metal layer 113. As shown in FIG. 9A (FIG. 9B), the metal layer 113 is removed by the CMP method so that the glue layer 112 remains. In this case, as shown in FIG. 9A, the metal layers 113 are left in an embedded state in the holes 112A in the MIM area and in the normal area. A plug layer 113a including the glue layer 112 and the metal layer 113 is thereby formed. Further, as shown in FIG. 9B, in the mark area, in a state where the stepped portion in the mark 150 remains, the metal layer 113 is left.

Herein, when removing the metal layer 113 by the CMP method, in order to avoid occurrence of a residue on the surface of the metal layer 113 so formed as to be embedded into the hole 112A, a proper degree of over-polishing (excessive polishing) is applied. On this occasion, there is a case in which a stepped portion might be produced between the glue layer 112 and the metal layer 113 as shown in FIG. 9A.

FIG. 10A (FIG. 10B) shows a process of forming a pattern that will become the lower electrode in the MIM area. As illustrated in FIG. 10A, a photoresist 203 undergoes coating, exposing and developing, whereby the lower electrode pattern is formed in the MIM area. Hereat, the base of the photoresist 203 is a metal layer over the entire surface, and therefore the difference in reflectance between the metal material and the insulating layer is unable to be utilized. For this reason, the pattern of the photoresist 203 is aligned with the base by making use of the stepped portion (see FIG. 10B) in the pre-formed mark 150. At this time, as shown in FIG. 10B, a pattern 203A for conducting the next alignment is further prepared in the mark area.

Figure 11A:
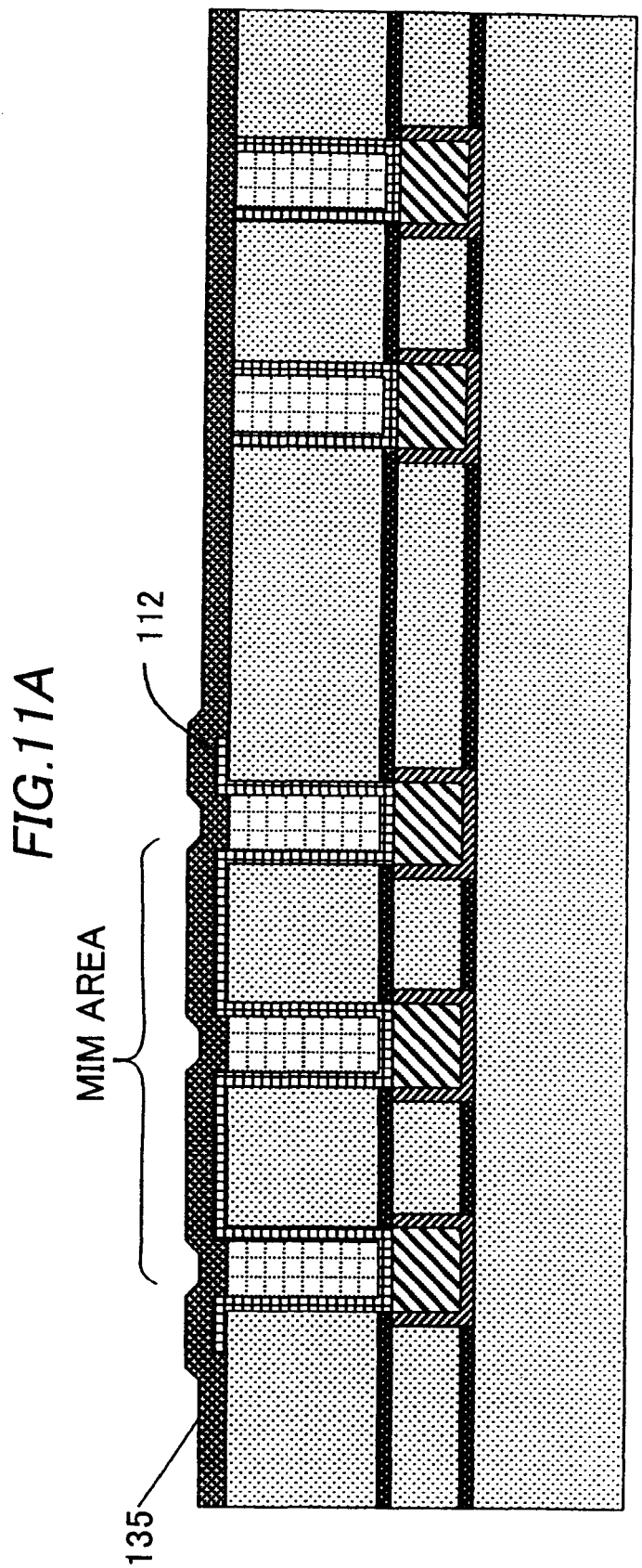
FIG. 11A is a view (of the MIM area and the normal area) showing a process of forming the dielectric insulating film 135 serving as a capacitance area of the MIM area.

FIG. 11A (FIG. 11B) shows a process of forming a dielectric insulating layer 135 that will become a capacitance element in the MIM area. In this process, the photoresist 203 being used as a mask (see FIG. 10A), the glue layer 112 is etched by the plasma etching that uses a gas of, e.g., chlorine ($Cl_2$) etc, and thereafter, the photoresist 203 is removed by the plasma asking that employs the oxygen ($O_2$) gas etc. Hereat, the metal layer 113 and the glue layer 112, which configure the lower electrode, are temporarily exposed.

Thereafter, as illustrated in FIG. 11A, the dielectric insulating layer 135 (which is formed out of, e.g., $SiO_2$ up to 50 nm) that will become the capacitance element in the MIM area is formed by using the plasma CVD method. At this time, in the mark area, the stepped portion in the mark 150 due to the metal layer 113 and the glue layer 112, which are formed earlier, is taken over.

It is to be noted that the material of the dielectric insulating layer 135 may involve using, as a substitute for $SiO_2$, SiON, SiCN, SiC, SiOC, SiN, etc. for forming an insulating film.

Figure 12A:
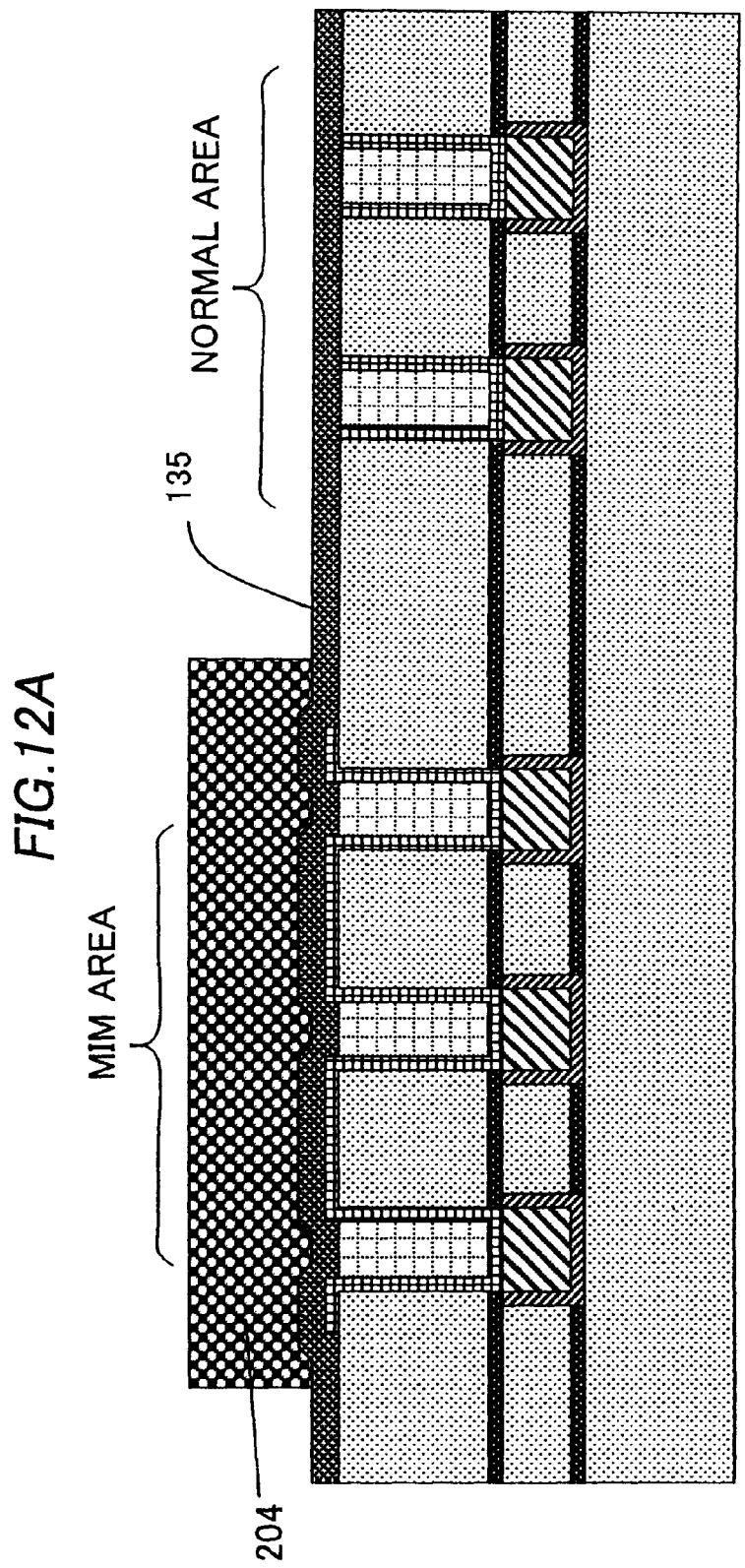
FIG. 12A is a view (of the MIM area and the normal area) showing a process in which a photoresist 204 for patterning the capacitance area of the MIM area is subjected to coating, exposing and developing.

FIG. 12A (FIG. 12B) shows a process in which a photoresist 204 for patterning the capacitance element in the MIM area is subjected to coating, exposing and developing. As shown in FIG. 12A, for forming the pattern becoming the capacitance element in the MIM area, the photoresist 204 is subjected to coating, exposing and developing. Simultaneously, as shown in FIG. 12B, a mark pattern 204A for the alignment in a process conducted later on, is formed also in the mark area.

Figure 13A:
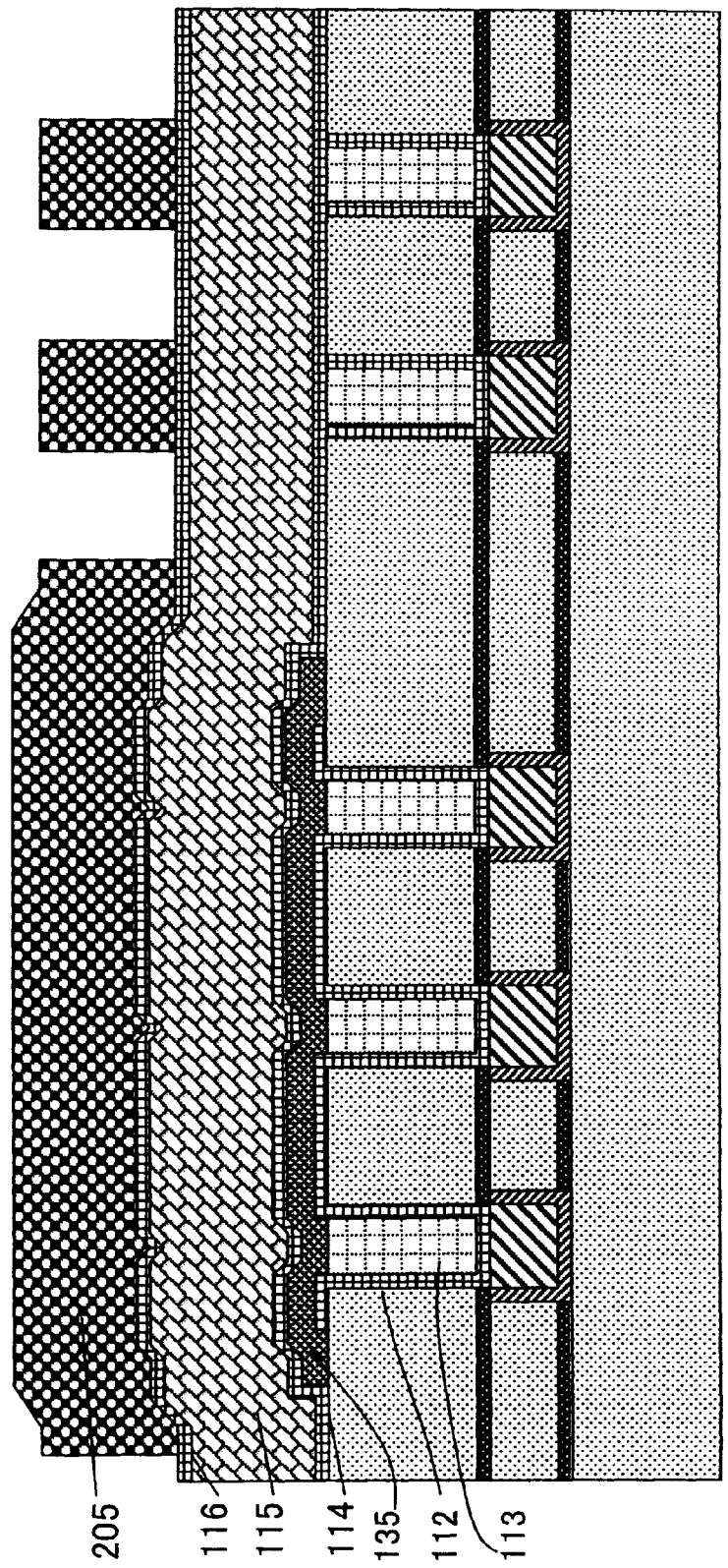
FIG. 13A is a view (of the MIM area and the normal area) showing a process of a pattern formation of the upper electrode.

FIG. 13A (FIG. 13B) is a view showing a process of forming the pattern of the upper electrode. As illustrated in FIG. 12A, the photoresist 204 being used as a mask, the dielectric insulating film 135 is removed by the plasma etching that uses the CF-series gas. Furthermore, the photoresist 204 undergoes asking, whereby the metal layer 113 and the glue layer 112 in the normal area are exposed from the surface. Subsequently, as shown in FIG. 13A, a barrier metal film 114 (which is formed out of, e.g., TiN up to 50 nm), a metal layer 115 (which is formed out of, e.g., AlCu up to 1000 nm) and a barrier metal film 116 (which is formed out of, e.g., TiN up to 50 nm) are sequentially formed by employing the sputtering method. At this time also, as illustrated in FIG. 13B, the stepped portion formed by the dielectric insulating film 135, the metal layer 113 and the glue layer 112 is taken over on the barrier metal film 116.

Further, as shown in FIG. 13A (FIG. 13B), the photoresist 205 is subjected to coating, exposing and developing, and an upper electrode pattern in the MIM area, a circuit pattern (FIG. 13A) in the normal area and a pattern (FIG. 13B) in the mark area are simultaneously formed. Hereat, the alignment is performed by using the stepped portion described earlier. When precisely aligned with the normal area, it may be sufficient to make use of a stepped portion MK1 (see FIG. 13B) produced by the glue layer 112, the metal layer 113 and the dielectric insulating film 135, and, for precisely aligning with the MIM area, it may be sufficient to properly utilize the patterns (a stepped portion MK2, a stepped portion MK3, etc in FIG. 13B) in the mark area that are formed by the respective layers. It follows that selection as to which stepped portion is used changes depending on alignment accuracy and on how a degree of clearance of the pattern with respect to the pre-layer is taken. The discussion on the first embodiment proceeds in a mode of matching with the normal area.

Figure 14A:
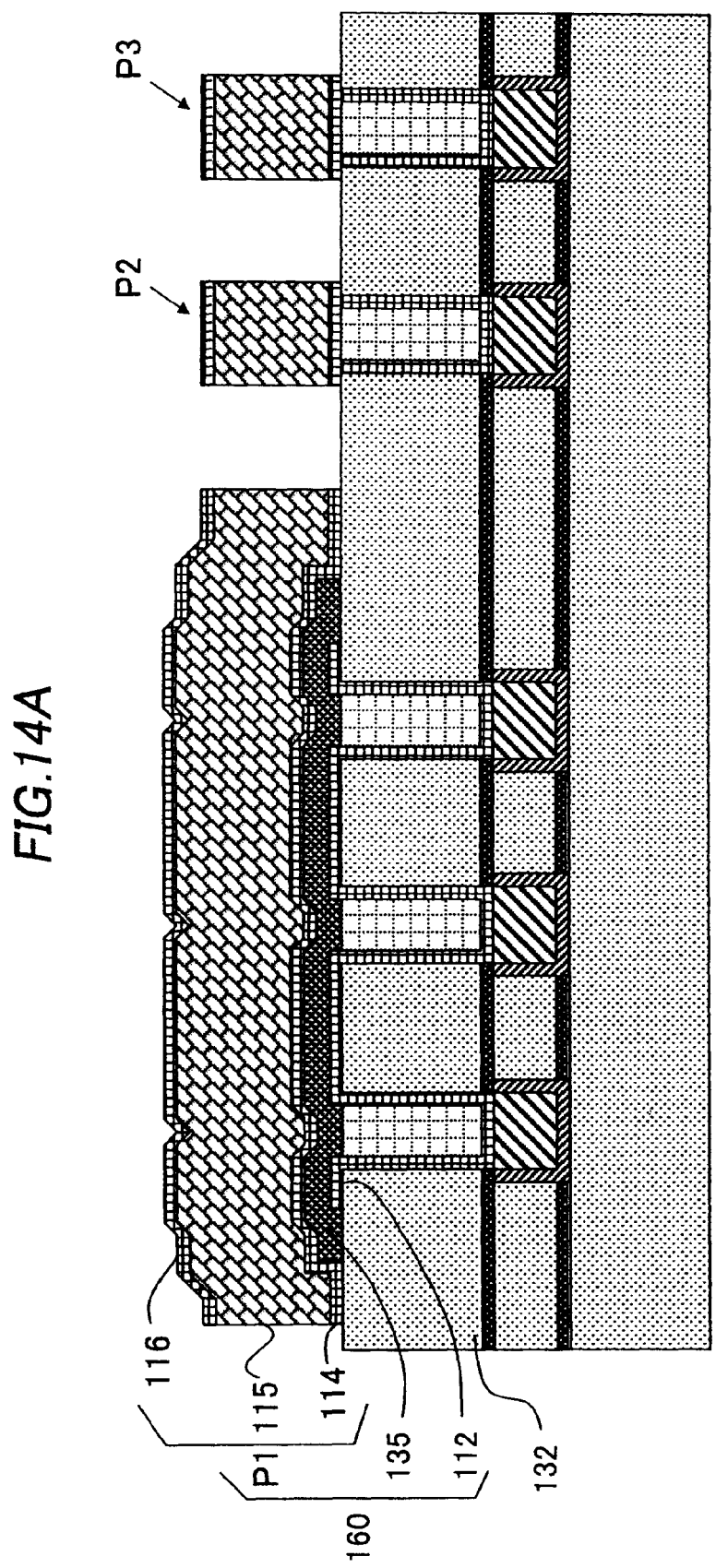
FIG. 14A is a view (of the MIM area and the normal area) showing a process of etching a barrier metal film 116, a metal layer 115 and a barrier metal film 114.
Figure 14B:
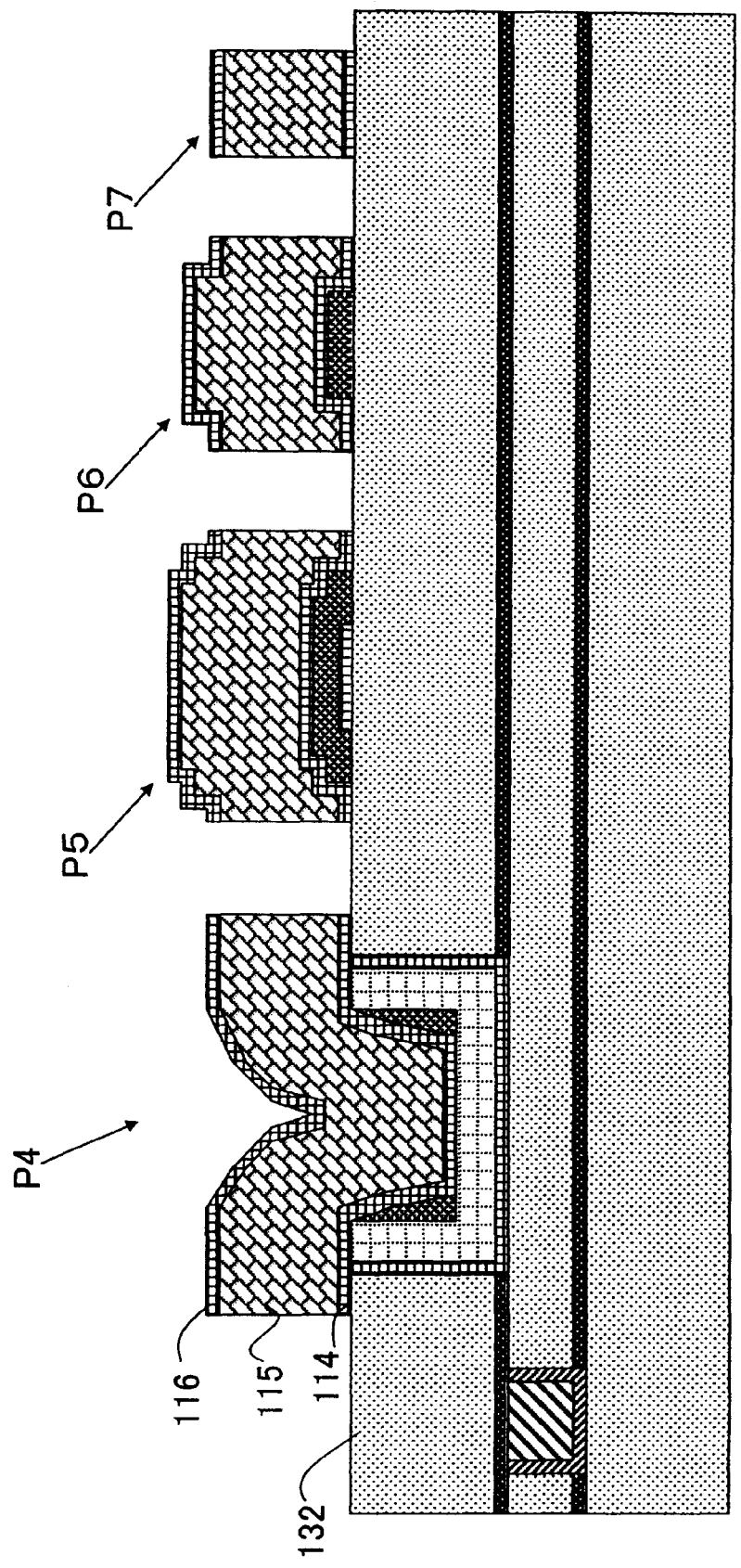
FIG. 14B is a view (of the mark area) showing the process of etching the barrier metal film 116, the metal layer 115 and the barrier metal film 114.

FIG. 14A (FIG. 14B) is a view showing an etching process of etching a barrier metal film 116, a metal layer 115 and a barrier metal film 114. In this process, as shown in FIG. 13A (FIG. 13B), the photoresist 205 serves as a mask. Namely, as illustrated in FIG. 14A (FIG. 14B), the barrier metal film 116, the metal layer 115 and the barrier metal film 114 are removed by the plasma etching that uses a chlorine-series (Cl) mixture gas etc till the interlayer insulating film 132 is exposed from the surface. Subsequently, the photoresist 205 is removed by the plasma asking that employs the $O_2$ gas etc. At this stage, an upper electrode P1 is formed in the MIM area, wirings P2, P3 are formed in the normal area, and alignment marks P4 through P7 for the alignment of the next layer are formed in the mark area in FIG. 14B.

Thus, the upper electrode P1 is formed on a wiring layer (corresponding to a second wiring layer according to the invention) composed of the barrier metal film 116, the metal layer 115 and the barrier metal film 114. Further, a MIM structure 160 is built up by the upper electrode P1, the dielectric insulating film 135 and the lower electrode (the glue layer 112).

As illustrated in FIG. 14A, the upper electrode P1 is larger in its step level from the interlayer insulating film 132 than the wirings P2, P3 in the normal area. This is because the interlayer insulating film 135 (and the glue layer 112 serving as the lower electrode) is pinched in between the lower layer portions of the upper electrode P1.

Figure 15A:
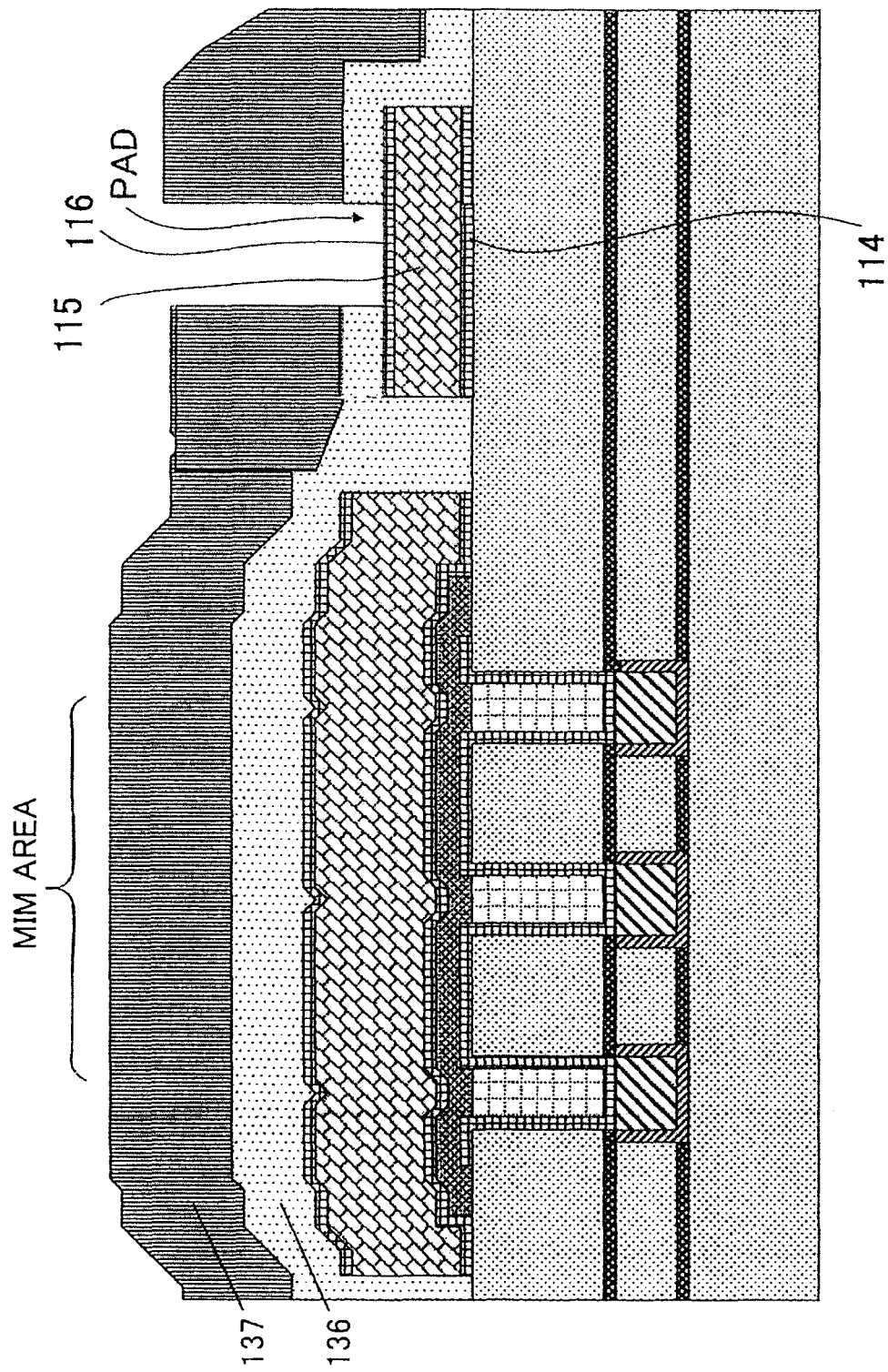
FIG. 15A is a view (of the MIM area and the normal area) showing a process of forming a cover structure.

FIG. 15A (FIG. 15B) is a view showing a film forming process for a cover structure. As shown in FIG. 15A (FIG. 15B), the cover structure is built up by forming an insulating film 136 (which is formed out of, e.g., $SiO_2$ up to 1400 nm) and an insulating film 137 (which is formed out of, e.g., SiN up to 500 nm). It is to be noted that, as illustrated by FIG. 15A, an Al wiring layer constructed of a barrier metal film 116, a metal layer 115 and a barrier metal film 114 is formed with a pattern that will become a pad. Then, a widow for exposing the Al wiring as will become the pad, is prepared on the cover structure by a photoresist etc. Then, an opening is formed by using the plasma etching etc, thereby enabling a connection area with the outside to be prepared.

Figure 15B:
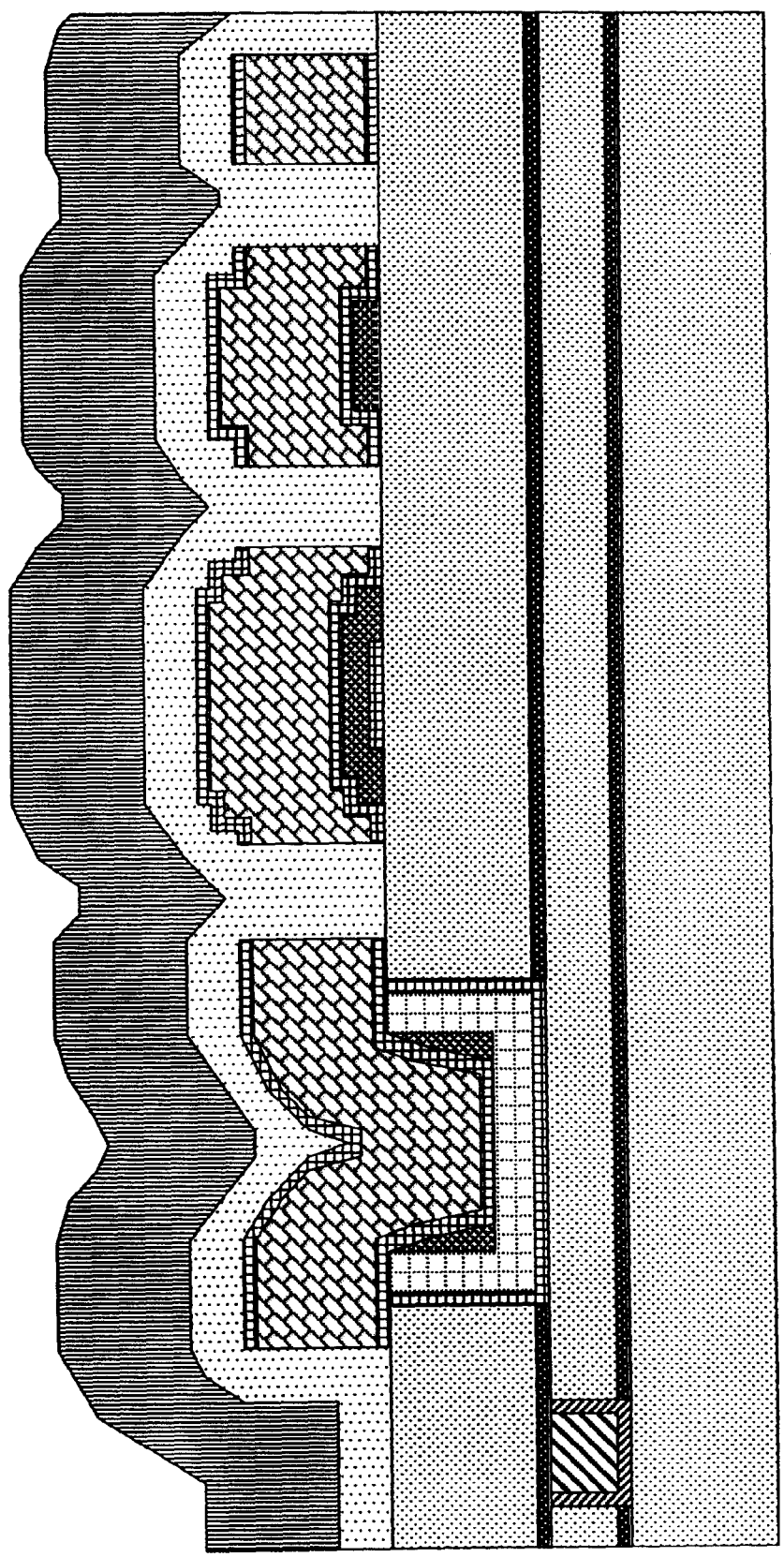
FIG. 15B is a view (of the mark area) showing the process of forming the cover structure.
Figure 15C:
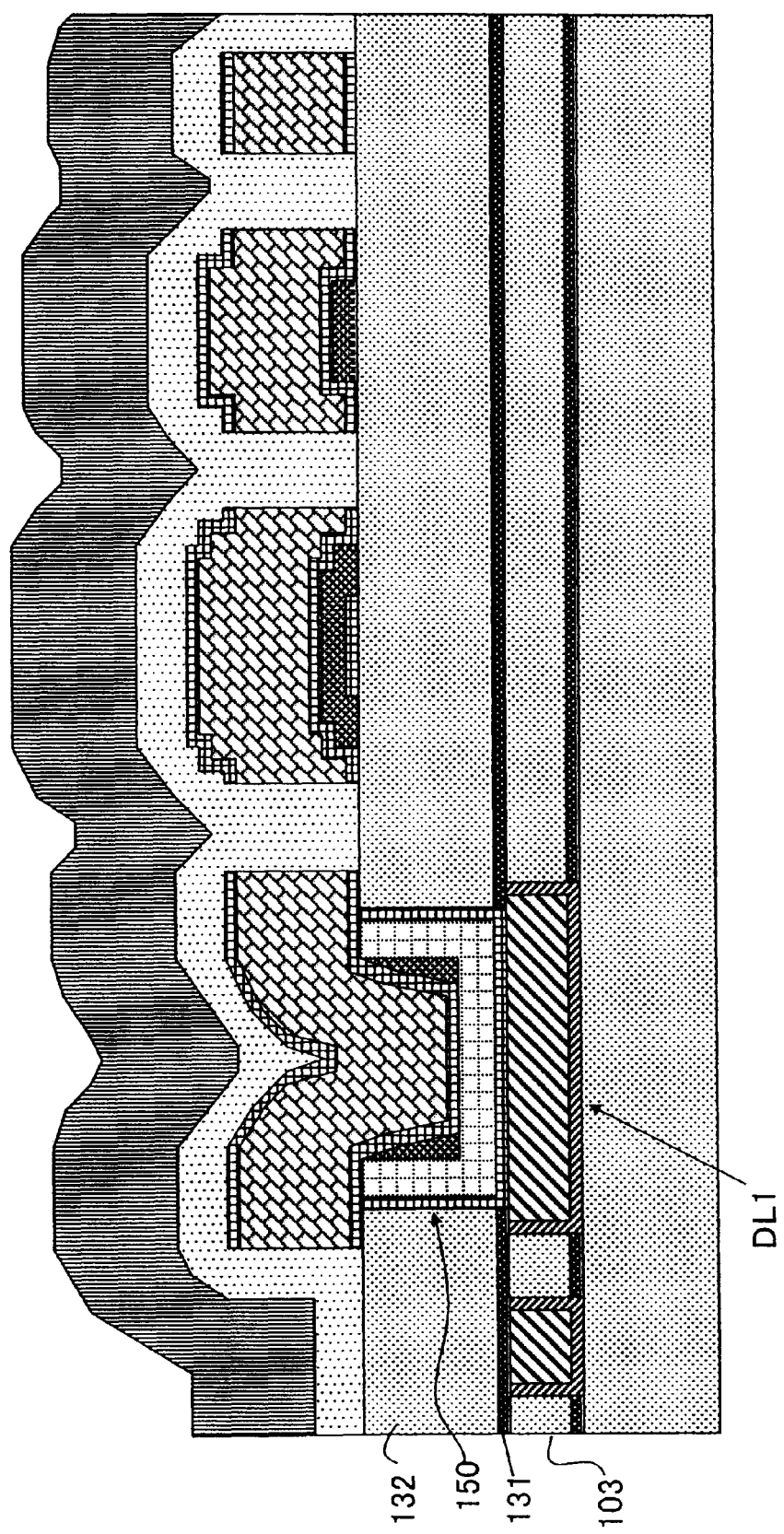
FIG. 15C is a view (a modified example) showing the process of forming the cover structure.

FIG. 15C shows an example of the semiconductor device, wherein a wiring pattern DL1 externally surrounding the area of the mark 150 as a next layer is prepared on the Damascene wiring layer in the mark area in FIG. 15B. This is a configuration in the case of desiring to avoid the surface exposure of the interlayer insulating film 103 of the Damascene wiring layer when forming the mark 150 of the next layer, or in the case of desiring to avoid damaging the interlayer insulating film 103 by the over-etching.

In this configuration, on the wiring pattern DL1, the mark 150 for the alignment is so formed as to be embraced by a plane area (an interior area of the width of the wiring pattern) of the wiring pattern. Accordingly, in the case of etching the stepped portion in the mark 150, the area of the interlayer insulating film 103 excluding the wiring pattern DL1 is protected by the diffusion preventive film 131 or by the interlayer insulating film 132. Hence, in the case of etching the stepped portion in the mark 150, when desiring to avoid the exposure of the interlayer insulating film 103 of the base, or if there is a possibility of damaging the base due to the over-etching etc, the configuration in FIG. 15C is effective. Accordingly, the configuration as in FIG. 15C may be properly adopted according to a process of the next layer.

FIGS. 16A through 16C are plan views with respect to the sectional structure built up by the processes explained in the first embodiment. In FIGS. 16A through 16C, the solid lines represent patterns of a barrier metal film 114, a metal layer 115 and a barrier metal film 116, which include the upper electrode P1. Further, the dotted line indicates a pattern of a dielectric insulating film 135, a one-dotted chain line represents the glue layer 112 serving as the lower electrode, the solid square lines each containing a cross-line represent hole patterns (including trenches and wide trenches each filled with a metal 113 such as tungsten, thus forming a plug layer 113A), and the elongate dotted line indicates a metal layer 111 (the Damascene wiring 111A). An X1-X2 portion in FIG. 16A corresponds to the sectional view in FIG. 15A. Similarly, a Y1-Y2 portion in FIG. 16B corresponds to the sectional view in FIG. 15B, and a Z1-Z2 portion in FIG. 16C corresponds to the sectional view in FIG. 15C.

As shown in FIG. 16A, the metal layer 111 (the Damascene wiring 111A) is connected via the plug layer 113A to the upper electrode P1 and the lower electrode (the glue layer 112). An example in FIG. 16A is that the upper electrode P1 embraces the area of the entire capacitance area (the dielectric insulating film 135) within the plane area, and, on the further internal side, the glue layer 112 as the lower electrode is formed. On the other hand, in the normal area, the normal wirings (the metal wirings 114 through 116 and the Damascene wiring 111A) functioning as a circuit area is formed.

In FIG. 16A, part of the upper electrode P1 extends outside of the existing area of the dielectric insulating film 135 upward in the plan view in FIG. 16A. This is because of forming an overlapping area in which the upper electrode P1 is overlapped with an extending area of the Damascene wiring 111A. This extending area P1A is required for forming the overlapping area between the upper electrode P1 and the Damascene wiring 111A in such a case that the upper electrode P1 is formed on the uppermost layer.

Moreover, in FIG. 16A, the extending area P1A is narrower in its lateral width (in right-and-left directions in FIG. 16A) than a main area (including inside the plane area of the dielectric insulating film 135) of the upper electrode P1. This configuration reduces the parasitic capacitance to the substrate to such a degree as to make the upper electrode P1 (the Al wiring) thinner.

FIG. 16B is a plan view with respect to the sectional view in FIG. 15B. As shown in FIG. 16B, the pattern (the mark 150) having a comparatively large wiring width illustrated also in the sectional view, is laid out in plane in the mark area. FIG. 16c is a plan view with respect to the sectional view in FIG. 15C, and shows an example of a case of forming the mark 150 on the Damascene wiring layer (the metal layer 111).

As described above, according to the semiconductor device in the first embodiment, the MIM structure defined as the capacitance element is built up, wherein just under the insulating films 136, 137 as the cover structure, i.e., the metal layer 115 and the barrier metal films 114, 116, which are defined as the uppermost wiring layer, are constructed as the upper electrode P1. Further, the lower electrode of the MIM structure is constructed of the metal (tungsten) layer 113 formed as the lower layer with the dielectric insulating film 135 being sandwiched in between the upper electrode P1 and the metal layer 113, and of the glue layer 112 for forming the metal layer 113. Accordingly, for example, as compared with the case of building up the MIM structure between (the interlayer insulating film 333) the metal wiring 311 as the Damascene wiring layer as shown in FIG. 1 and the holes 337A-337C corresponding to the plug layer 113A, the MIM structure can be built up on the much higher layer (i.e., the metal wirings 114-116 on the uppermost layer can be formed as the upper electrode P1 by embedding the plug layer 113A in the lower electrode).

Thus, in the semiconductor device in the first embodiment, the MIM structure is built up, wherein the metal wirings 114-116 disposed farthest from the semiconductor substrate 100 shown in FIG. 4A serve as the electrode. Therefore, the construction that reduces the parasitic capacitance of the MIM structure to the greatest possible degree can be attained.

Moreover, the metal wirings 114-116 serving as the upper electrode P1 are connected to the Damascene wiring 111A just thereunder through the glue layer 112 and the metal layer (tungsten) 113 that configure the plug layer 113A. Furthermore, the lower electrode itself is constructed of the glue layer 112 and the metal layer 113 and is connected to the Damascene wiring 111A just thereunder. Therefore, the construction that reduces the parasitic resistance of the MIM structure to the greatest possible degree can be attained.

Moreover, as a result of taking the structure described above, the stepped portion of the patterning-subjected alignment mark 150 of which the pattern is formed with the same mask as the mask for forming the holes 112A for embedding the glue layer 112 and the metal layer (tungsten) 113 that configure the plug layer 113A, can be used for the alignment with the lower layer (i.e., the plug layer 113A) when patterning the lower electrode (and the upper electrode P1 as the necessity may arise) of the MIM structure. Hence, there is no necessity of patterning, with the mask provided separately independently, the alignment mark for patterning the lower electrode of the MIM structure. Therefore, for instance, as compared with the case of building up the MIM structure between the metal wiring 311 as the Damascene wiring layer as shown in FIG. 1 and the holes 337A-337C serving as the plug layer 113A, it is possible to reduce the number of the masks and the number of the patterning processes.

Still further, the stepped portion in this alignment mark 150 is formed in the same process as the layer of the hole 112A is formed, and hence the opening dimension and the depth can be selected so that the stepped portion keeps a sufficient level even when stacked with the upper layer pattern. It is therefore feasible to obtain the higher detection accuracy and the higher detection reproducibility than in the case of detecting the stepped portion in the diffusion preventive film for covering the Damascene wiring.

Second Embodiment

A second embodiment of the invention will hereinafter be described with reference to the drawings in FIGS. 17A through 18B. The first embodiment takes the construction, wherein, as shown in FIG. 16A, the plane area, on which the upper electrode P1 is projected towards the lower layer, embraces the plane area of the pattern of the dielectric insulating film 135. Conversely, however, such a construction is allowable that the plane area of the upper electrode P1 is partially included in the area of the dielectric insulating film 135 or the area of the lower electrode (the glue layer 112). Namely, the construction may be taken, wherein the plane area of the dielectric insulating film 135 or the plane area of the lower electrode (the glue layer 112) embraces at least partially the plane area of the upper electrode P1. The second embodiment exemplifies this type of semiconductor device. Other configurations and operations of the semiconductor device in the second embodiment are the same as those in the first embodiment. This being the case, the same components are marked with the same numerals and symbols, and their explanations are omitted.

Figure 17A:
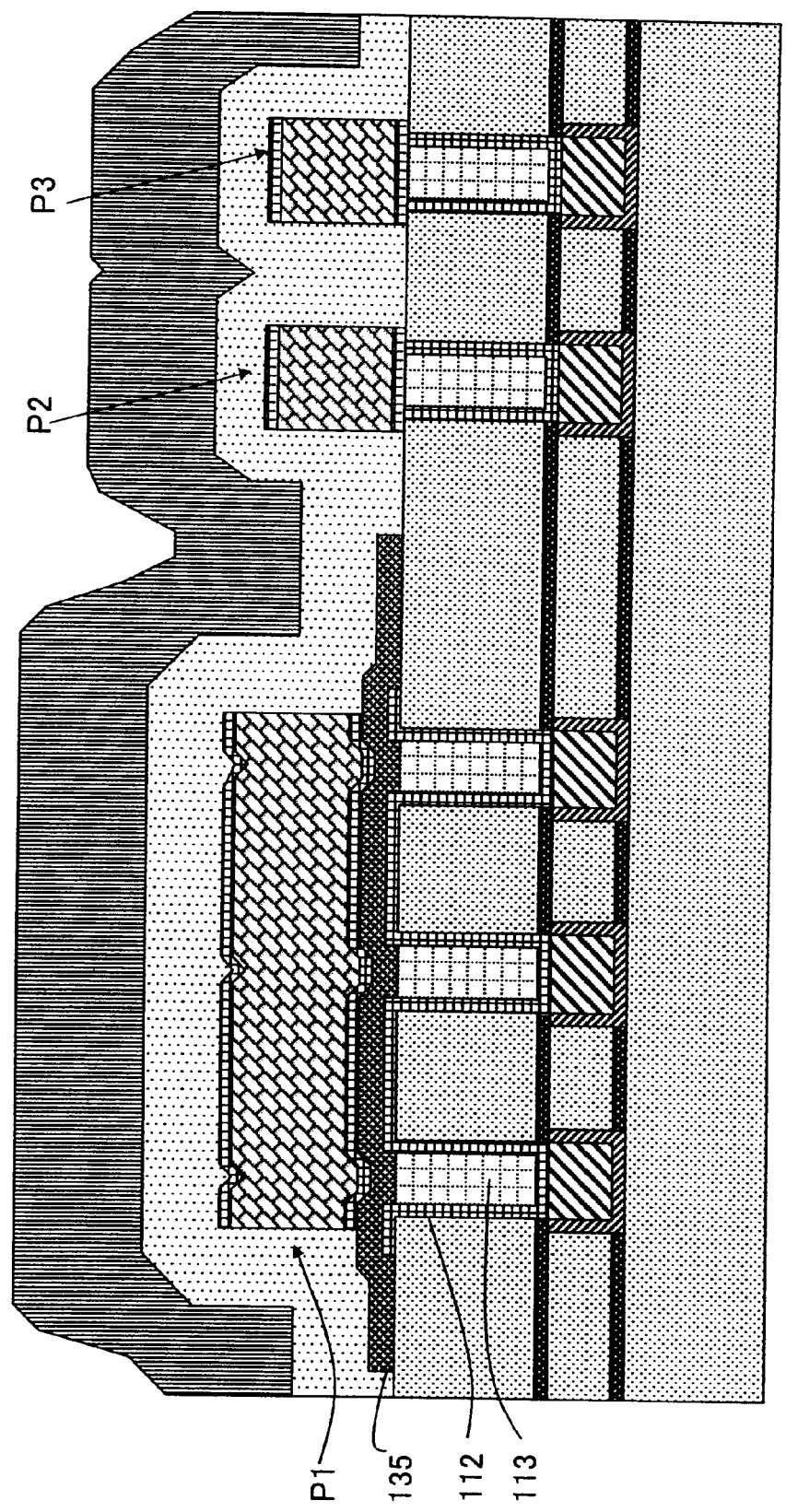
FIG. 17A is a sectional view of the MIM area and the normal area of the semiconductor device according to a second embodiment of the invention.

FIG. 17A shows the MIM area and the normal area of the semiconductor device according to the second embodiment. As illustrated in a sectional view in FIG. 17A, the upper electrode P1 in the MIM area is internally embraced by the plane area of the dielectric insulating film 135 or the plane area of the lower electrode (the glue layer 112). This structure is actualized by conducting, in the etching of the upper electrode P1 explained earlier, the etching process in a way that renders the width of the photoresist 205 shown in FIG. 13A narrower than the width of the dielectric insulating film 135 and by stopping this etching process at on the dielectric insulating film 135. On the other hand, in the normal area, the same configurations (the wirings P2, P3) as those in the first embodiment are provided.

Figure 17B:
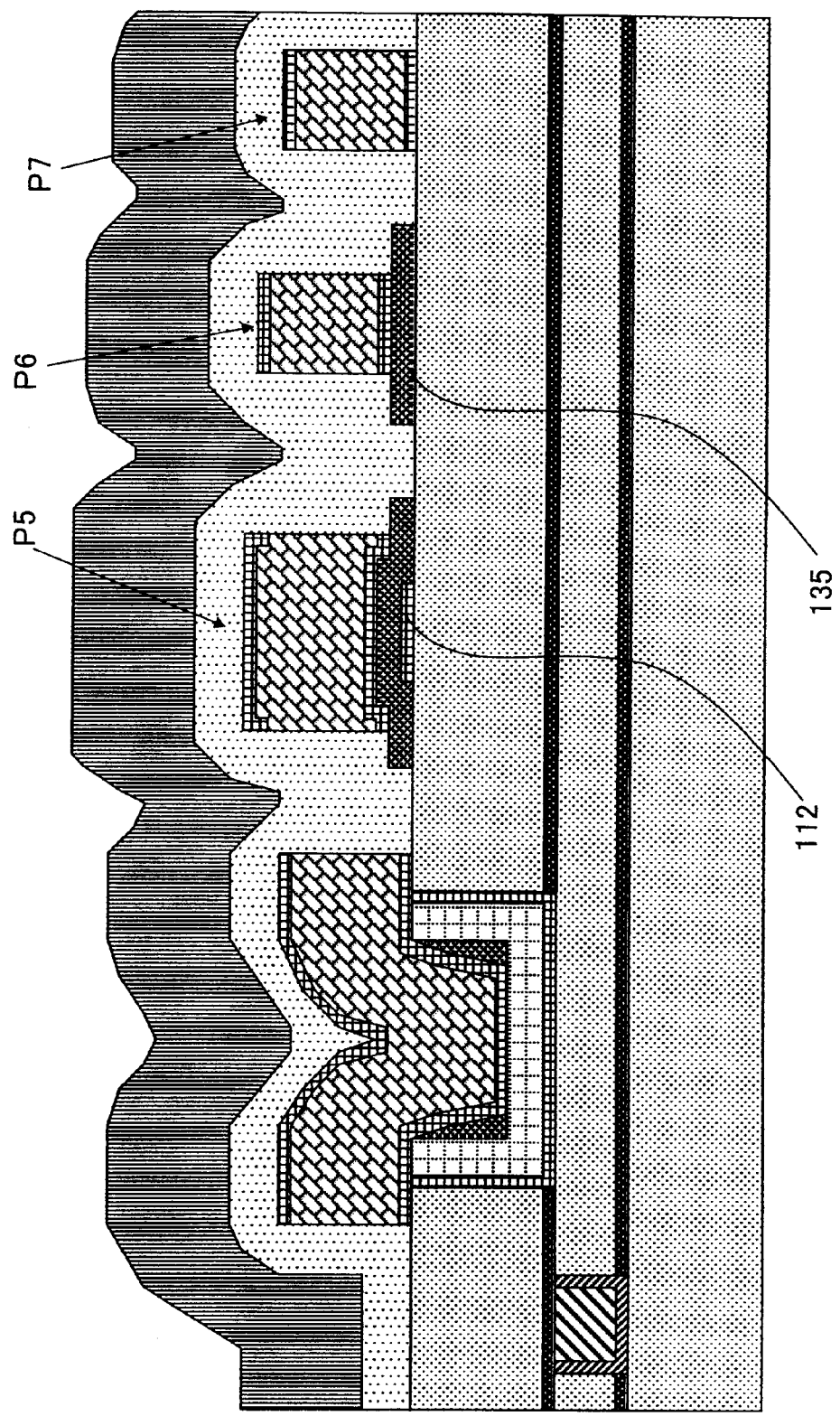
FIG. 17B is a sectional view of the mark area of the semiconductor device according to the second embodiment of the invention.

FIG. 17B shows a sectional view of the mark area of the semiconductor device according to the second embodiment. In FIG. 17B, marks P5, P6 of the same layer as the upper electrode P1 are internally embraced by the dielectric insulating film 135. In the same way as in the first embodiment, however, the plane area of the marks P5, P6 of the same layer as the upper electrode P1 may be allowed to internally embrace the plane area of the dielectric insulating film 135.

FIG. 18A shows a plan view of the semiconductor device configuring (corresponding to) the sectional view in FIG. 17A. On the plan view in FIG. 18A, part of the upper electrode P1 extends over the existence of the dielectric insulating film 135 upwards in the plan view in FIG. 18A. This is because of forming an overlapping area in which the upper electrode P1 is overlapped with an extending area of the Damascene wiring 111A. This extending area P1A is required for forming the overlapping area between the upper electrode P1 and the Damascene wiring 111A in such a case that the upper electrode P1 is formed on the uppermost layer.

Moreover, in FIG. 18A, the extending area P1A is narrower in its lateral width (in right-and-left directions in FIG. 18A) than a main area (embraced internally by the plane area of the dielectric insulating film 135) of the upper electrode P1. This configuration, as in the case of FIG. 16A, can reduce an area size of the upper electrode P1 in the area extending between the inside and the outside of the existence area (the dielectric insulating film 135) in the MIM structure. As a result, the parasitic capacitance to the substrate can be decreased to such a degree as to make the upper electrode P1 (the Al wiring) thinner.

FIG. 18B shows a plan view of the semiconductor device shown by the sectional view (FIG. 17B) of the mark area. This plan view illustrates an example in which wiring patterns 114-116 used for the upper electrode/normal wirings are embraced in an interior of the area of the dielectric insulating film 135.

Third Embodiment

A third embodiment of the invention will hereinafter be described with reference to the drawings in FIGS. 19 through 23. In the first embodiment and the second embodiment, the hole 112A configuring the plug layer 113A takes the rectangular shape roughly similar to a square shape in its section. The sectional shape of the hole 112A is not, however, necessarily limited to such shapes. The third embodiment will give a description of a modified example of the sectional shape of the hole 112A of the plug layer 113A for connecting the Damascene wiring to the upper/lower electrodes and the normal wiring area. Other configurations and operations in the third embodiment are the same as those in the cases of the first embodiment and the second embodiment. This being the case, the same components as those in the first embodiment and the second embodiment are marked with the same numerals and symbols, and their explanations are omitted.

In FIG. 19, the hole 112A (the area filled with the metal layer 113) takes a rectangular shape in section that is different in its lengths in the vertical direction and the lateral direction, and is formed in a grooved shape. The hole 112A is formed in this grooved shape, thereby making it possible to reduce the resistance between the glue layer 112 forming the lower electrode and the metal layer 113 and the resistance of the connection to the Damascene wiring 111A from the lower electrode.

FIG. 20 shows, in addition to the construction in FIG. 19, a construction of widening the width of the Damascene wiring area (the metal layer 111). With this construction, the parasitic resistance of the wiring area leading from the MIM electrode can be reduced.

FIG. 21 shows a construction, wherein the width of the Damascene wiring area in FIG. 20 remains widened, and there is increased the number of the holes 112A of the plug layer 113A connecting the lower electrode (the glue layer 112) to the Damascene wiring 111A. With this construction also, in the same way as in FIGS. 19 and 20, it is possible to reduce the resistance parasitic to the lower electrode, i.e., the resistance between the glue layer 112 forming the lower electrode and the metal layer 113 and the connecting resistance to the Damascene wiring 111A from the lower electrode.

FIG. 22 shows a construction, wherein a groove-shaped pattern PAT1 different in its length in the vertical direction and in the lateral direction of the sectional shape is combined with a rectangular pattern PAT2 approximate to the normal square as the hole 112A of the plug layer 113A connecting the lower electrode to the Damascene wiring 111A by utilizing the wide wiring breadth of the Damascene wiring 111A (the metal layer 111) in FIG. 20. This construction also leads to the reduction in the parasitic resistance of the lower electrode in the same way as in FIGS. 19 through 21.

Figure 23:
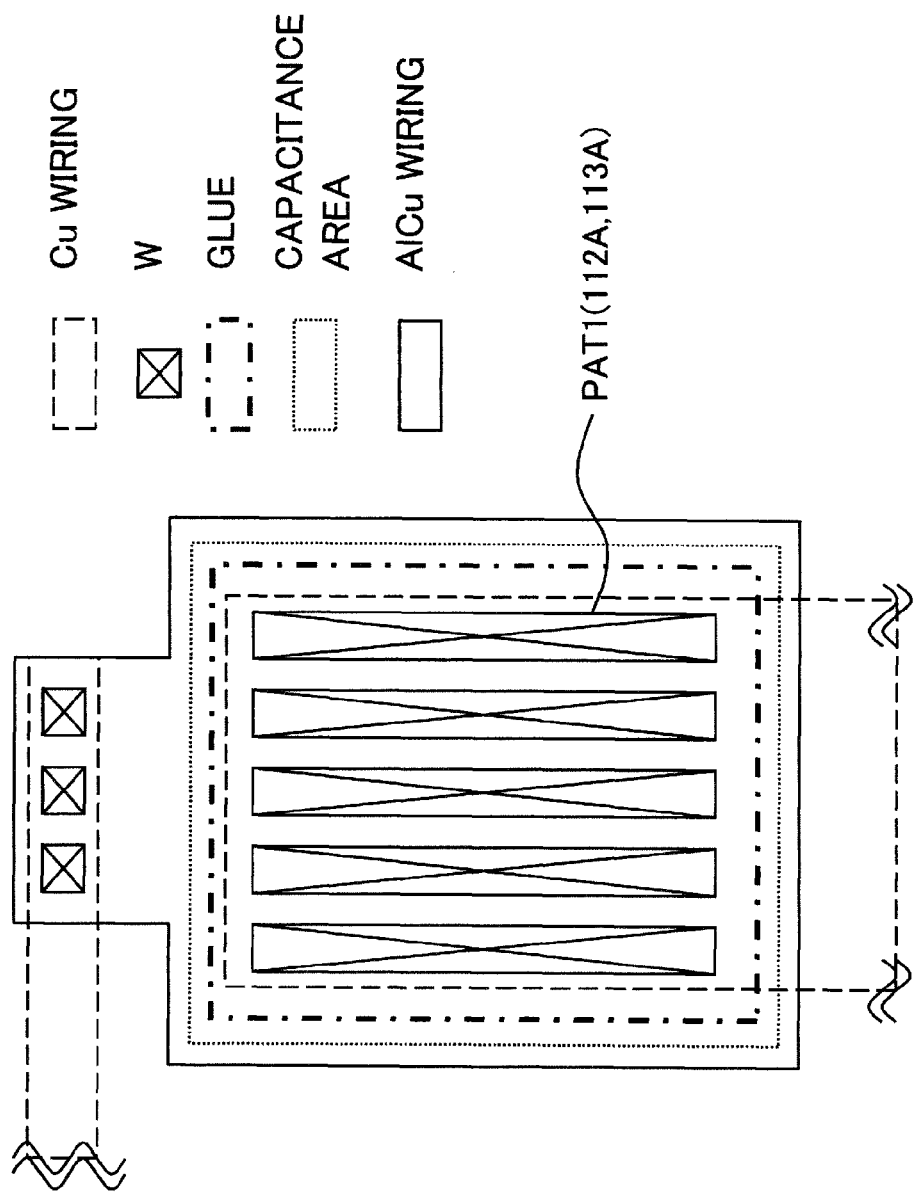
FIG. 23 is a view of a modified example in which the width of the Damascene wiring area is expanded, and the sectional shape of the hole is a rectangular shape different in its length in the vertical direction and in the lateral direction.

FIG. 23 shows a construction, wherein the wide wiring breadth of the Damascene wiring 111A (the metal layer 111) in FIG. 20 is utilized, and further there are disposed a plurality of groove-shaped patterns PAT1 each different in its length in the vertical direction and in the lateral direction of the sectional shape as the holes 112A of the plug layer 113A connecting the lower electrode to the metal layer 111. This construction also reduces the parasitic resistance of the lower electrode.

Fourth Embodiment

The semiconductor device according to a fourth embodiment of the invention will hereinafter be described with reference to the drawings in FIGS. 24 through 26. In the first through third embodiments, the plug layer 113A leading to the Damascene wiring 111A from the lower electrode (the glue layer 112, the metal layer 113) is basically formed under the lower electrode. Further, the hole 112A of the plug layer 113A is disposed on the underside (the plane area on the interlayer insulating film where the dielectric insulating film 135 is projected towards the lower layer) of the dielectric insulating film 135 and on the underside (the plane area on the interlayer insulating film where the upper electrode P1 is projected towards the lower layer) of the upper electrode P1.

The fourth embodiment will exemplify the semiconductor device, wherein the hole 112A leading out of the lower electrode of the MIM structure to the Damascene wiring 111A is not disposed on the plane area on the underside of the upper electrode P1. Other configurations and operations in the fourth embodiment are the same as those in the first and second embodiments. This being the case, the same components as those in the first through third embodiments are marked with the same numerals and symbols, and their explanations are omitted.

Figure 24:
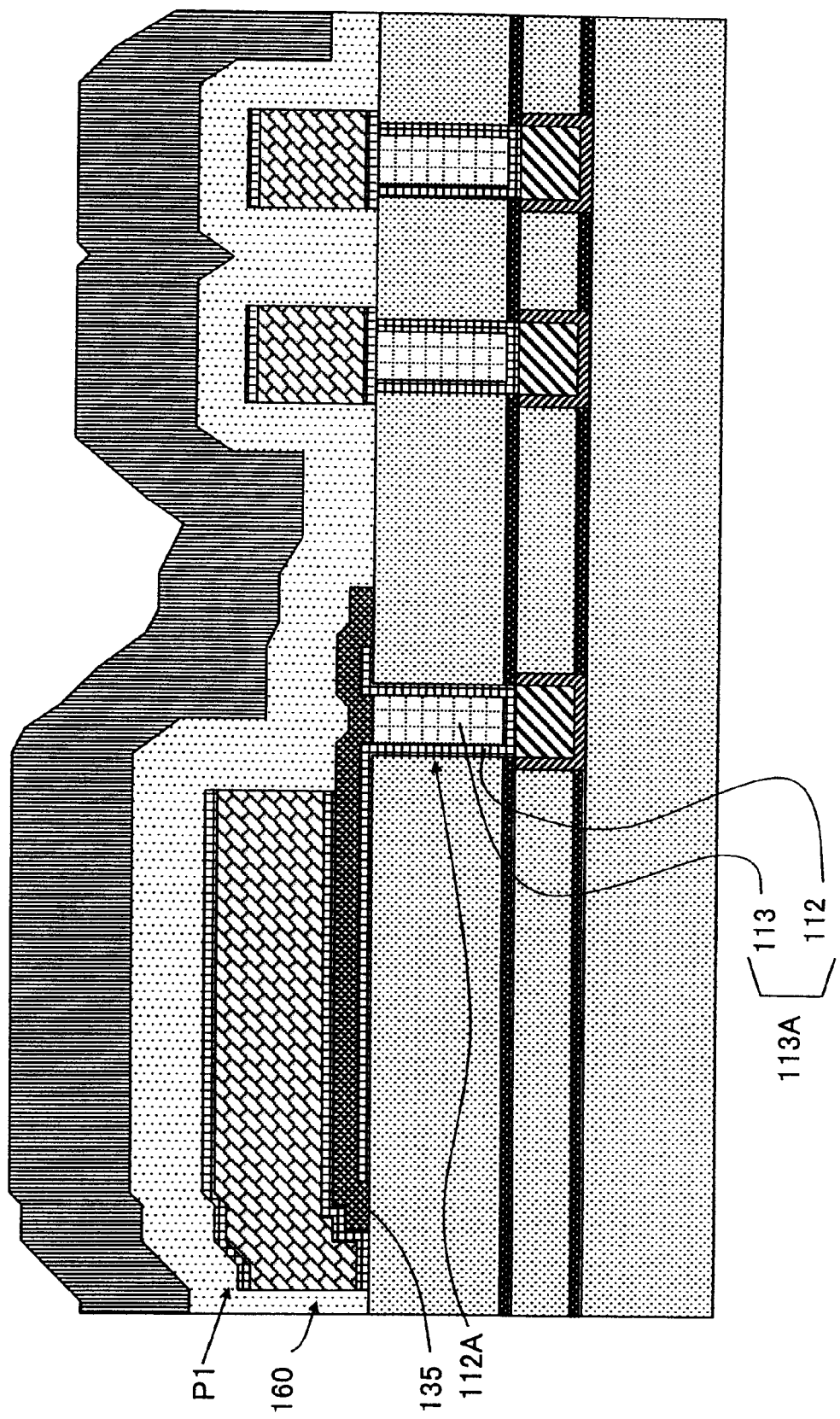
FIG. 24 is a sectional view showing the semiconductor device in which the hole led from the lower electrode of the MIM structure to the Damascene wiring, is not disposed under an upper electrode P1.

As shown in FIG. 24, in the left side area of the MIM structure 160, the upper electrode P1 extends leftwards from the plane area of the dielectric insulating film 135. On the other hand, in the right side area of the MIM structure 160, the lower electrode (the glue layer 112) and the dielectric insulating film 135 extend rightwards from the plane area of the upper electrode P1.

Further, none of the hole 112A of the plug layer 113A for the connection is disposed in the area where the upper electrode P1 is overlapped with the lower electrode (the area of the glue layer 112), i.e., on the side of the lower electrode in the area serving as the capacitance element. The hole 112A filled with the metal layer 113 is formed on the right side of the area serving as the capacitance element in the drawing, namely in the area where the lower electrode and the dielectric insulating film 135 further extend on the right side from the plane area on which the upper electrode P1 is projected towards the lower layer.

Figure 25:
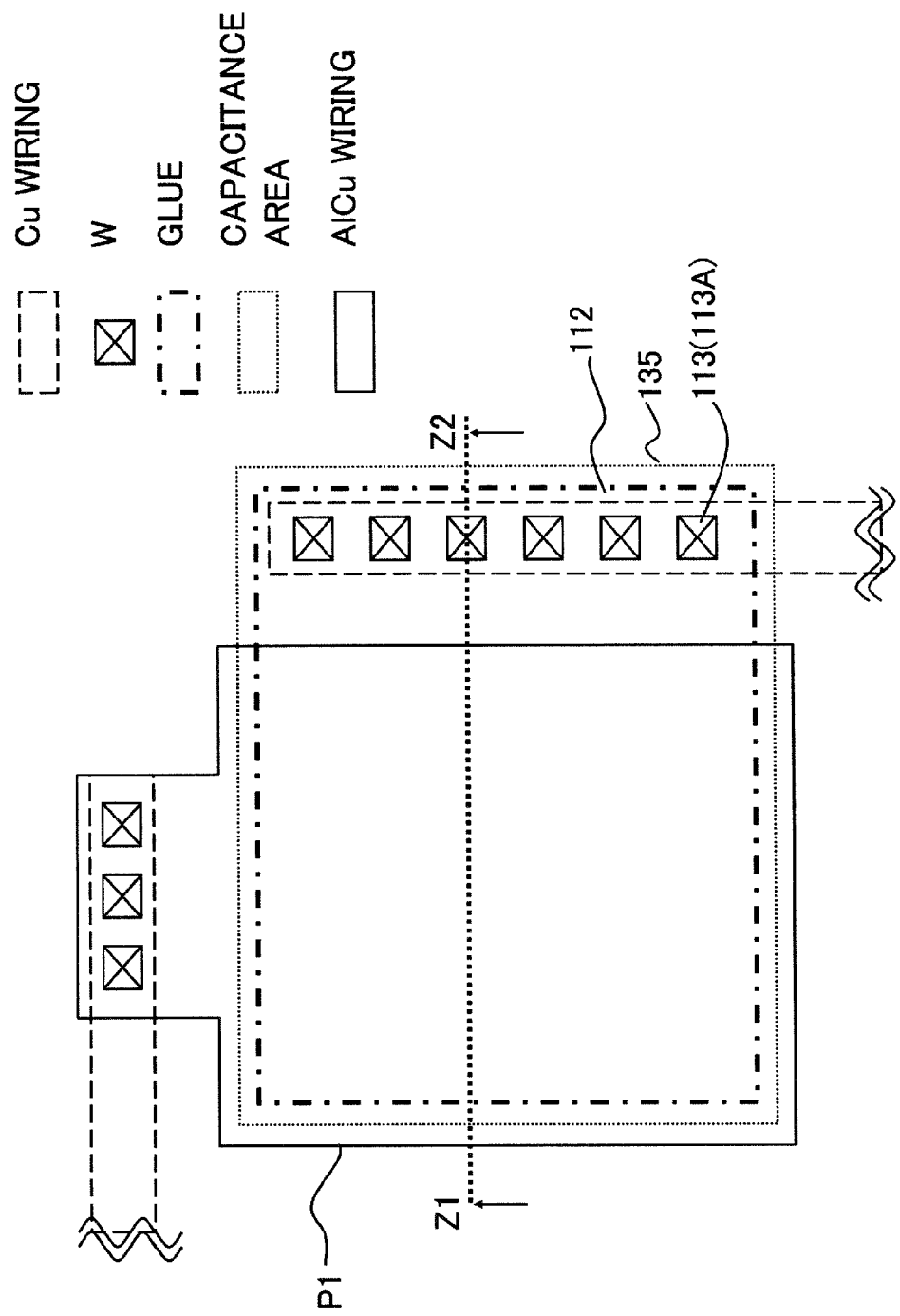
FIG. 25 is a plan view showing the semiconductor device in which the hole led from the lower electrode of the MIM structure to the Damascene wiring, is not disposed under the upper electrode P1.

FIG. 25 shows a plan view of the semiconductor device including the MIM area shown in FIG. 24. As understood from FIG. 25, the hole pattern (the hole 112A filled with the metal layer 113) is disposed on the right side in FIG. 25 with respect to the overlapping area of the upper electrode P1, the dielectric insulating film 135 and the lower electrode (the glue layer 112), wherein the upper electrode P1 is not disposed.

In the thus-constructed semiconductor device, the hole pattern is not disposed under the lower electrode (the glue layer 112), and hence the MIM capacitance area has no occurrence of the stepped portion (see FIG. 9A) when effecting the CMP, which is produced by the metal layer 113 (e.g., tungsten) and the glue layer 112 (barrier metal film e.g., nitride titanium), whereby a flat structure is readily formed in the capacitance area.

On the occasion of considering a characteristic of the capacitance area, the stepped portion in the lower electrode might become a factor causing a data spread. The data spread in the characteristic of the capacitance area can be reduced by taking the construction as in the fourth embodiment. Particularly in the case of not forming a high-quality isotropic dielectric insulating film in the stepped portion, the data spread in the characteristic is easy to increase. Further, if thin of the film thickness, a characteristic of dielectric strength voltage, it is considered, declines. Accordingly, the construction in the fourth embodiment is capable of reducing such a data spread in the characteristic or deterioration of the withstand voltage.

Figure 26:
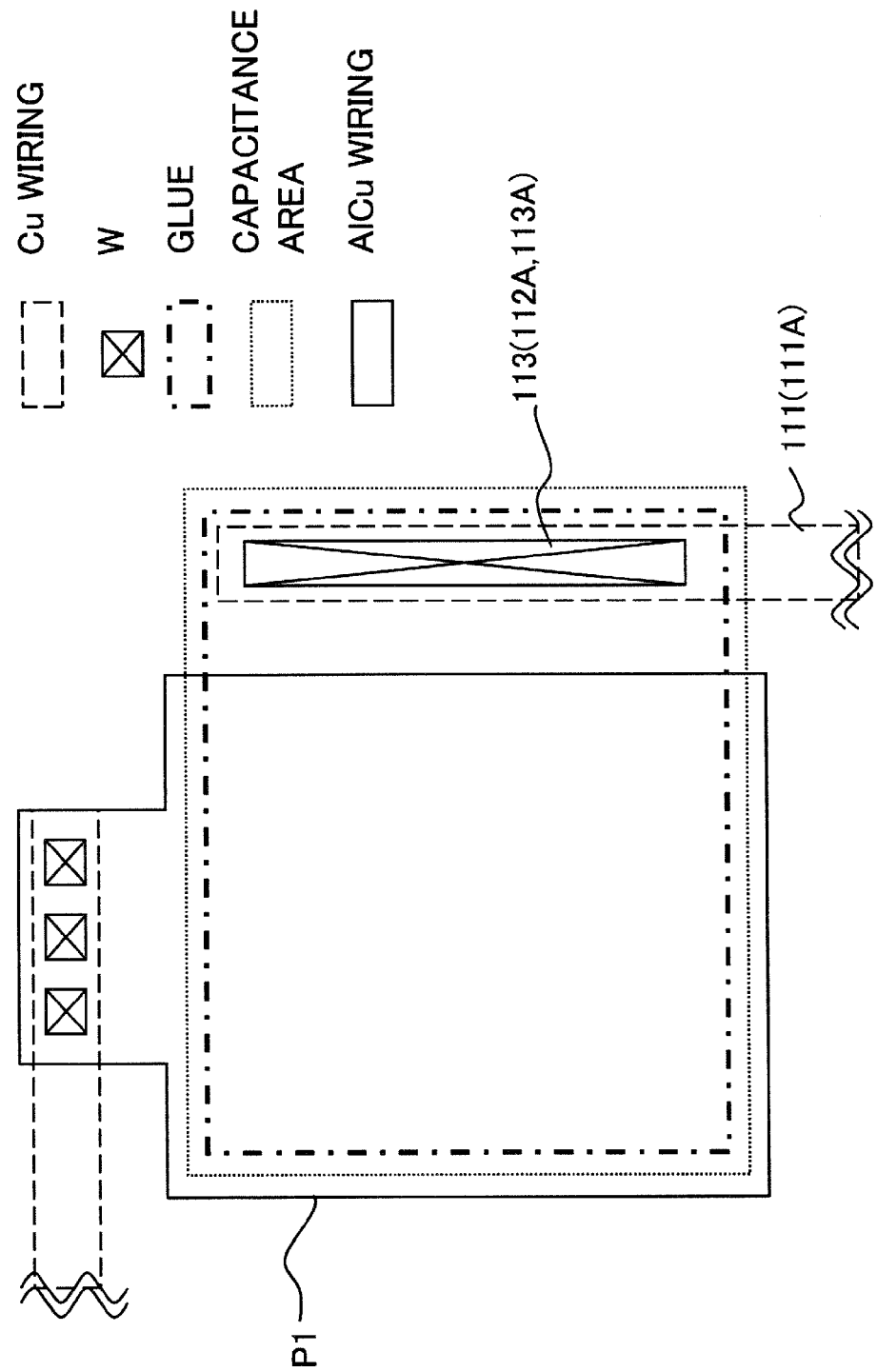
FIG. 26 is a view showing a modified example in which the sectional shape of the hole is the rectangular shape different in its length in the vertical direction and in the lateral direction.

FIG. 26 is a view showing a construction, wherein, as in the third embodiment, the plug layer 113A (the hole 112A) connecting the lower electrode to the wiring layer 111 takes the grooved shape having different width in the vertical direction and in the lateral direction of the sectional shape. As explained in the third embodiment, the parasitic resistance of the lower electrode can be reduced by forming the hole 112A in the grooved shape.

Fifth Embodiment

The semiconductor device according to a fifth embodiment of the invention will hereinafter be described with reference to FIG. 27. In the fifth embodiment, the pattern layout condition of the MIM structure 160 and the plug layer 113A is the same as in the fourth embodiment. The fifth embodiment will, however, exemplify the semiconductor device in which the plural dielectric insulating films each sandwiched in between the upper electrode P1 and the lower electrode (the glue layer 112 and the metal layer 113) are stacked.

Figure 27:
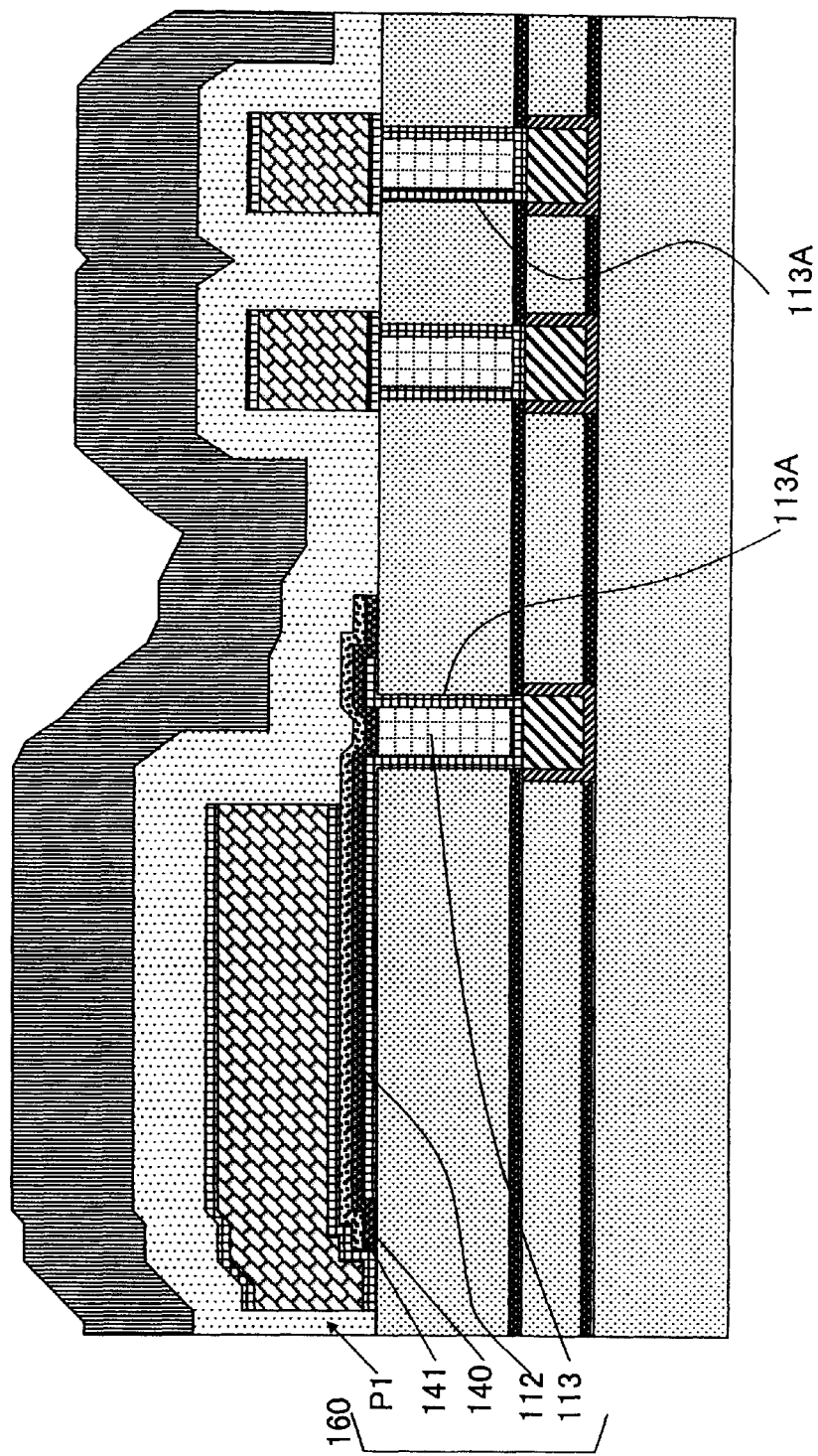
FIG. 27 is a sectional view showing the semiconductor device in which plural dielectric insulating layers are stacked.

FIG. 27 is a sectional view of the semiconductor device according to the fifth embodiment, which includes the MIM area and the normal area. As shown in FIG. 27, the dielectric insulating film sandwiched in between the upper electrode P1 and the lower electrode is separated into two layers. Generally, an absolute capacitance of the MIM area is expressed by a formula of a parallel-plate capacitor, as follows:

$$C=(er \times e0 \times S)/d [F]$$

C: the capacitance
er: the relative dielectric constant
e0: the vaccum dielectric constant $8.854 \times 10^{-10}$ [F/m]
S: the opposed area [m$^2$]
d: the dielectric insulating layer thickness [m]

For increasing the absolute capacitance, it is effective to decrease the thickness of the dielectric insulating layer or to increase the relative dielectric constant of the dielectric insulating layer. If simply the film thickness is decreased, anxiety about the deterioration on the dielectric strength voltage rises. Such being the case, it can be considered as a solution means to combine a material exhibiting a preferable characteristic on the dielectric strength voltage with a material having a high relative dielectric constant.

FIG. 27 shows a sectional view in such a case that a first dielectric insulating film 140 (which has e.g., 7 as the relative dielectric constant and is formed out of SiN up to 30 nm) and a second dielectric insulating film 141 (which has e.g., 4.1 as the relative dielectric constant and is formed out of SiO$_2$ up to 20 nm) are sequentially stacked on the dielectric insulating layer, and the structure is built up by the processes described in the first embodiment or the second embodiment.

Herein, the materials used for the first dielectric insulating film 140 and, in addition, the second dielectric insulating film 141 are exemplified by SiN and SiO$_2$, however, materials for forming the insulating layer, such as silicon carbide (SiC), silicon carbonitride (SiCN) and silicon Oxy-nitride (SiON), can be also properly combined.

With the construction described above, it is feasible to decrease the film thickness by ensuring the insulating dielectric strength voltage by the second insulating layer 141 after increasing the dielectric constant by the first insulating layer 140. As a result, the capacitance of the MIM structure 160 can be increased.

Note that, in the embodiments described above, at first, the silicon nitride film (SiN) is formed, and the silicon oxide film (SiO$_2$) is formed thereon. The embodiment of the invention is not, however, limited to this procedure. The film forming procedure may be replaced depending on the material of the base. For instance, the nitride film is formed by the plasma CVD using a gas containing ammonia and a gas containing silane (SiH$_4$). In this case, if the base material contains an organic material, the organic material might be damaged by ammonia. If the base contains such a material the silicon oxide film (SiO$_2$) is formed at first. Then, the silicon nitride film (SiN) may be formed.

Namely, when forming one of the two films, if the base material has a possibility that one film might be damaged by the film forming process, to begin with, the other film is formed so as to reduce the possibility of damaging the base, and then, thereafter, one previous film may be formed.

Sixth Embodiment

The semiconductor device according to a sixth embodiment of the invention will hereinafter be described with reference to FIG. 28. In the fifth embodiment, the stacked structure including the first dielectric insulating film 140 and the second dielectric insulating film 141 is formed on the dielectric insulating layer. The sixth embodiment will exemplify, as a modified example thereof, the semiconductor device in which an edge of the dielectric insulating layer is partially aligned with an edge of the upper electrode P1. Other configurations and operations in the sixth embodiment are the same as those in the fifth embodiment. This being the case, the same components as those in the fifth embodiment are marked with the same numerals and symbols, and their explanations are omitted.

Figure 28:
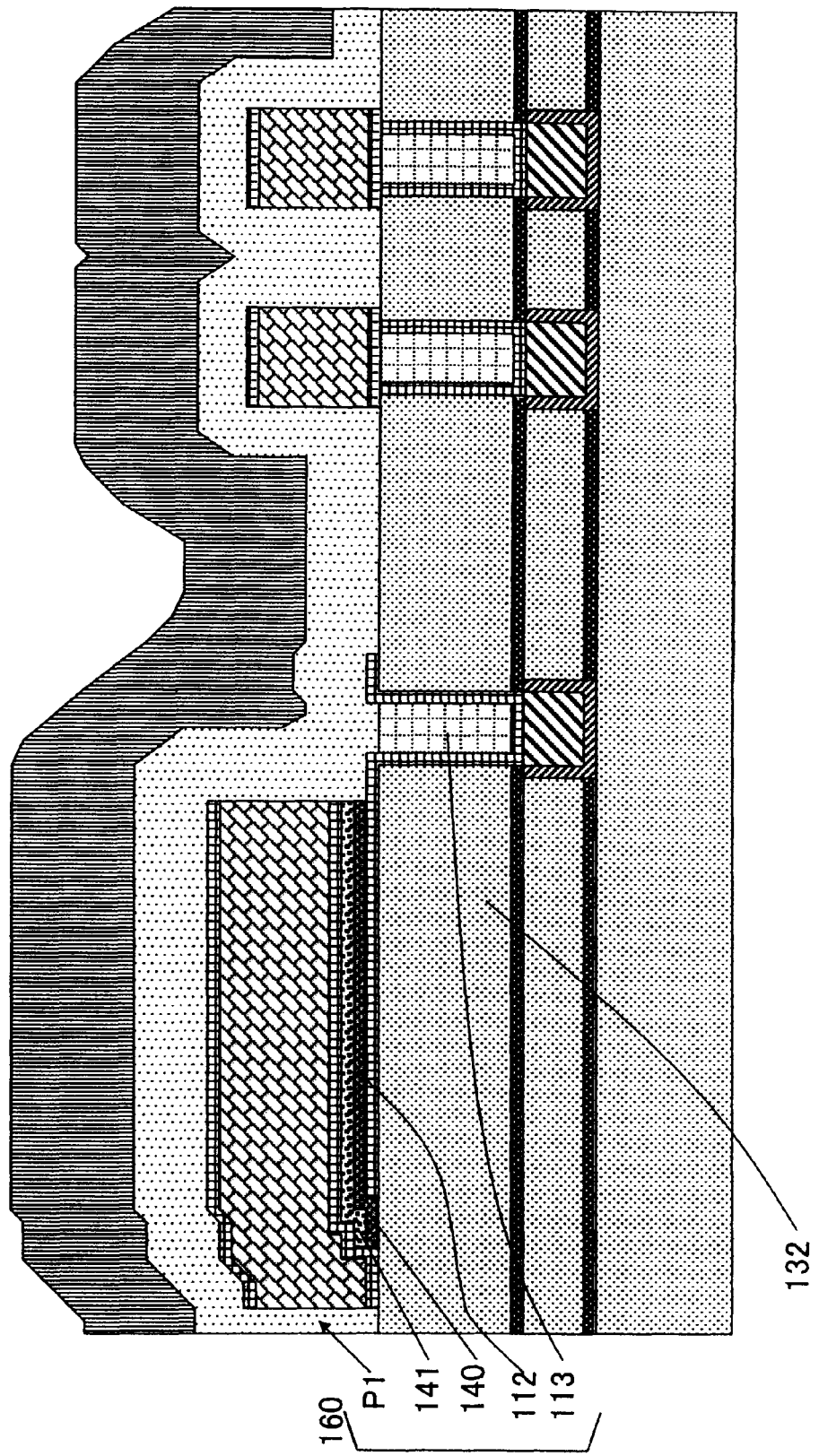
FIG. 28 is a sectional view showing the semiconductor device in which an edge of the dielectric insulating layer is partially aligned with an edge of the upper electrode.

FIG. 28 is a sectional view of the semiconductor device according to the sixth embodiment, which includes the MIM area and the normal area. A difference between FIG. 28 and FIG. 27 is such a point that in the right upward area, in FIG. 28, of the MIM area 160 in the sectional view, the edge of the upper electrode P1 is aligned with the edges of the first dielectric insulating film 140 and of the second dielectric insulating film 141 (which will hereinafter be also simply called dielectric insulating stacked structures 140, 141). Namely, the side edge surface of the upper electrode P1 and the side edge surfaces of the dielectric insulating stacked structures 140, 141 configure a plane approximately perpendicular to the lower electrode. This is a configuration in which the upper electrode P1 is removed down to the stacked dielectric insulating films in the etching process of the upper electrode P1 when executing the same processes as those in FIG. 27.

Thus, when the upper electrode P1 is properly over-etched, in terms of a relationship of the selection ratio between the interlayer insulating film 132, the glue layer 112 and the dielectric insulating films 140, 141, the first dielectric insulating layer 140 and the second dielectric insulating layer 141 can be removed. Namely, even when taking such a configuration, unless the lower electrode is removed by the etching, the capacitance characteristic of the MIM area 160 can be acquired.

Seventh Embodiment

A seventh embodiment of the invention will hereinafter be described with reference to the drawings in FIGS. 29 through 33. The fifth embodiment and the sixth embodiment each have exemplified the semiconductor device in which the dielectric insulating films are stacked. The seventh embodiment will exemplify a structure forming method capable of increasing the insulating capacitance of the MIM area by further decreasing the thickness of the stacked dielectric insulating films. Namely, in the seventh embodiment, the second dielectric insulating film is used as a dummy insulating film. The dummy connotes the insulating film which, though existing as an etching mask in the pattern formation process, disappears after the pattern formation but does not become the component of the MIM elements. As a result, the dielectric insulating layer is composed of the insulating films other than the dummy insulating film.

Other configurations and operations in the seventh embodiment are the same as those in the fifth and sixth embodiments. This being the case, the same components as those in the fifth and sixth embodiments are marked with the same numerals and symbols, and their explanations are omitted.

Figure 29:
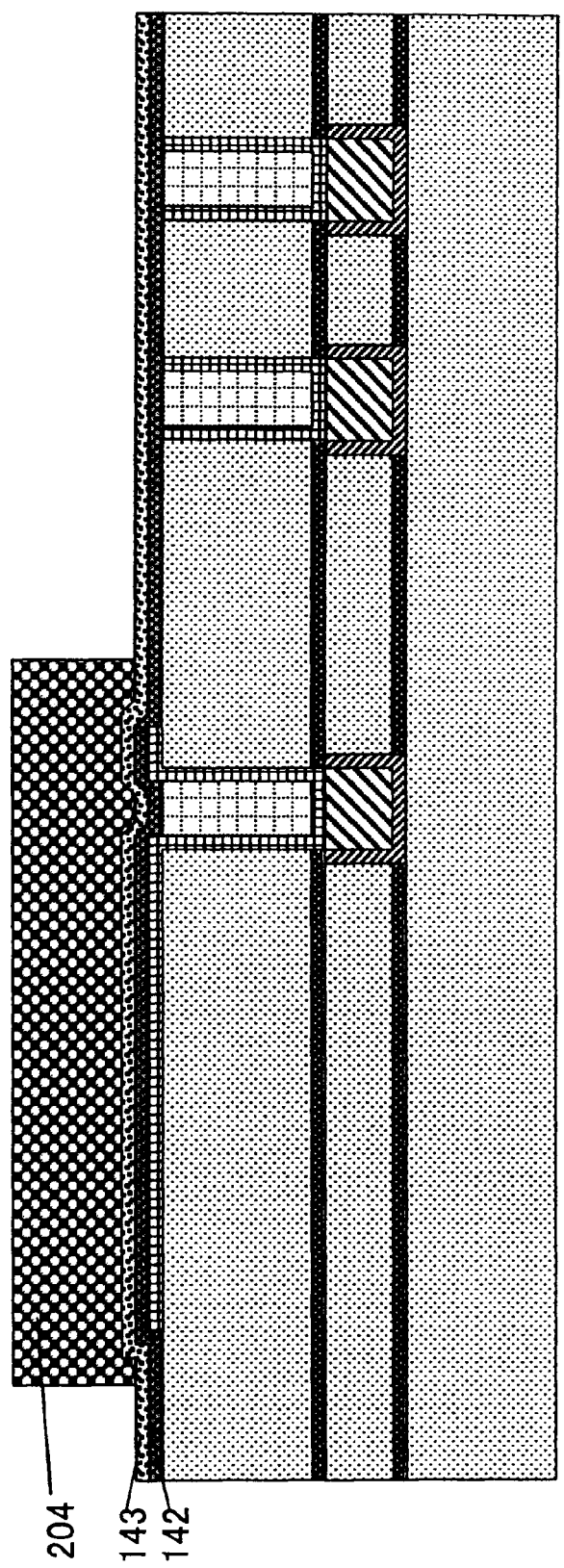
FIG. 29 is a sectional view (1) showing a process of manufacturing the semiconductor device utilizing a dummy insulating layer.

FIGS. 29 through 33 show processes of manufacturing the semiconductor device in the seventh embodiment. To start with, as shown in FIG. 29, after the process of forming the lower electrode area shown in FIG. 10A, with the method explained in FIG. 27, a dielectric insulating film 142 (which has, e.g., the relative dielectric constant of 7 and is formed out of SiN up to 30 nm) and a dummy insulating layer 143 (which is formed out of, e.g. $SiO_2$ up to 40 nm) are sequentially formed by employing the plasma CVD method, and thereafter a photoresist 204 for the pattern formation of the dielectric insulating film is subjected to coating, exposing and developing, thereby forming a resist pattern.

Figure 30:
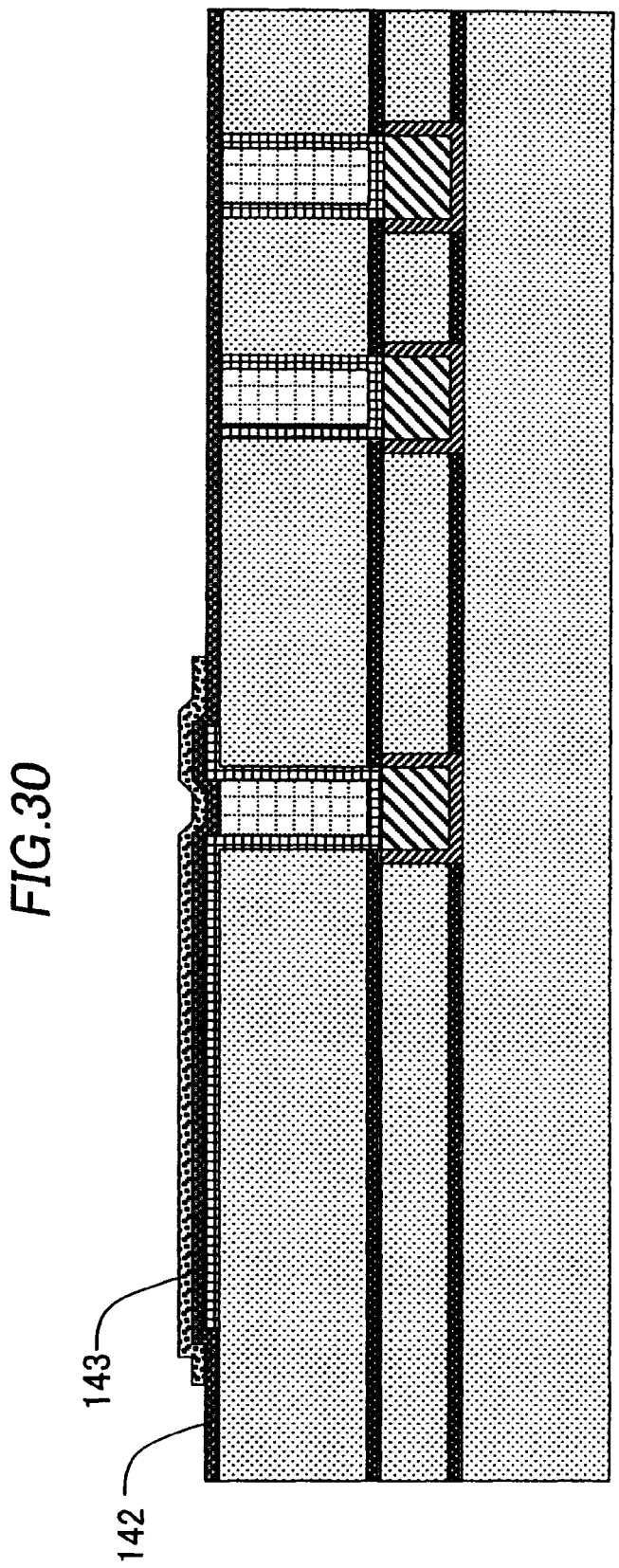
FIG. 30 is a sectional view (2) showing the process of manufacturing the semiconductor device utilizing the dummy insulating layer.

As shown in FIG. 30, with the photoresist 204 being used as a mask, the dummy insulating layer 143 is plasma-etched by using, e.g. the CF-series gas etc, thereby forming the pattern thereof. The etching stops at on the dielectric insulating film 142. If this etching condition is properly selected, it is possible to obtain such a selection ratio that the etching advances on the dummy insulating layer 143 but stops at on the dielectric insulating film 142. This kind of selection ratio can be, it is known well, controlled by adjusting a type of the gas and a gas pressure. Subsequently, the photoresist 204 is removed by the plasma ashing that contains the oxygen ($O_2$) gas. Through these procedures, when effecting the plasma ashing that contains the oxygen ($O_2$) gas, the dummy insulating layer 143 can protect the dielectric insulating film 142.

Figure 31:
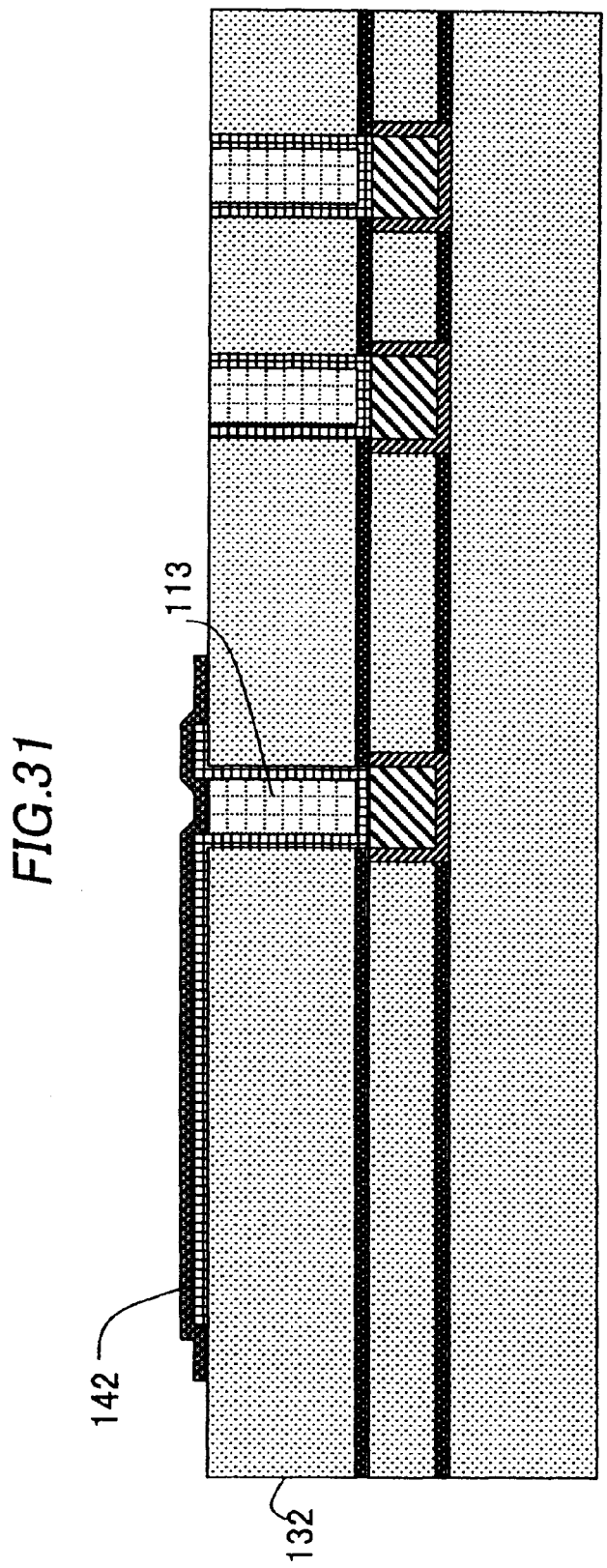
FIG. 31 is a sectional view (3) showing the process of manufacturing the semiconductor device utilizing the dummy insulating layer.

As shown in FIG. 30, with the dummy insulating layer 143 being used as a mask, the dielectric insulating film 142 is etched by employing a CF-series/CHF-series mixture gas etc., whereby, as in FIG. 31, a pattern of the dielectric insulating film 142 can be formed on the lower electrode (the glue layer 112, the metal layer 113). The photoresist has been removed, and therefore, when etched with the dummy insulating layer 143 being used as the mask, a large proportion of the dummy insulating layer 143 itself can be removed along with the etching of the dielectric insulating film 142. The dummy insulating layer 143 can be, though made to function as the mask, removed from on the dielectric insulating film 142 depending on the etching condition. Namely, the type of the gas and the gas pressure may be selected so that the dummy insulating layer 143 and the dielectric insulating film 142 are etched to the same degree.

Further, if the dummy insulating layer 143 is left thin, the dummy insulating layer 143 can be removed by use of a wet etching method based on hydrofluoric acid. Hereat, the interlayer insulating film 132 is exposed from the surface in the area having no existence of the pattern of the dielectric insulating film 142, however, the film thickness thereof is well larger than a thickness of the residue after etching the dummy insulating layer 143, and therefore, the anxiety about disappearance being small, there is a sufficient margin for removing the dummy insulating layer 143 existing on the dielectric insulating film 142.

The dummy insulating layer 143 keeps a state of being temporarily protected by the photoresist 204 during the plasma etching (FIG. 29), and is, if subsequently used as the mask, exposed to the plasma etching. The dielectric insulating film 142 existing thereunder is, however, protected (FIG. 30). A preferable condition of the plasma etching is to lessen the damage to the dielectric insulating film 142, so that the dummy insulating layer 143 has an effect in restraining the damage to the dielectric insulating film 142. Further, in addition, the dummy insulating layer 143 disappears, thereby eliminating direct contribution to the capacitance characteristic of the MIM area. Accordingly, a much thinner dielectric insulating film area is formed in the MIM area, and hence these processes can be said to be an effective means.

Figure 32:
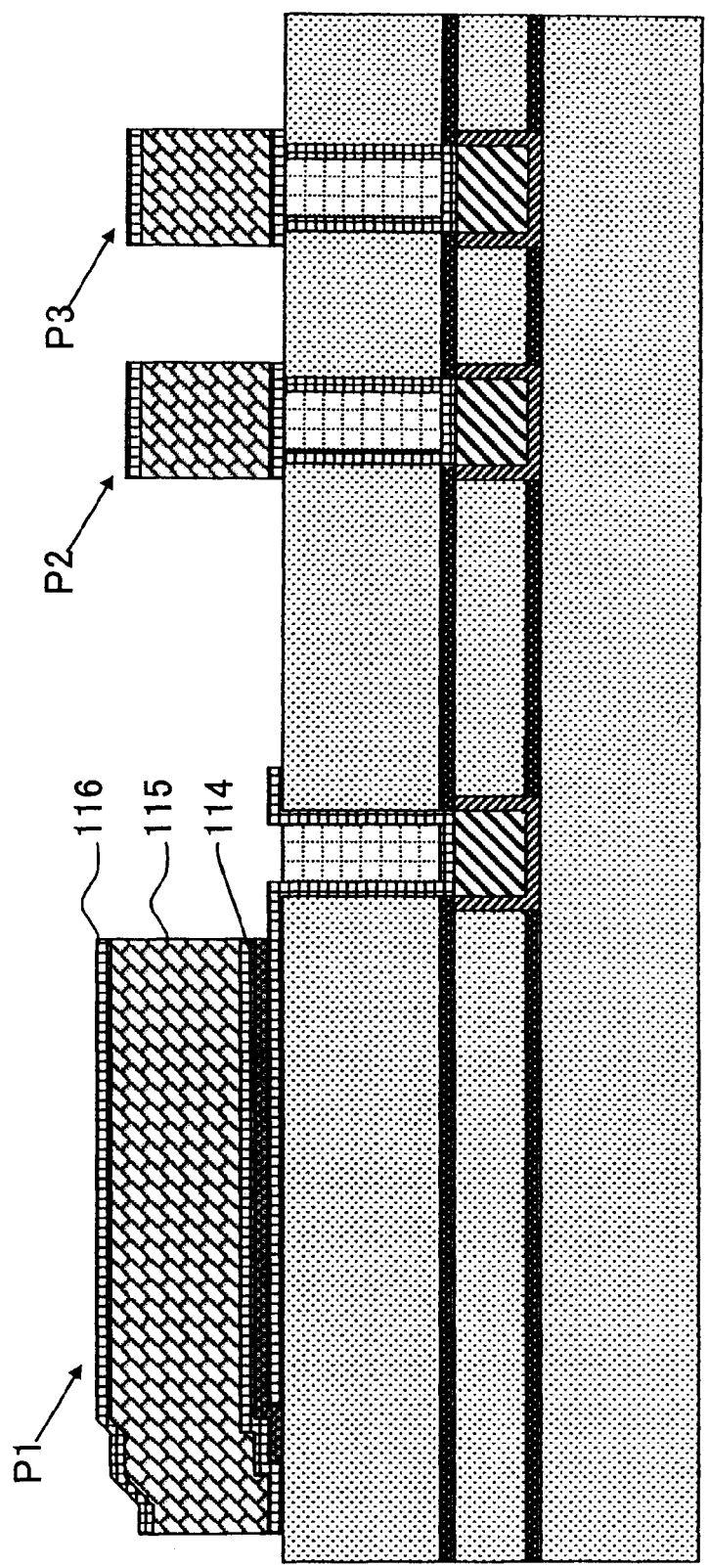
FIG. 32 is a sectional view (4) showing the process of manufacturing the semiconductor device utilizing the dummy insulating layer.

Next, as shown in FIG. 32, a barrier metal film 114, a metal layer 115 and a barrier metal film 116 are formed, and further a photoresist 205 (unillustrated) is subjected to coating, exposing and developing. With this process, the upper electrode P1 is formed in the MIM area, and unillustrated photoresist patterns corresponding to circuit patterns P2, P3 are formed in the normal area. Moreover, with the resist patterns being employed as masks, the upper electrode P1 and the wiring patterns P2, P3 are formed by the plasma etching that uses the chlorine-series (Cl) gas etc. At this time, in the same processes as those explained also in the sixth embodiment, an etched shape of the dielectric insulating film 142 is obtained.

Figure 33:
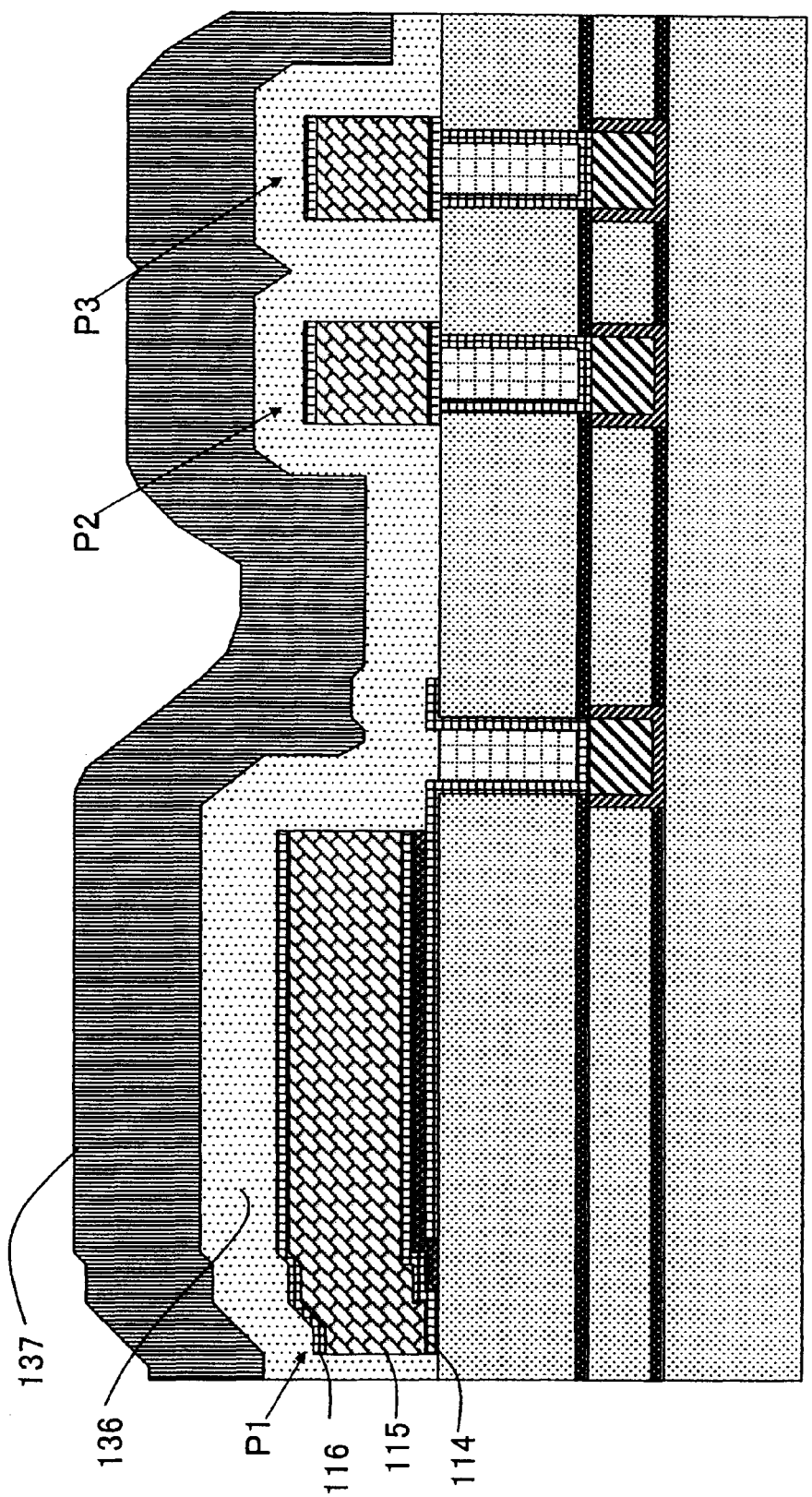
FIG. 33 is a sectional view (5) showing the process of manufacturing the semiconductor device utilizing the dummy insulating layer.

Subsequently, as in FIG. 33, in the same way as in the respective embodiments described above, an insulating layer 136 (which is formed out of, e.g., $SiO_2$ up to 1400 nm) and an insulating layer 137 (which is formed as, e.g., a SiN film up to 500 nm) are formed by way of a cover structure by using the plasma CVD method.

The use of the method as given in the seventh embodiment makes it possible to restrain the damage to the dielectric insulating film 142, to form the dielectric insulating film 142 even thinner than in the semiconductor device in the sixth embodiment and to increase the absolute capacitance.

The seventh embodiment has exemplified the examples of the case of using SiN and of the case of using $SiO_2$ as the materials used for the dielectric insulating film 142 and the dummy insulating layer 143, however, it is also feasible to properly combine materials such as SiC, SiCN, SiON for the insulating layer.

Eighth Embodiment

The semiconductor device according to an eighth embodiment of the invention will hereinafter be described with reference to the drawings in FIGS. 34 through 39. The respective embodiments discussed so far have given the descriptions about the basic processes of the MIM area and of the normal area, the planar layout of the upper electrode and the lower electrode, the planar layout of the hole pattern, the detailed method of forming the dielectric insulating film and the modified examples thereof. The eighth embodiment will exemplify a technological modification about how the parasitic resistance of the lower electrode itself is reduced. Other configurations and operations are the same as those in the first through seventh embodiments. This being the case, the same components as those in the embodiments given above are marked with the same numerals and symbols, and their explanations are omitted.

Figure 34:
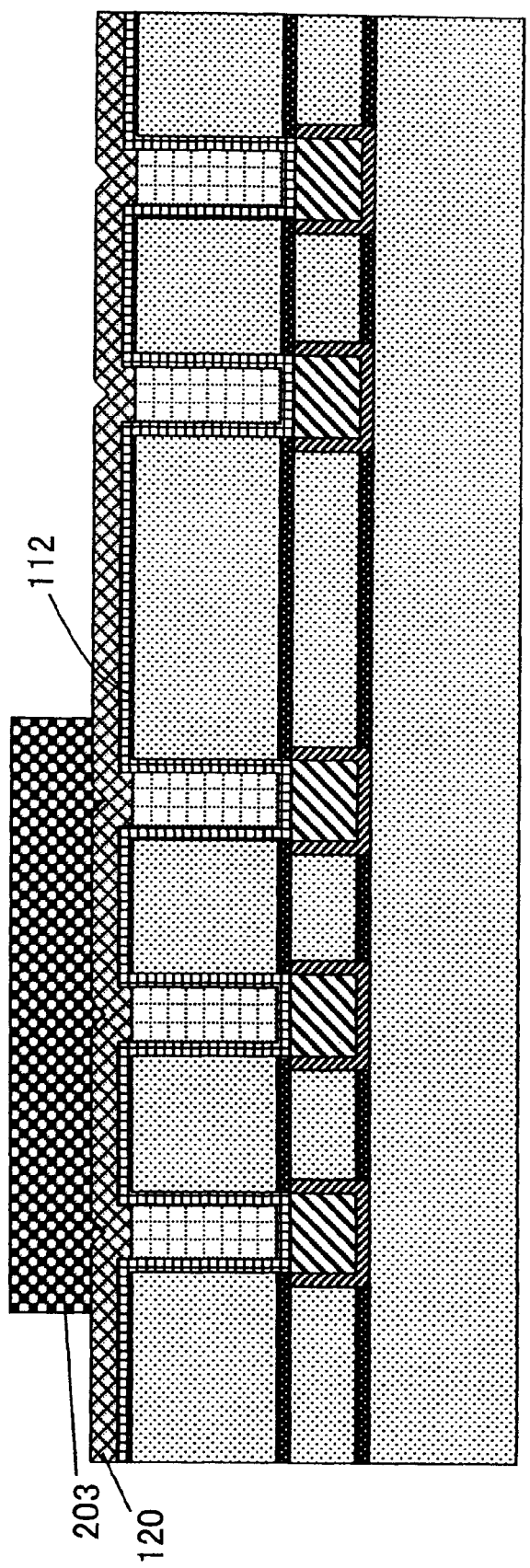
FIG. 34 is a sectional view showing a process of forming a resist pattern on an auxiliary metal layer.

FIG. 34 shows a resist pattern on an auxiliary metal layer in the semiconductor device in the eighth embodiment. At first, in the process as shown in FIG. 10A in the first embodiment, the glue layer 112 being employed as the lower electrode is formed. In FIG. 10A, the lower electrode pattern is successively formed, however, according to the eighth embodiment, before this process, an auxiliary metal layer 120 (corresponding to a third metal layer according to the invention, which is formed out of, e.g., TiN up to 150 nm) is formed by use of the sputtering method.

Subsequently, as in FIG. 34, a photoresist 203 is subjected to coating, exposing and developing, thereby forming a photoresist pattern corresponding to the lower electrode. This process is the same as in FIG. 10A.

Figure 35:
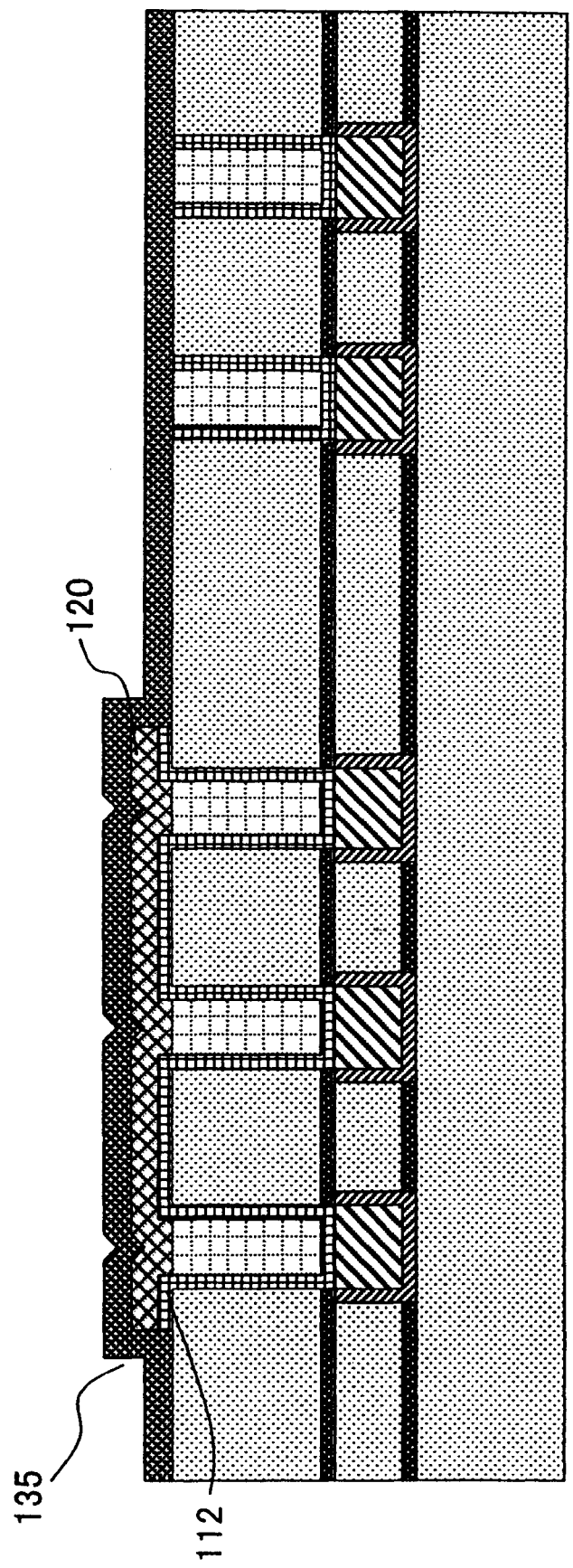
FIG. 35 is a sectional view showing a process of forming the dielectric insulating film by use of a plasma CVD method.

Next, with the photoresist 203 being employed as a mask, the auxiliary metal layer 120 and the glue layer 112, which build up the stacked structure, are removed by the etching that uses the chlorine-series (Cl) gas etc. Moreover, the photoresist 203 is removed by the plasma asking that employs the oxygen ($O_2$) gas. Then, as illustrated in FIG. 35, the dielectric insulating film 135 is formed by using the plasma CVD method.

Figure 36:
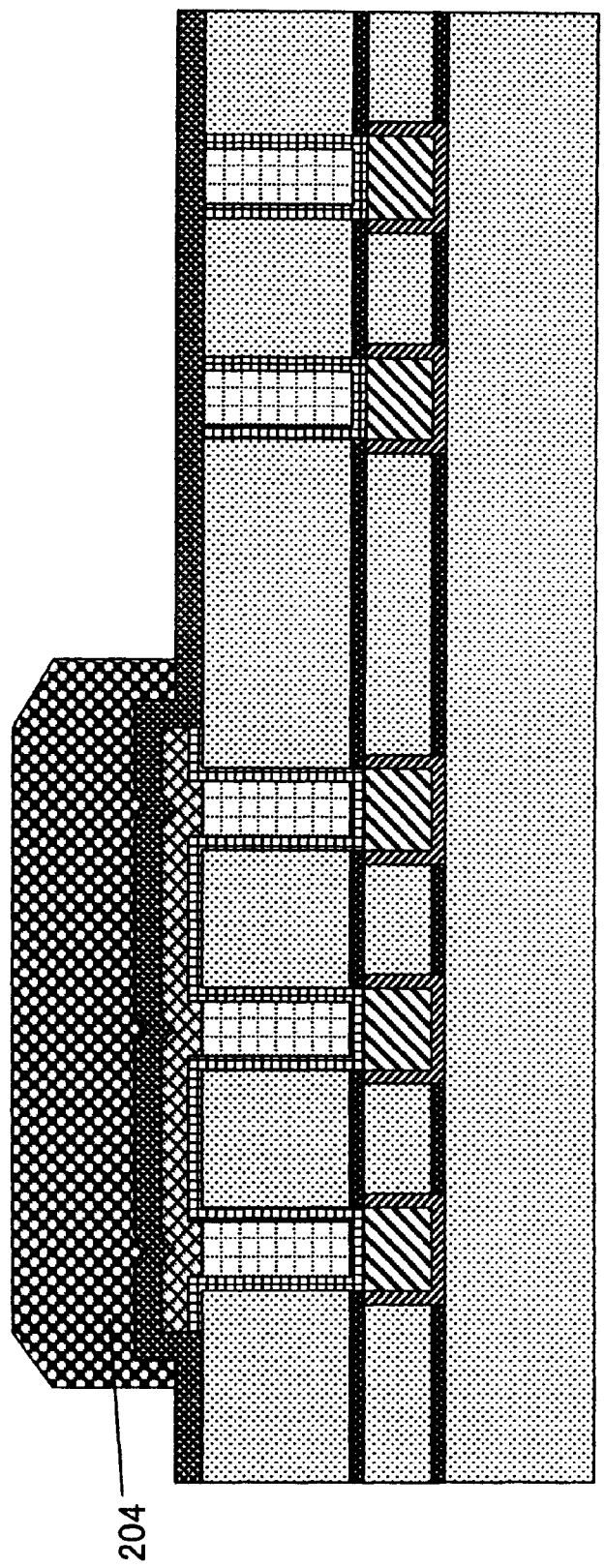
FIG. 36 is a sectional view showing a process in which the photoresist is subjected to coating, exposing and developing on the dielectric insulating layer.

Next, as shown in FIG. 36, the photoresist 204 is subjected to coating, exposing and developing on the dielectric insulating layer 135, thereby forming a pattern of the photoresist 204 that corresponds to the dielectric insulating film pattern. Furthermore, with the photoresist 204 being used as a mask, the dielectric insulating layer 135 is etched, whereby the dielectric insulating layer 135 is pattern-formed.

Figure 37:
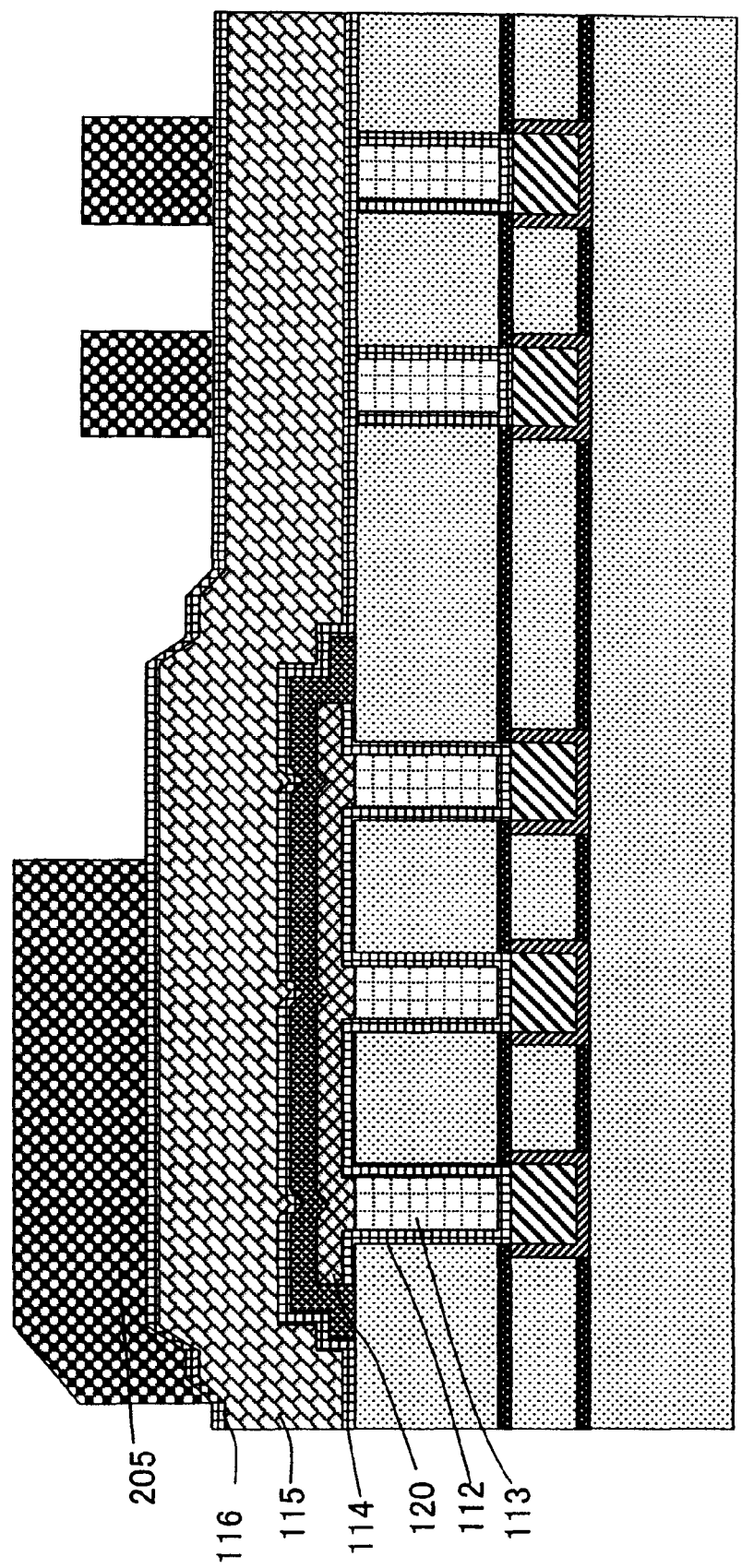
FIG. 37 is a sectional view showing a process in which the photoresist is subjected to coating, exposing and developing on an aluminum wiring composed of a barrier metal, a metal layer and the barrier metal.

Subsequently, the barrier metal film 114, the metal layer 115 and the barrier metal film 116 are formed by using the sputtering method. Further, as shown in FIG. 37, the photoresist 205 is subjected to coating, exposing and developing. Then, the upper electrode pattern P1 having the same pattern as FIG. 27 shows is formed in the MIM area, and resist patterns corresponding to the wiring patterns P2, P3 are formed in the normal area.

Figure 38:
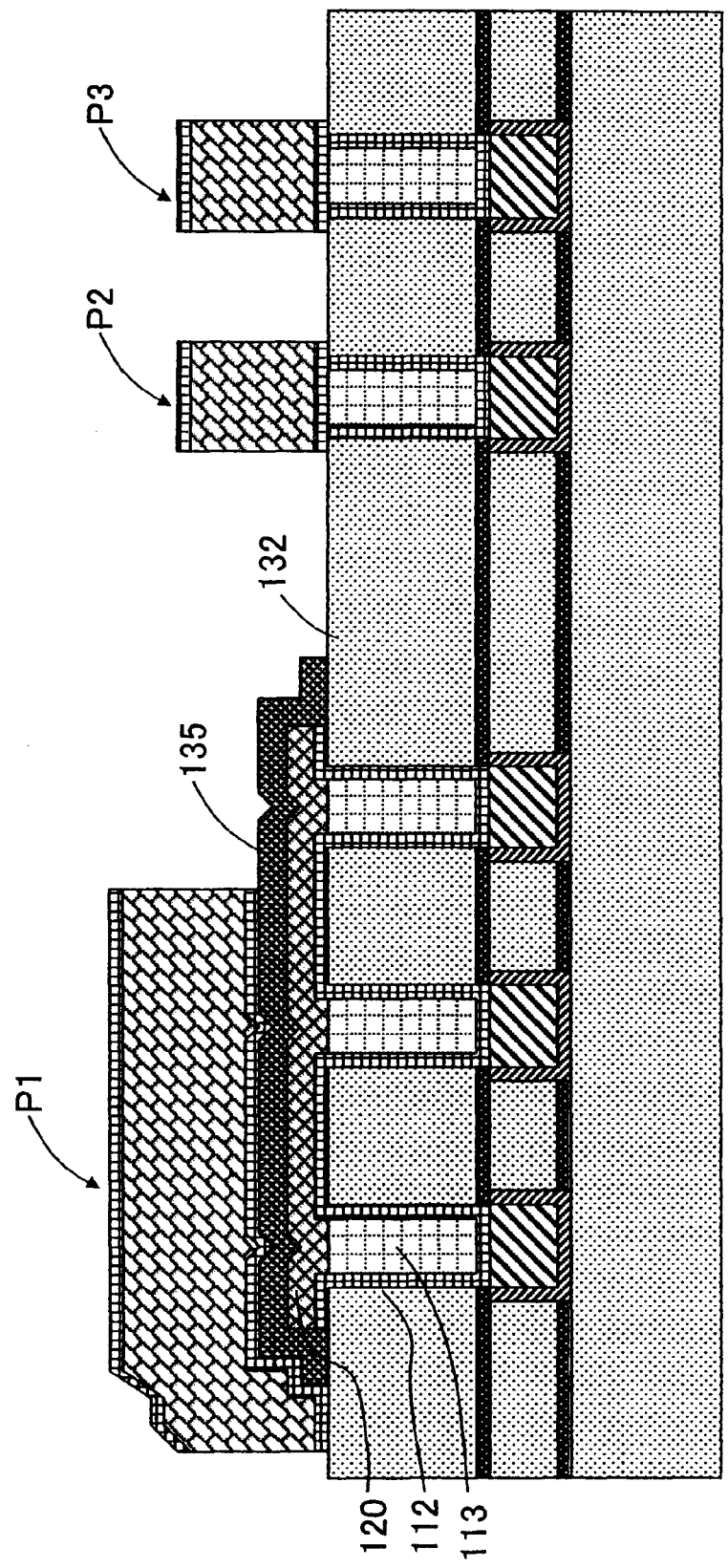
FIG. 38 is a sectional view showing a process of etching the aluminum wiring.

Then, as shown in FIG. 38, in a way that uses the photoresist 205 as a mask in FIG. 37, the barrier metal film 116, the metal layer 115 and the barrier metal film 114 are etched by the plasma etching by use of the chlorine-series (Cl) gas etc till the dielectric insulating film 135 and the interlayer insulating film 132 get exposed. Subsequently, the photoresist 205 is removed by the plasma asking that contains the oxygen ($O_2$) gas.

Figure 39:
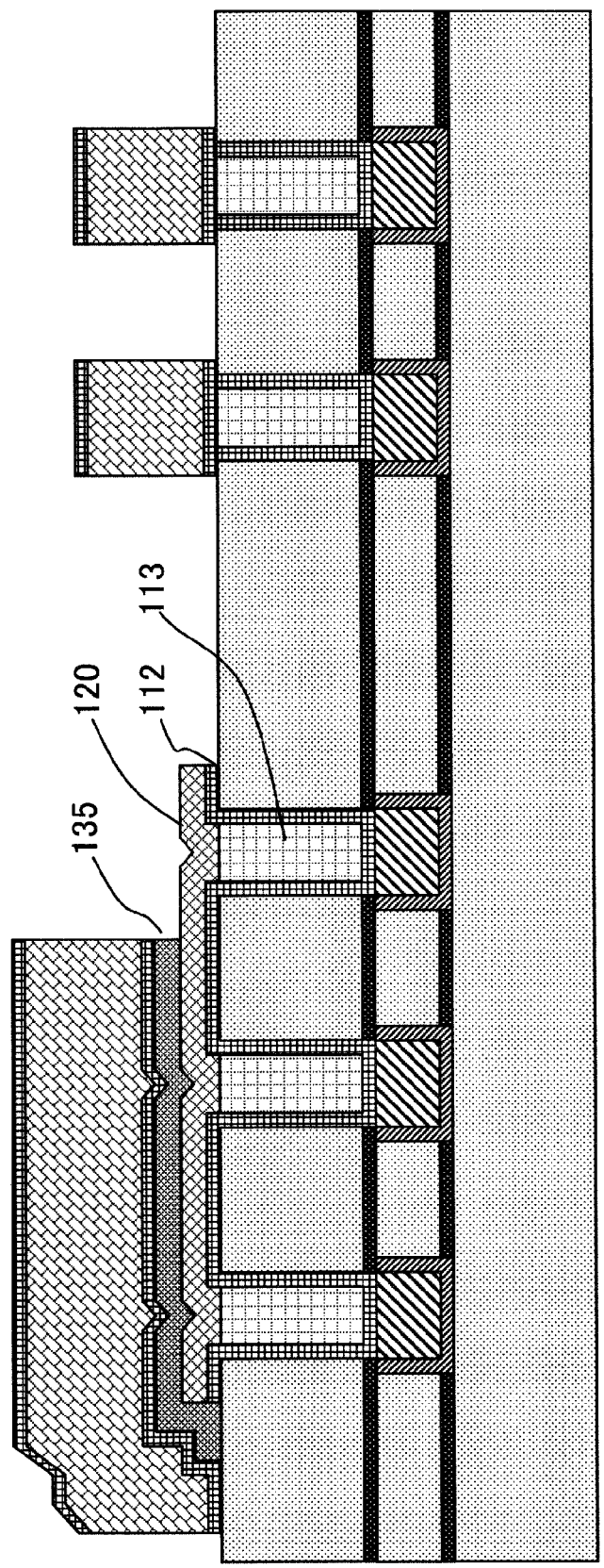
FIG. 39 is a sectional view showing a process of etching the dielectric insulating film.

FIG. 39 shows a drawing in the case of further, in the plasma etching described above, etching the dielectric insulating film 135. Even when such a mode exists similarly to the embodiment (see FIG. 32) described above, the capacitance characteristic of the MIM area is acquired. The subsequent processes are, though not shown, organized by the same processes in other embodiments.

As discussed above, since the auxiliary metal layer 120 is provided, the lower electrode is constructed of the auxiliary metal layer 120, the glue layer 112 and the metal layer 113. Consequently, as shown in FIG. 38 or 39, the thickness of the lower electrode rises. Accordingly, the sectional area size of the lower electrode increases, and the resistance of the lower electrode in the plane direction (in the lateral direction in FIG. 38 or 39) can be reduced.

In the eighth embodiment, as shown in FIG. 30 or 39, when the metal layer 113 is removed by the CMP, the glue layer 112 remains. As a substitute for this, however, such a configuration may be taken that the upper area, from the interlayer insulating film 132, of the glue layer 112 may be completely removed together with the metal layer 113, whereby the glue layer 112 remains only within the hole 112A.

Figure 40:
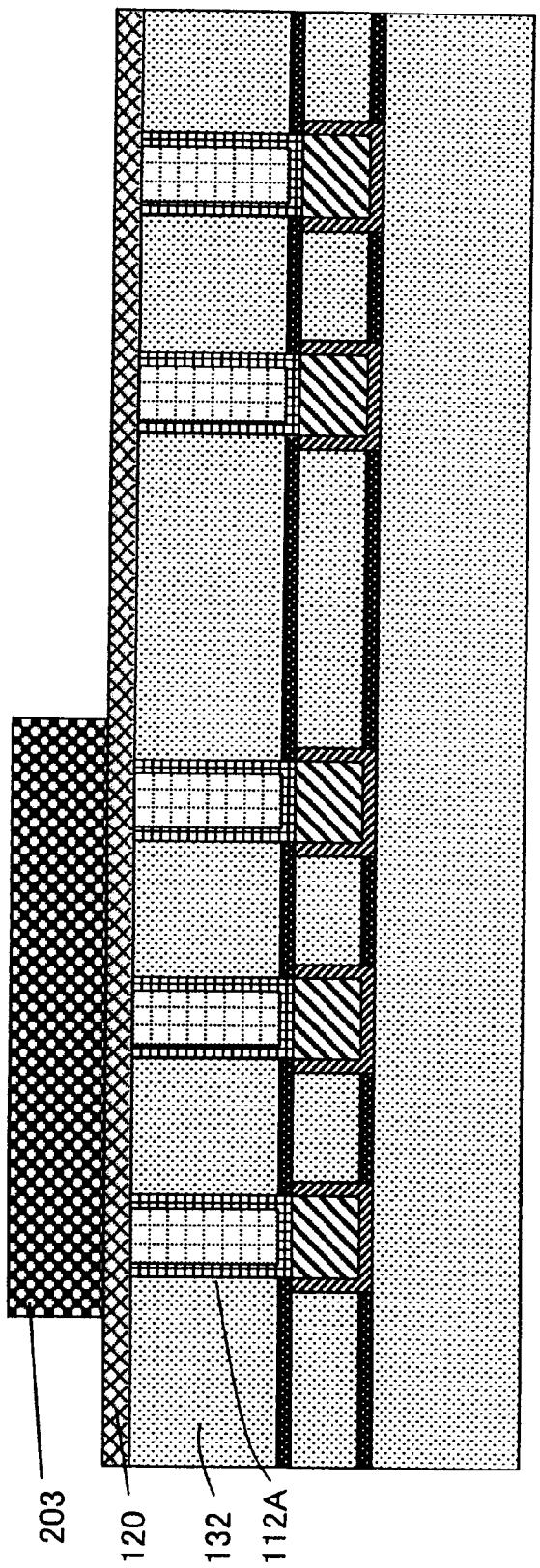
FIG. 40 is a sectional view (1) showing a process of manufacturing the semiconductor device in which the auxiliary metal layer is formed by removing a glue layer on the interlayer insulating film.
Figure 41:
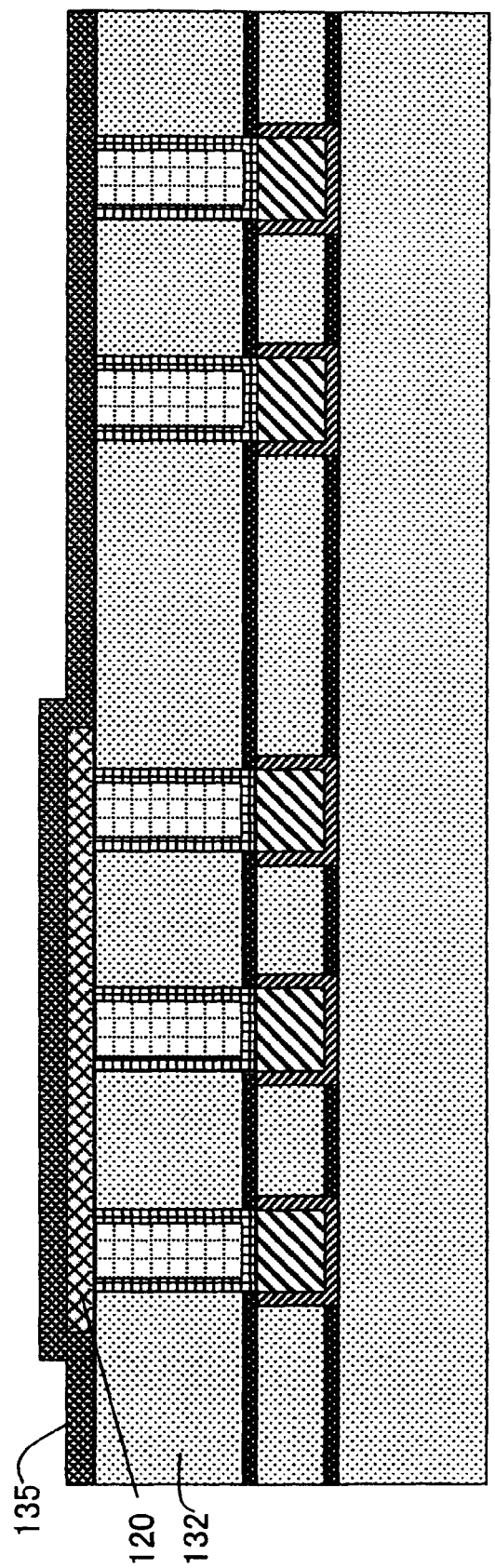
FIG. 41 is a sectional view (2) showing the process of manufacturing the semiconductor device in which the auxiliary metal layer is formed by removing the glue layer on the interlayer insulating film.

Namely, as shown in FIG. 9A, when the metal layer 113 and the glue layer 112 are subjected to the CMP, the glue layer 112 may be removed till the interlayer insulating film 132 appears as in FIG. 40 without leaving the glue layer 112. Then, as shown in FIGS. 40 and 41, after patterning the photoresist 203 and etching the auxiliary metal layer 120, the MIM area can be formed by the same processes as those in FIGS. 36 through 38 or 39.

Thus, the glue layer 112 is removed from the interlayer insulating film 132, and the auxiliary metal layer 120 (corresponding to the third metal layer according to the invention) is formed directly on the interlayer insulating film 132, whereby the lower electrode can be constructed of the auxiliary metal layer 120, the glue layer 112 and the metal layer 113. With this construction, as compared with the construction illustrated in FIGS. 34 through 39, the upper layers of the holes 112A (the glue layer 112 and the metal layer 113) get easy to be planarized. It is because there are no dispersed residues of the glue layer 112. Further, it is possible to reduce the occurrence of the stepped portion (see FIG. 9A) produced by the upper area of the interlayer insulating film 132 and by the metal layer 113. Accordingly, a data spread in the characteristics (electrostatic capacitance, insulating pressure resistance, etc) of the MIM area can be decreased.

Other Modified Examples

Figure 42:
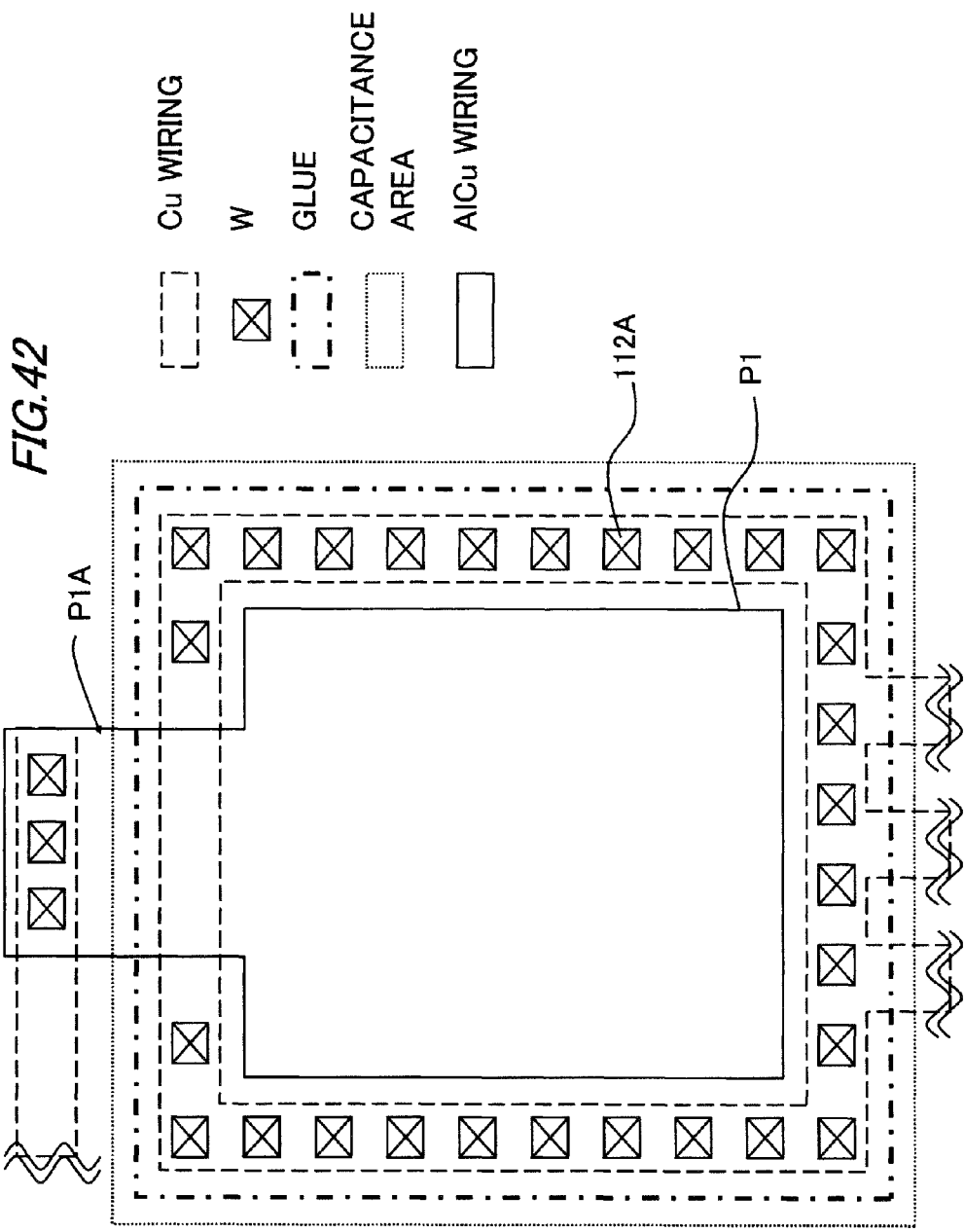
FIG. 42 is a plan view showing the semiconductor device in which the Damascene wiring is arranged in the form along the periphery of the upper electrode P1.

Shown are other planar layouts. FIG. 42 illustrates the semiconductor device taking such a structure that the upper electrode shape in FIG. 25 remains substantially as it is, the Damascene wiring is arranged in the form along the periphery of the upper electrode P1 and is overlapped with only the upper electrode leading area (the extended area P1A) of the upper electrode P1, and none of the wiring is arranged under the upper electrode P1. The hole pattern 112A is not disposed under the overlapping area between the upper electrode P1 and the lower electrode (the glue layer 112). Because of the structure of not disposing the hole pattern in the overlapping area between the lower electrode and the upper electrode P1, there is the structure having no occurrence of the stepped portion in the capacitance element area in the MIM area.

Figure 43:
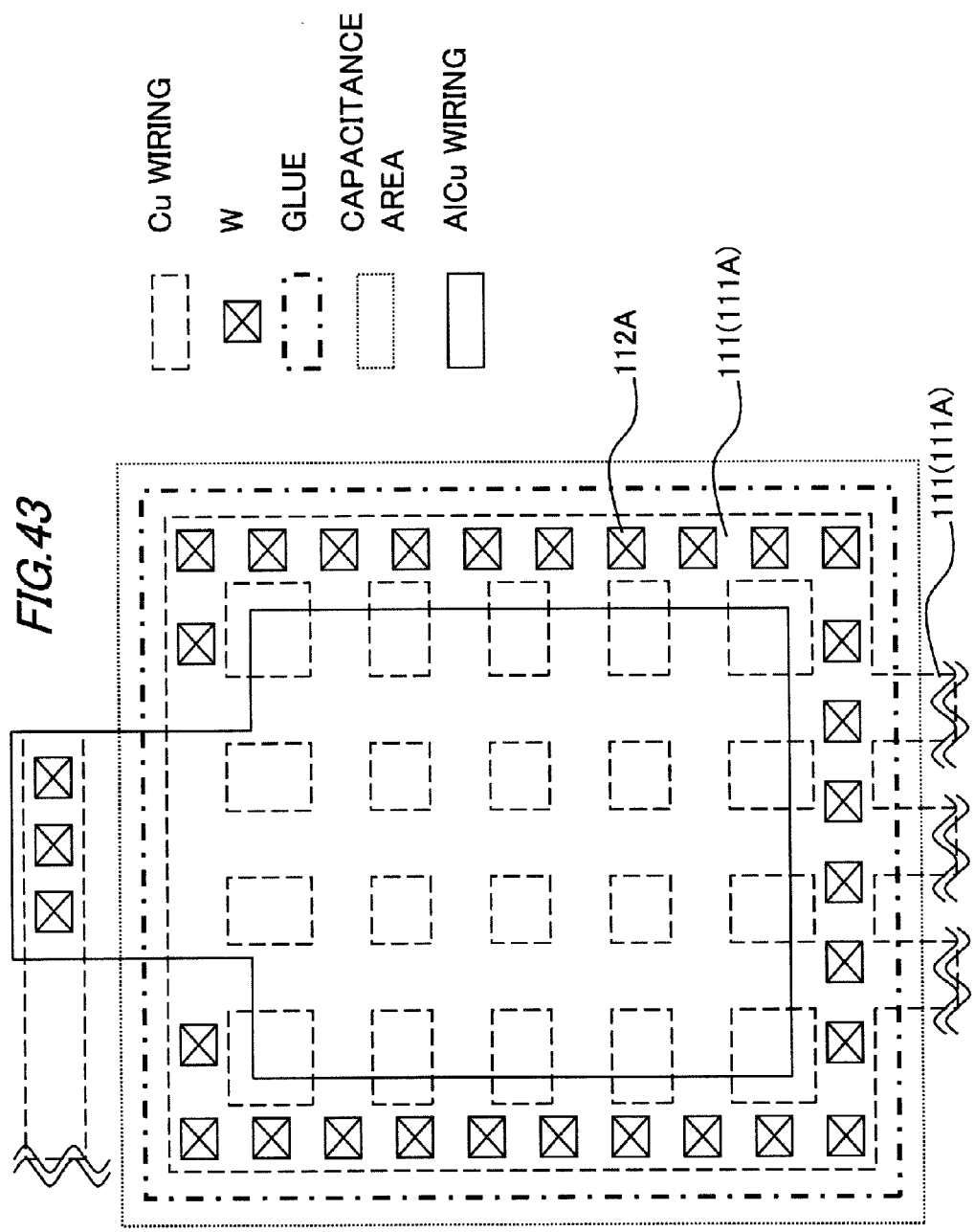
FIG. 43 is a plan view of the semiconductor device in which a hole pattern 112A is not disposed in the lower area of the electrode, and a Damascene wiring 113A is arranged.

In addition to the above, as shown in FIG. 43, the hole pattern 112A is not disposed in the lower area of the electrode, however, a planar configuration of disposing only the Damascene wiring 113A can be taken. To be specific, in FIG. 43, the Damascene wiring 113A is formed in a mesh-shape. The Damascene wiring itself is planarized by the CMP, so that the upper layer of the Damascene wiring 113A (the mesh area) in FIG. 43 is hard to have the occurrence of the stepped portion. Hence, also with the construction illustrated in FIG. 43, the stepped portion in the capacitance element in the MIM area can be reduced, and the data spread in the characteristics (the electrostatic capacitance, the dielectric strength voltage, etc) can be decreased. Moreover, the parasitic resistance of the lead-out wiring area can be rendered lower than in FIG. 42.

Figure 44:
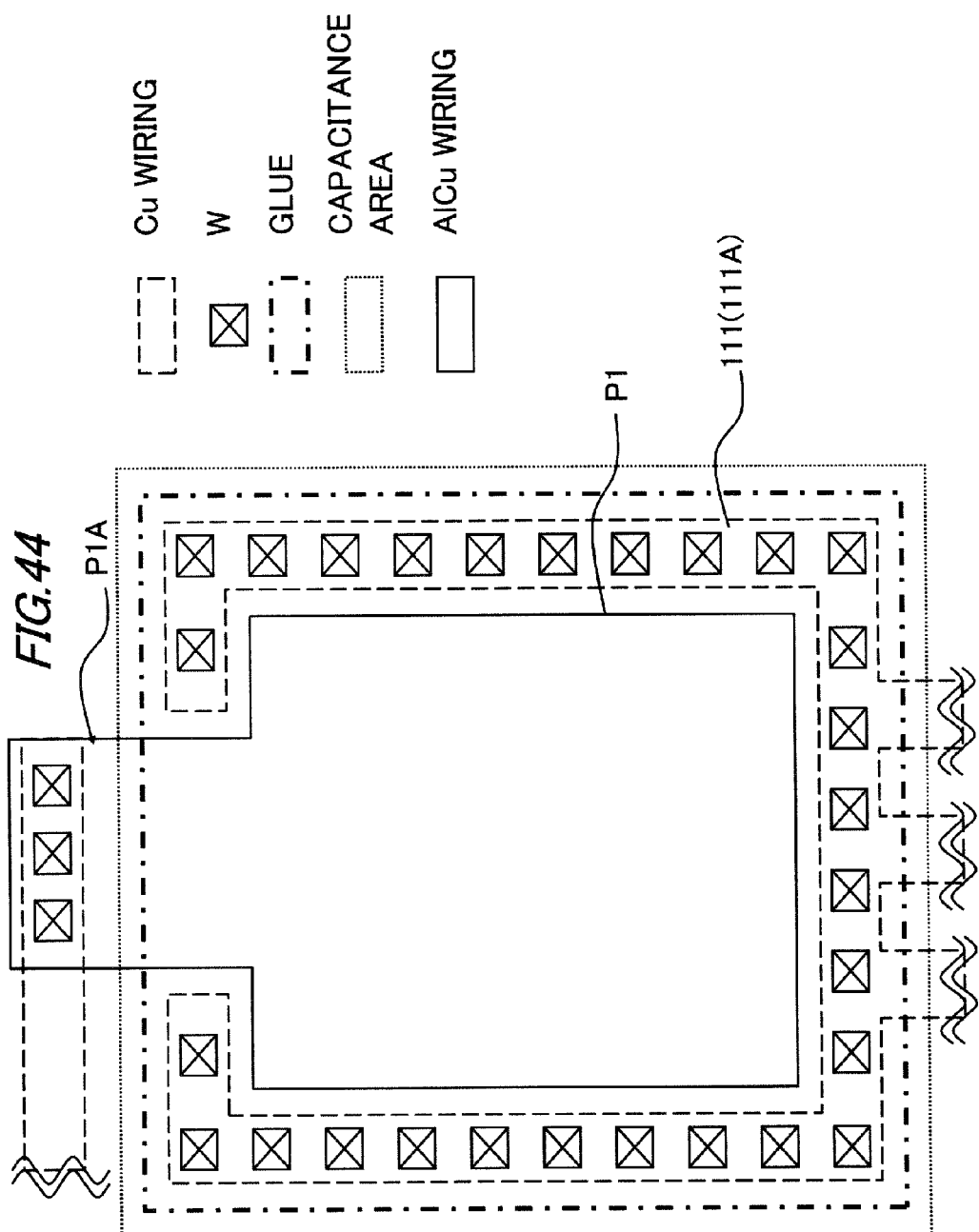
FIG. 44 is a plan view of the semiconductor device in which the Damascene wiring is not arranged in an area just under an extending area of the upper electrode.

Moreover, FIG. 44 shows, in contrast with FIG. 42, that the Damascene wiring 111A is not formed in the area just under the lead-out area (the extended area P1A) of the upper electrode P1. Namely, in contrast with FIG. 42 wherein the Damascene wiring 111A connecting via the plug layer 113A to the lower electrode is arranged in the rectangle-framed shape, FIG. 44 shows that part of the upper frame segment of the rectangular frame is cut off taking a C-rotated configuration. With this configuration also, the stepped portion in the area of the capacitance element in the MIM area can be reduced.

Figure 45:
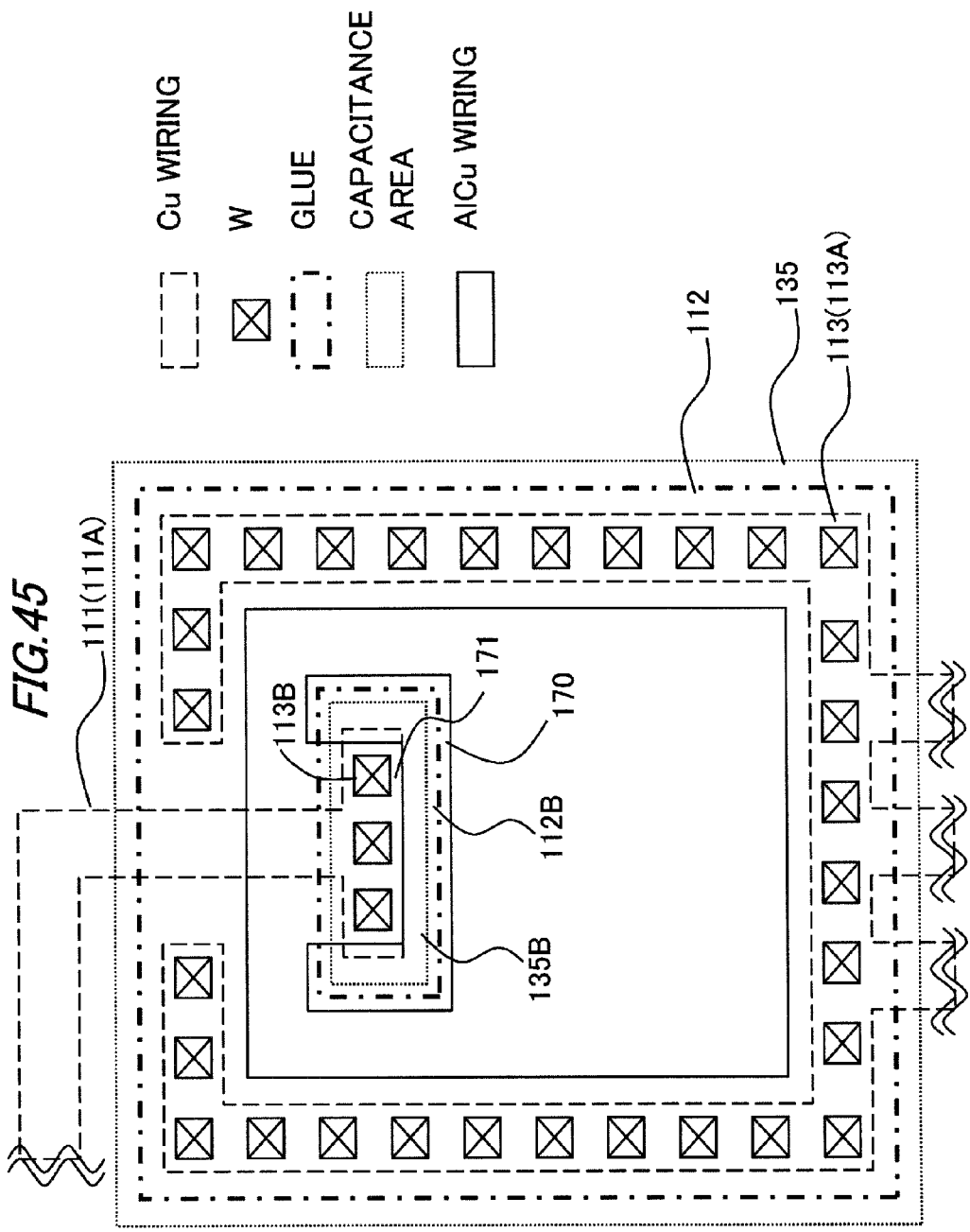
FIG. 45 is a plan view showing an example 1 of the semiconductor device in which an overlapping area of the upper electrode P1 and the Damascene wiring 111A is formed within the MIM area.

Further, it is also possible to form the overlapping area between the upper electrode P1 and the Damascene wiring 111A within the MIM area, depending on how to extend interconnection within the plane. FIG. 45 shows a plan view of the semiconductor device in which the overlapping area between the upper electrode P1 and the Damascene wiring 111A is formed within the planar area of the MIM structure. In this example, the planar area of the upper electrode P1 is formed within the planar area of the glue layer 112 contained in the lower electrode. Then, the upper electrode P1 and the Damascene wiring 111A are connected to each other via the plug layer 113B (tungsten). The plug layer 113B extends through between the upper electrode P1 and the Damascene wiring 111A, and hence a window 112B and a window 135B are formed in the glue layer 112 that serve as the lower electrode and in the dielectric insulating film 135.

Moreover, in FIG. 45, the plug layer 113A for connecting the lower electrode (the area of the glue layer 112) to the Damascene wiring 111A, is formed outside the rectangular area of the upper electrode P1. Thus, the upper electrode P1 can be planarized by forming the plug layer 113A outside the upper electrode P1. It is because, on the plug layer 113A, the stepped portion is easy to occur due to a difference in polishing quantity when effecting the CMP (Chemical Mechanical Polishing) between the glue layer 112 and the metal layer 113 that configure the plug layer 113A (see FIG. 9A).

Figure 46:
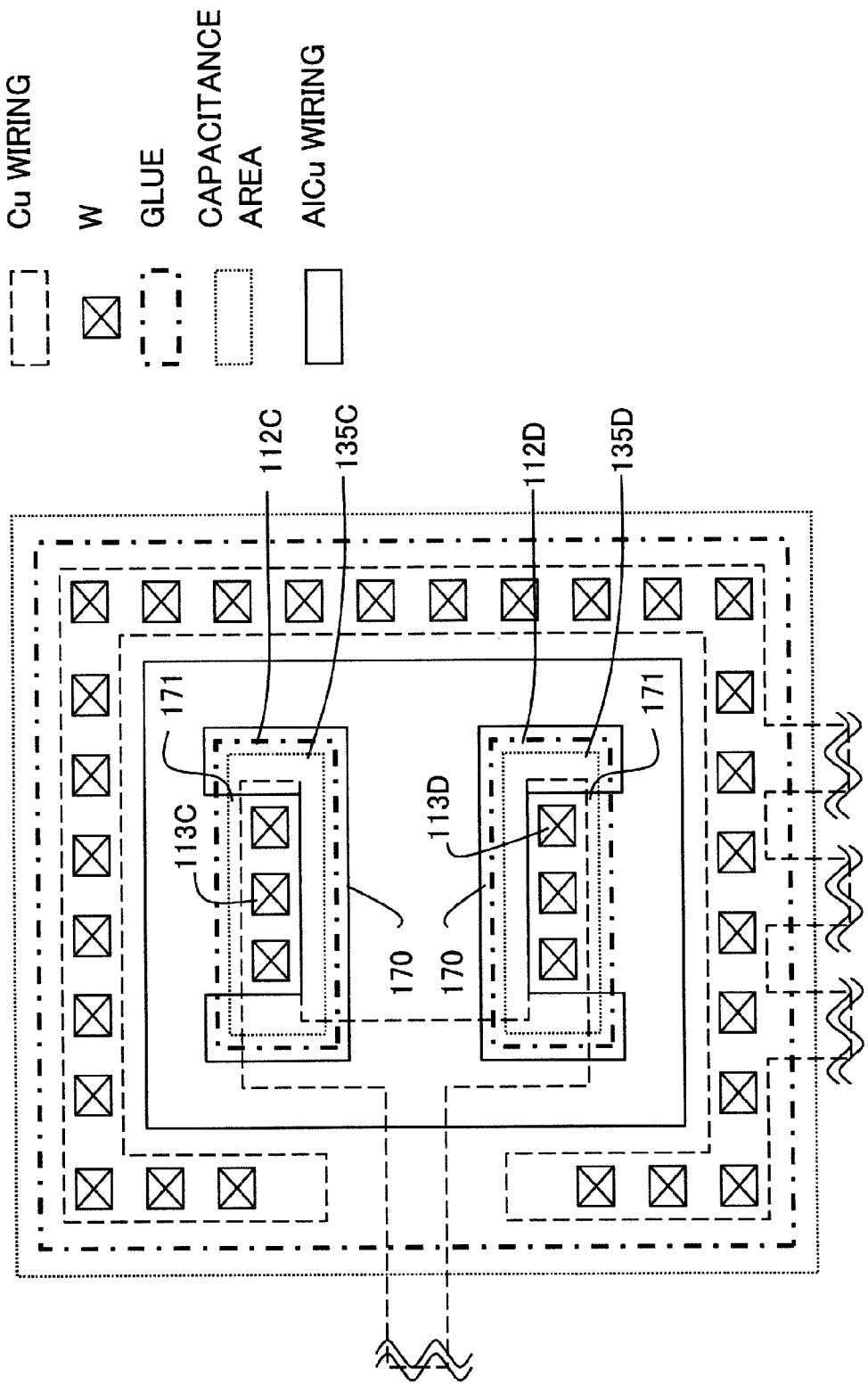
FIG. 46 is a plan view showing an example 2 of the semiconductor device in which the overlapping area of the upper electrode P1 and the Damascene wiring 111A is formed within the MIM area.

FIG. 46 shows a modified example of the semiconductor device illustrated in FIG. 45, wherein two lead-out areas from the upper electrode P1 to the Damascene wiring 111A are provided. In this overlapping area, the upper electrode P1 is connected to the Damascene wiring 111A through plug layers 113C, 113D. For this connection, windows 112C, 112D and 135C, 135D are formed in the glue layer 112 that server as the lower electrode and the dielectric insulating film 135.

Note that in each of the cases in FIGS. 45 and 46, a roughly U-shaped (a C- or L-and-I combination shaped) opening 170 is formed on the upper electrode P1. Further, the plug layer 113A for connecting the upper electrode P1 to the Damascene wiring 111A connects a protruded area 171 of the upper electrode P1, formed protruding into the opening 170, to the Damascene wiring 111A. Thus, the area size of the upper electrode P1 existing in the vicinity of the boundary of the MIM area can be reduced by providing the upper electrode P1 with the opening 170 and the protruded area 171. For instance, in the example in FIG. 45, the windows 135B of the dielectric insulating layer and the window 112B of the lower electrode, which configure the MIM area, are formed just under the opening 170. In the vicinity of such windows in the MIM area, the height (in the film thickness direction) of the upper electrode P1 might be different from the normal area where the MIM area is not formed. Namely the fluctuation of the height in the vicinity of MIM area might be caused by traversing the edge (boundary) of the area of the lower electrode and by traversing the edge (boundary) of the area of the dielectric insulating layer. The fluctuation of the height of the upper electrode P1 in the vicinity of MIM area affects the photo-lithography process. Thus there may be a probability that the line width of the upper electrode P1 (wirings) may fluctuate. Accordingly, in these areas, the characteristic of the capacitance element due to the MIM area is easy to fluctuate.

As in FIGS. 45 and 46, however, the upper electrode P1 is provided with the window 170 and the protruded area 171, thereby enabling the reduction in the area size of the area (width of the protruded area 171 of the upper electrode P1) where such a characteristic fluctuation is easy to occur and enabling the characteristic to be stabilized as a whole of the MIM area.

Figure 47:
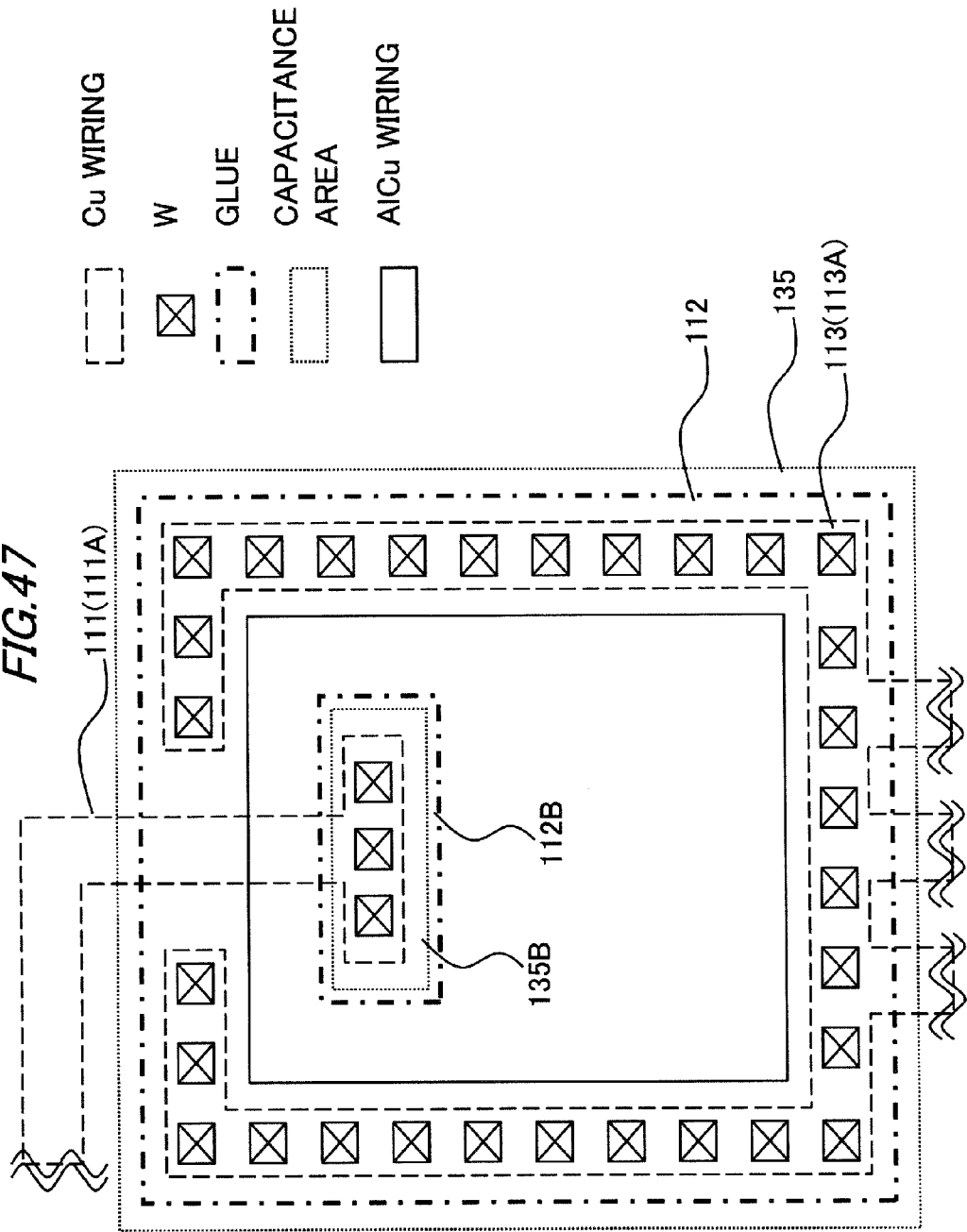
FIG. 47 is a plan view showing an example 3 of the semiconductor device in which the overlapping area of the upper electrode P1 and the Damascene wiring 111A is formed within the MIM area.
Figure 48:
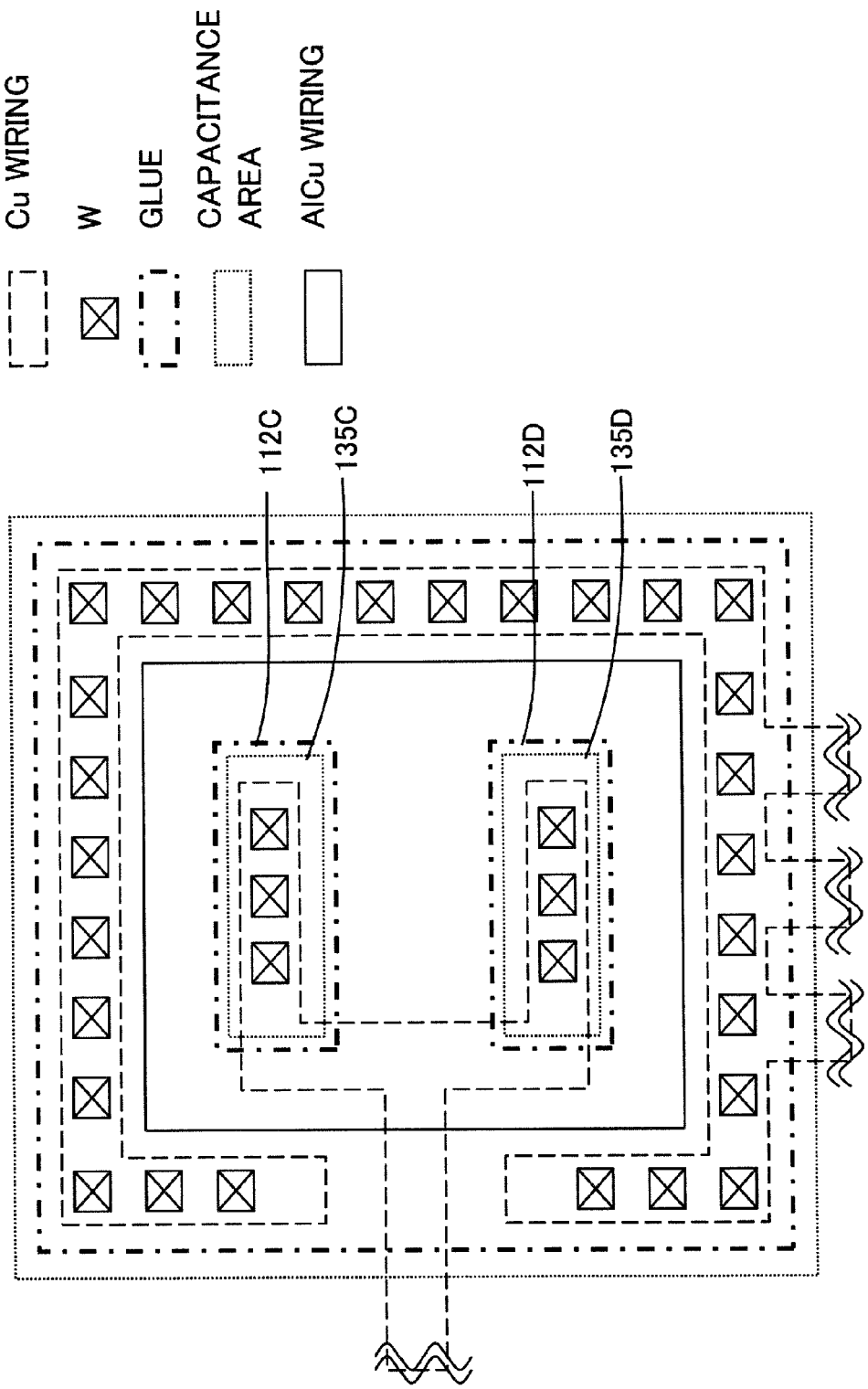
FIG. 48 is a plan view showing an example 4 of the semiconductor device in which the overlapping area of the upper electrode P1 and the Damascene wiring 111A is formed within the MIM area.

As in FIGS. 47 and 48, such a configuration may, it is to be noted, be taken that the upper electrode P1 is not provided with the window 170 and the protruded area 171.

Other Effects of Embodiments

Figure 49:
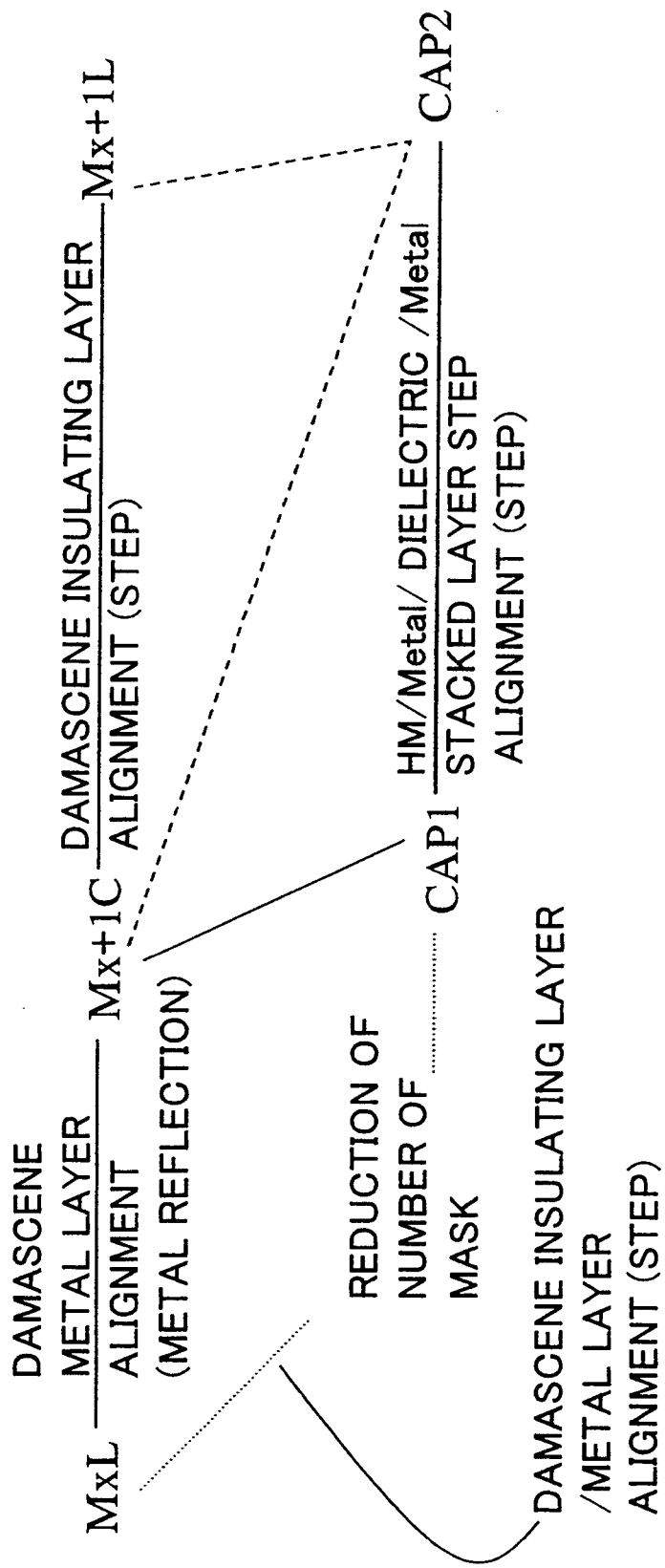
FIG. 49 is a view showing an alignment system using alignment marks in the first through eighth embodiments of the invention.

FIG. 49 shows an alignment system using the alignment marks in the first through eighth embodiments. As shown in FIG. 49, in the construction of the semiconductor device illustrated in FIGS. 4A trough 48, the mark 150 defined as the stepped portion when forming the hole 112A enables the alignment of the lower electrode (the mask CAP1) in the MIM area of the upper layer. Accordingly, as in FIGS. 1 through 3, the digging layer designated by CAL is not required to be formed by a separate mask, whereby the number of the masks and the number of the processes can be reduced.

Figure 50:
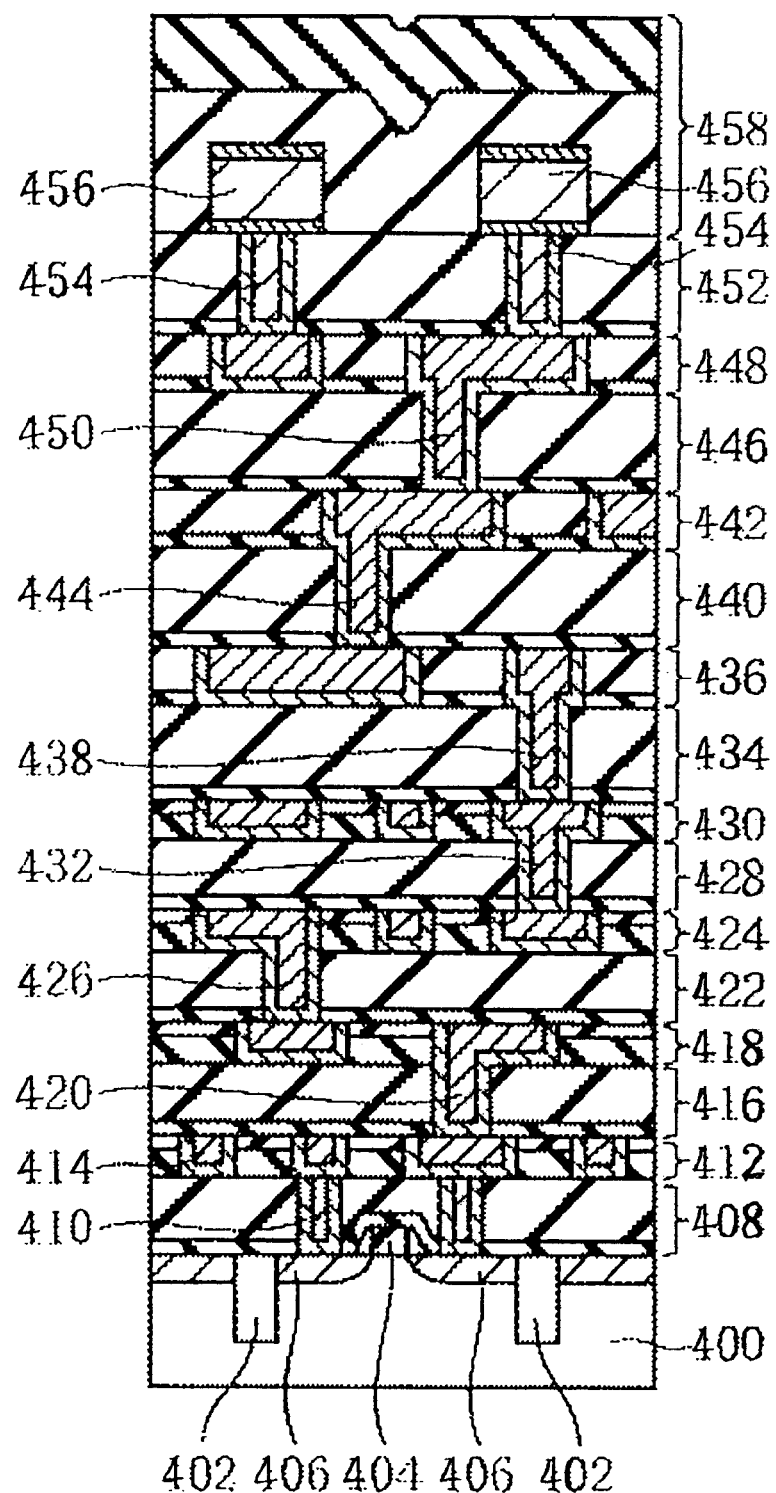
FIG. 50 is a view showing the semiconductor device to which the first through eighth embodiments of the invention are applied.

FIG. 50 shows an example of the semiconductor device to which the invention is applied. This semiconductor device takes a multi-wiring structure composed of 7-layered copper wirings and a single-layered aluminum wiring.

A silicon substrate 400 is formed with an element separation film 402 that defines the element area. In the element area defined by the isolation film 402, a MOS (Metal Oxide Semiconductor) transistor including a gate electrode 404 and a source/drain diffusion layer 406 is provided.

On the silicon substrate 400 formed with the MOS transistor, an interlayer insulating film 408 composed of a stacked layer composed of a PSG film and a silicon nitride film is formed. The interlayer insulating film 408 is embedded with a contact plug 410 constructed of a stacked structure of a tungsten film and a nitride titanium film.

On the interlayer insulating film 408 embedded with the contact plug 410, an interlayer insulating film 412 constructed of a stacked layer including a silicon oxide film and a SiLK (registered trademark) film (or a SOG film) is formed. The interlayer insulating film 412 is embedded with a wiring layer 414 constructed of a stacked structure including a copper film and a tantalum film.

On the interlayer insulating film 412 embedded with the wiring layer 414, there is formed an interlayer insulating film 416 constructed of a stacked layer of a silicon oxide film and a silicon nitride film. On the interlayer insulating film 416, there is formed an interlayer insulating film 418 constructed of a stacked layer of the silicon oxide film and the SiLK film (or the SOG film). Within the interlayer insulating films 416 and 418, there is formed a wiring layer 420 constructed of a stacked structure of the copper film and the tantalum film, of which a via area is embedded into the interlayer insulating film 416 and of which a wiring area is embedded into the interlayer insulating film 418.

On the interlayer insulating film 418 embedded with the wiring layer 420, there is formed an interlayer insulating film 422 constructed of a stacked layer of the silicon oxide film and the silicon nitride film. On the interlayer insulating film 422, there is formed an interlayer insulating film 424 constructed of a stacked layer of the silicon oxide film and the SiLK film (or the SOG film). Within the interlayer insulating films 422 and 424, there is formed a wiring layer 426 constructed of a stacked structure of the copper film and the tantalum film, of which the via area is embedded into the interlayer insulating film 422 and of which the wiring area is embedded into the interlayer insulating film 424.

On the interlayer insulating film 424 embedded with the wiring layer 426, there is formed an interlayer insulating film 428 constructed of a stacked layer of the silicon oxide film and the silicon nitride film. On the interlayer insulating film 428, there is formed an interlayer insulating film 430 constructed of a stacked layer of the silicon oxide film and the SiLK film (or the SOG film). Within the interlayer insulating films 428 and 430, there is formed a wiring layer 432 constructed of a stacked structure of the copper film and the tantalum film, of which the via area is embedded into the interlayer insulating film 428 and of which the wiring area is embedded into the interlayer insulating film 430.

On the interlayer insulating film 430 embedded with the wiring layer 432, there is formed an interlayer insulating film 434 constructed of a stacked layer of the silicon oxide film and the silicon nitride film. On the interlayer insulating film 434, there is formed an interlayer insulating film 436 constructed of a stacked layer of the silicon oxide film and the silicon nitride film. Within the interlayer insulating films 434 and 436, there is formed a wiring layer 438 constructed of a stacked structure of the copper film and the tantalum film, of which the via area is embedded into the interlayer insulating film 434 and of which the wiring area is embedded into the interlayer insulating film 436.

On the interlayer insulating film 436 embedded with the wiring layer 438, there is formed an interlayer insulating film 440 constructed of a stacked layer of the silicon oxide film and the silicon nitride film. On the interlayer insulating film 440, there is formed an interlayer insulating film 442 constructed of a stacked layer of the silicon oxide film and the silicon nitride film. Within the interlayer insulating films 440 and 442, there is formed a wiring layer 444 constructed of a stacked structure of the copper film and the tantalum film, of which the via area is embedded into the interlayer insulating film 440 and of which the wiring area is embedded into the interlayer insulating film 442.

On the interlayer insulating film 442 embedded with the wiring layer 444, there is formed an interlayer insulating film 446 constructed of a stacked layer of the silicon oxide film and the silicon nitride film. On the interlayer insulating film 446, there is formed an interlayer insulating film 448 constructed of a stacked layer of the silicon oxide film and the silicon nitride film. Within the interlayer insulating films 446 and 448, there is formed a wiring layer 450 constructed of a stacked structure of the copper film and the tantalum film, of which the via area is embedded into the interlayer insulating film 446 and of which the wiring area is embedded into the interlayer insulating film 448.

On the interlayer insulating film 448 embedded with the wiring layer 450, there is formed an interlayer insulating film 452 constructed of a stacked layer of the silicon oxide film and the silicon nitride film. The interlayer insulating film 452 is embedded with a contact plug 454 constructed of a stacked structure of the tungsten film and the nitride titanium film.

On the interlayer insulating film 452 embedded with the contact plug 454, there is formed a wiring layer 456 constructed of a stacked layer of the nitride titanium film, the aluminum film and the nitride titanium film.

On the interlayer insulating film 452 formed with the wiring layer 456, there is formed a cover film 458 constructed of a stacked layer of the silicon nitride film and the silicon oxide film.

Thus, the semiconductor device having the multi-layered wiring structure constructed of the 7-layered copper wirings and the single-layered aluminum wiring, is manufactured.

The MIM structure explained in the embodiment can be built up, for instance, in the hierarchical area sandwiched in between the contact plug 454 and the wiring layer 456, wherein the lower electrode is the contact plug 454 constructed of the stacked structure of the tungsten film and the nitride titanium film, and the upper electrode is the wiring layer 456 constructed of the stacked layer of the nitride titanium film, the aluminum film and the nitride titanium film. Thus, the MIM structure can be built up on the hierarchy that is as high as possible from the silicon substrate 400, whereby the MIM structure is configured in a way that reduces the parasitic capacitance and the speed-up of the element (device) can be attained.

Others

The disclosures of Japanese patent application No. JP2005-285223 filed on Sep. 29, 2005 including the specification, drawings and abstract are incorporated herein by reference.

What is claimed is:

1. A semiconductor device comprising:
a first wiring layer formed above a semiconductor substrate;
an insulating film formed above the first wiring layer;
a first hole formed in the insulating film;
a first metal layer covering an internal surface of the first hole and formed on an upper surface of the insulating film, and connected to the first wiring layer;
a second metal layer formed on the first metal layer in the first hole;
a third metal layer formed on the first metal layer located on the upper surface of the insulating film and connected to the first metal layer and the second metal layer;
a dielectric insulating film formed above the third metal layer;
a second wiring layer formed on the dielectric insulating film; and
a capacitor comprising a lower electrode including the third metal layer, the dielectric insulating film, and an upper electrode including the second wiring layer,
wherein the first hole is located in a first area outside of a second area where the upper electrode and lower electrode face each other; and
the first metal layer located in the second area is flat.

2. The semiconductor device according to claim 1, wherein the first wiring layer is a damascene wiring layer.

3. The semiconductor device according to claim 1, wherein the first wiring layer is formed in the first area.

4. The semiconductor device according to claim 1, further comprising:
- a third wiring layer formed in a third area except the first area and the second area and formed under the insulating film;
- a second hole formed in the insulating film and formed in the third area;
- a fourth metal layer covering an internal surface of the second hole and connected to the third wiring layer;
- a fifth metal layer formed on the fourth metal layer in the second hole;
- a fourth wiring layer formed above the insulating film and connected to the fourth metal layer and the fifth metal layer.

5. The semiconductor device according to claim 4, wherein:
the fourth wiring layer includes a material same as a material of the second wiring layer.

6. The semiconductor device according to claim 5, wherein:
the fourth wiring layer includes a material same as a material of the second wiring layer.

7. The semiconductor device according to claim 5, wherein:
- the second wiring layer includes a first barrier metal film, a sixth metal layer formed on the first barrier metal and a second barrier metal film formed on the sixth metal layer;
- the fourth wiring layer includes a third barrier metal film, a seventh metal layer formed on the third barrier metal and a fourth barrier metal film formed on the seventh metal layer; and
- materials of the first barrier metal film, the sixth metal layer and the second barrier metal film are same as materials of the third barrier metal film, the seventh metal layer and the fourth barrier metal film respectively.

8. The semiconductor device according to claim 5, wherein:
a part of the upper electrode is located out of the second area.

9. The semiconductor device according to claim 4, wherein:
- the second wiring layer includes a first barrier metal film, a sixth metal layer formed on the first barrier metal and a second barrier metal film formed on the sixth metal layer;
- the fourth wiring layer includes a third barrier metal film, a seventh metal layer formed on the third barrier metal and a fourth barrier metal film formed on the seventh metal layer; and
- materials of the first barrier metal film, the sixth metal layer and the second barrier metal film are same as materials of the third barrier metal film, the seventh metal layer and the fourth barrier metal film respectively.

10. The semiconductor device according to claim 1, wherein:
a part of the upper electrode is located out of the second area.

11. A semiconductor device comprising:
- a first wiring layer formed above a semiconductor substrate;
- an insulating film formed above the first wiring layer;
- a first hole formed in the insulating film;
- a first metal layer covering an internal surface of the first hole and formed on an upper surface of the insulating film, and connected to the first wiring layer;
- a second metal layer formed on the first metal layer in the first hole;
- a third metal layer formed on the first metal layer located on the upper surface of the insulating film and connected to the first metal layer and the second metal layer;
- a dielectric insulating film formed above the third metal layer;
- a second wiring layer formed on the dielectric insulating film; and
- a capacitor comprising a lower electrode including the third metal layer, the dielectric insulating film, and an upper electrode including the second wiring layer,
wherein the first hole is located in a first area outside of a second area where the upper electrode and lower electrode face each other; and
whole of the first metal layer located in the second area is formed on the insulating film.

12. The semiconductor device according to claim 11, wherein the first wiring layer is a damascene wiring layer.

13. The semiconductor device according to claim 11, wherein the first wiring layer is formed in the first area.

14. The semiconductor device according to claim 11, further comprising:
- a third wiring layer formed in a third area except the first area and the third area and formed under the insulating film;
- a second hole formed in the insulating film and formed in the third area;
- a fourth metal layer covering an internal surface of the second hole and connected to the third wiring layer;
- a fifth metal layer formed on the fourth metal layer in the second hole;
- a fourth wiring layer formed above the insulating film and connected to the fourth metal layer and the fifth metal layer.

* * * * *